United States Patent [19]

Thomas et al.

[11] 4,041,386
[45] Aug. 9, 1977

[54] MULTIFUNCTIONAL CIRCUIT ANALYZER

[75] Inventors: Paul Dana Thomas, Lafayette, Calif.; Dale Leroy Burton, Houston, Tex.

[73] Assignee: Data Test Corporation, Concord, Calif.

[21] Appl. No.: 688,700

[22] Filed: May 21, 1976

[51] Int. Cl.² .......................................... G01R 23/16
[52] U.S. Cl. ................................ 324/77 R; 324/83 D
[58] Field of Search ................. 324/77 R, 77 A, 77 B, 324/78 D, 83 D, 186

[56] References Cited
U.S. PATENT DOCUMENTS 3,221,253  11/1965  Keyes ............................... 324/77 A
3,702,436  11/1972  Pollard ............................. 324/77 A Primary Examiner—Rudolph V. Rolinec
Assistant Examiner—Michael J. Tokar
Attorney, Agent, or Firm—Michael D. Nelson

[57] ABSTRACT

A multifunctional circuit analyzer is disclosed which is capable of determining the complete signature of an unknown electrical signal. The circuit analyzer utilizes a high and low peak detection circuit and an analog to digital converter to determine the outer limits of the signal. The high and low threshold voltages are selected between the limits of the signal. Each time the unknown electrical signal passes through the preset high or low threshold voltage, a high or low threshold digital signal occurs. A logic circuit operates on these high and low threshold digital signals and activates the start and stop gate signals. These gate signals allow a time base signal to pass through a gate circuit into a series of decade counters. The information in the counters are thereafter transferred into decoders and then multiplexed to a display. The multifunctional circuit analyzer disclosed is capable of measuring, rise time, fall time, frequency, duty cycle, TRC counting, width, period, coincidence of two signals, the interval between two signals, count functions, frequency ratio, AC volts, DC volts and resistance.

20 Claims, 38 Drawing Figures

SLOPE

FREQUENCY

WIDTH

INTERVAL B TO C

TRC COUNT

COINCIDENCE B AND C

SINGLE AND REPEAT COUNT

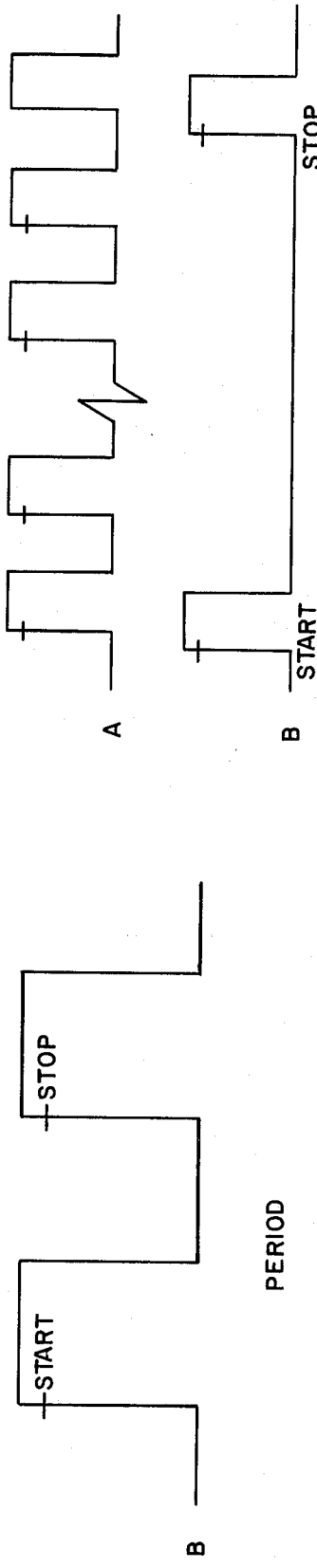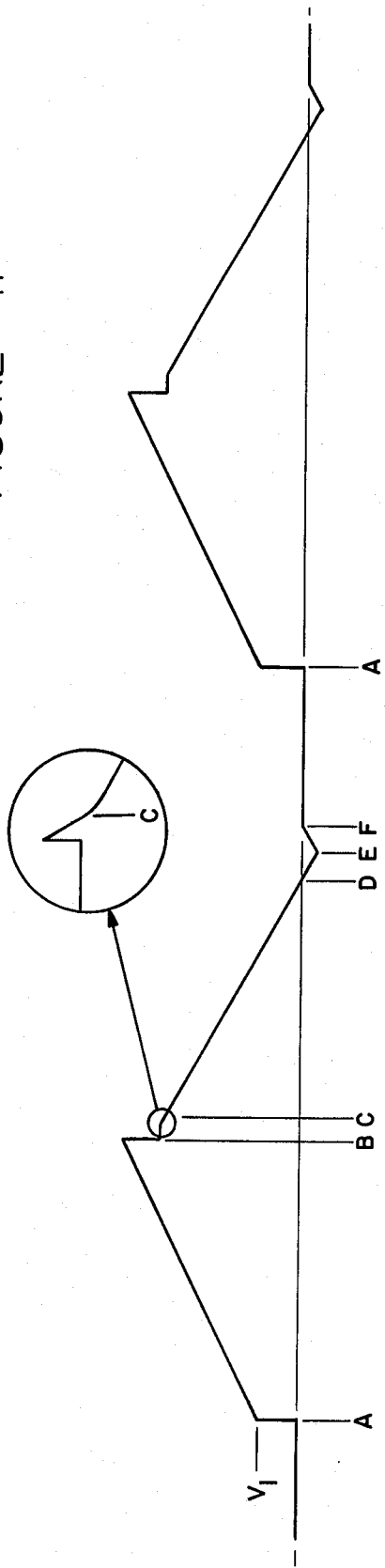
FIGURE 10 PERIOD
FIGURE 11 FREQUENCY RATIO A/B
FIGURE 12

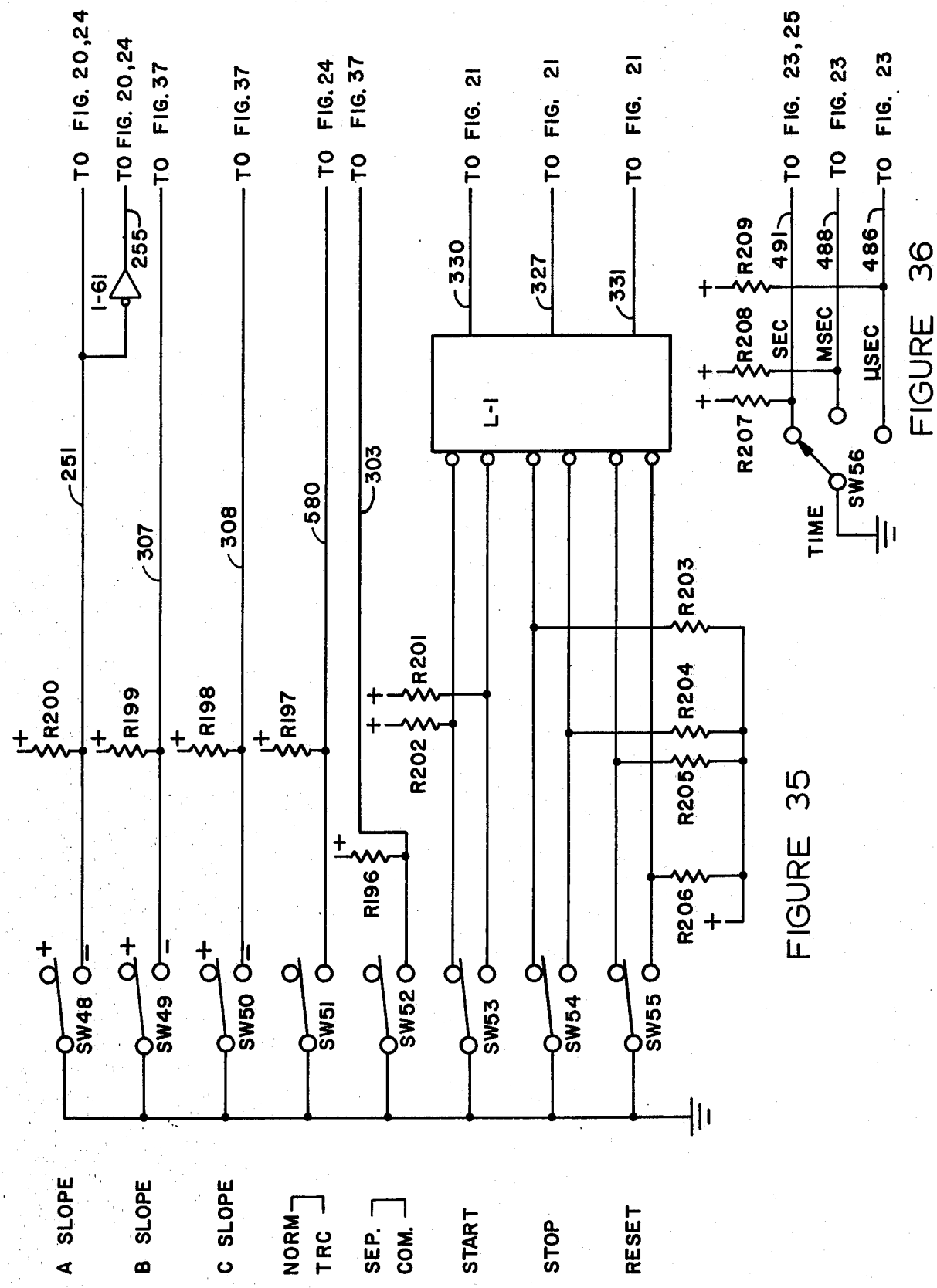

TIME-SIGNAL RELATIONSHIP
A-D CONVERTER

MULTIFUNCTIONAL CIRCUIT ANALYZER

BACKGROUND OF THE INVENTION

The present invention relates to a multifunctional circuit analyzer and more particularly, this invention relates to a digital multifuctional circuit analyzer.

The electronics field has been expanding rapidly in the digital circuitry area. Digital circuits are now being used in general consumer products such as modern televisons, radios, calculators, micro-wave ovens, etc. Proposals are being made to transmit television signals in digital code. With the boom in digital circuits comes a demand for test equipment capable of diagnosing malfunctioning circuits. The test equipment should be capable of measuring the complete signature of the signal. The signature from a defective circuit is compared with the signature from a proper circuit. The various differences in the signal signatures will inform the repairmen the nature and scope of the malfunction. In addition, the test equipment should not be overly expensive, bulky or excessively heavy.

IT is therefore an object of this invention to provide a circuit analyzer.

IT is another, but independent, object of this invention to prpovide a multifunctional circuit analyzer.

IT is a further and independent object of this invention to provide a multifunctional circuit analyzer that is inexpensive to manufacture and that it is not excessively heavy and preferably portable.

SUMMARY OF THE INVENTION

The aforementioned objects of their attendant advantages can be realized by a multifunctional circuit analyzer having;

1. an input circuit for receiving at least one incoming electrical signal, preferably at least two and more preferably at least three electrical signals;

2. a peak voltage detection circuit connected to the input circuit for measuring the high and low peak voltages of the incoming signal and for providing a relatively stable high or low DC voltage which is proportional to the respective high or low peak voltage;

3. a high and low thereshold voltage circuit connected to the input circuit for providing a high or low threshold digital signal when the voltage of the incoming electrical signal passes through its respective high or low threshold voltage;

4. an analog to digital converter circuit connected to the peak voltage direction circuit for converting the stable high or low DC voltage into a functional digital signal;

5. a gate control circuit connected to the analog to digital converter circuit for providing a digital start gate when the functional digital signal is present and a digital stop gate signal when the functional digital signal changes state;

6. a gate circuit connected to the gate control circuit for permitting either (a) a count signal or (b) a time base signal, as selected, through the gate circuit when a start gate signal is present and preventing the count signal or time base signal from passing through the gate circuit when the stop signal is present;

7. a time base circuit connected to the gate circuit for generating at least one time base signal of known frequency;

8. a counting circuit connected to the gate circuit for counting the number of cycles, i.e., positive or negative slopes, in the count signal or the time base signal during the time interval between the start gate signal and the stop gate signal and for providing a plurality of first code digital signals representing the total number of cycles counted;

9. a decoding circuit connected to the counting circuit for providing a plurality of stable digital second code signals representing the total number of cycles counted in the counting circuit.

10. a display circuit connected to the decoder circuit for receiving the plurality of stable digital second code signals and displaying the total number of cycles counted by a plurality of digits;

11. a logic circuit connected to the high and low threshold circuit and the gate control circuit for activating the start and stop gate signals by the high or low threshold digital signals, and 12. a plurality of function switches connected to the logic circuit for controlling the start and stop gate signals.

The high or low peak voltage is determined by activating the high or low peak switch. This causes a high or low peak DC voltage to be connected to the Analog to Digital converter. The converter, which is typically a dual or triple slope converter, integrates the incoming peak DC voltage for a known period of time to an unknown voltage. The converter thereafter causes the integrator to integrate backwards and at the same time causes a functional digital signal. When the integrator passes through zero crossing, the functional digitial signal changes state. The presence of the functional digital signal causes the gate control circuit to provide a start gate signal. When the functional digital signal changes state, a stop gate signal occurs. During the time that the start gate signal is present, the gate circuit allows a time base signal of known frequency to pass through the circuit to the counters. The counters continue counting the time base signal until the stop gate signal occurs. The information is transferred to the decoders and the circuit resamples another peak voltage. The information in the decoders may then be transmitted to the display digits by any convenient means such as multiplexing, etc. Preferably the display has at least four display digits and more preferably at least five display digits.

After the high and low peak voltage are determined, the high and low threshold voltages are set. The multifunctional circuit analyzer is now calibrated to analyze the incoming signals. If the rise time function is desired to be measured, the appropriate function switch is activated. This causes the logic circuit to activate the start gate signal when the voltage of the incoming electrical signal passes through the selected low threshold voltage to a higher voltage. The logic circuit activates the stop gate signal when the voltage of the incoming electrical signal passes through the selected high threshold voltage to a higher voltage. Thus, the counters count the total number of cycles in the time base signal durng the time interval that the incoming electrical signal is between its low and high threshold voltages. When the fall time of the signal is desired, the fall time function switch (slope-negative phase) is selected. When this switch is activated, the start gate signal occurs when the voltage of the incoming signal passes through the selected high threshold voltage to a lower voltage. The stop gate siganl occurs when the incoming electrical signal passes through the selected low threshold voltage to a lower voltage. Thus, the counters count the total number of cycles in the time base signal during the time interval that the incoming electrical signal is between its high and low threshold voltages.

The multifunctional circuit analyzer may also be used to measure the width of the incoming electrical signal. When the width switch is activatd the logic circuit activates the start gate signal when the voltage of the incoming electrical signal either passes through the low or high threshold voltage (positive phase) to a higher voltage or passes through the high or low threshold voltage to a lower voltage (negative phase).

The logic circuit activates the stop gate signal when the voltage of the incoming electrical signal either passes through the high or low threshold voltage to a lower voltage (positive phase) or passes through the low or high threshold voltage to a higher voltage (negative phase). Thus, the counters count the number of cycles in the time base signal during the time interval that the incoming electrical signal is between the high or low threshold voltage on one slope (positive slope if the positive phase is selected) of the signal and the low or high threshold voltage on the following slope (negative slope if the negative phase is selected) of the signal.

When the period function is desired to be measured, the period function switch is activated. This causes the logic circuit to activate the start gate signal when the voltage of the incoming electrical signal either passes through the low or high threshold voltage to a higher voltage (positive phase) or passes through the high or low threshold voltage to a lower voltage (negative phase). The logic circuit activates the stop gate signal when the voltage of the incoming electrical signal either passes through the same high or low threshold voltage to a higher voltage (positive phase) or passes through the same high or low threshold voltage to a lower voltage (negative phase).

The time interval between an event on one incoming electriccal signal and an event on another incoming electrical signal can be measured by the multifunctional circuit analyzer of this invention. The interval function switch is activated. This causes the logic circuit to activate the start gate signal when the voltage in a first incoming electrical signal passes through its high or low threshold voltage. The logic circuit activates the stop gate signal when the voltage in a second incoming electrical signal passes through its high or low threshold voltage. Thus, the counters count the total number of cycles in the time base signal during the time interval that the first incoming electrical signal passes through its high or low threshold voltage and the second incoming electrical signal passes through its respective high or low threshold voltage.

The multifunctional circuit analyzer may also measure the duration of the coincidence function switch is activated the logic circuit activates the start gate signal when (1) the voltage of the first incoming electrical signal either passes through its low or high threshold voltage to a higher voltage (positive phase) or passes through its high or low threshold voltage to a lower voltage (negative phase) and (2) the voltage of the second incoming electrical signal either passes through its low or high threshold voltage to a higher voltage (positive phase) or passes through its high or low threshold voltage to a lower voltage (negative phase). The logic circuit activates the stop gate signal when (1) the voltage of the first incoming electrical signal either passes through its high or low threshold voltage to a lower voltage (positive phase) or passes through its low or high threshold voltage to a higher voltage (negative phase) or, whichever occurs first, (2) the voltage of the second incoming electrical signal either passes through its high or low threshold voltage to a lower voltage (positive slope) or passes through its low or high threshold voltage to a higher voltage (negative phase). Thus, the counters count the total number of cycles in the time base signal over the time interval that both the first and second incoming electrical signals are coincident.

The TRC counting is a very valuable method of isolating malfunctions in digital circuitry by means of count signatures. The multifunctional circuit analyzer of this invention is capable of TRC counting. In this embodiment, the circuit analyzer is comprised of:

1. an input circuit for receiving at least a first, second and third incoming electrical signals;
2. a high threshold voltage circuit connected to said input circuit for providing first, second and third high threshold digital signals when the voltage of the first, second and third electrical signals pass through respective selected high threshold voltages;
3. a low threshold voltage circuit connected to said input circuit for providing first, second and third high threshold digital signals when the voltage of the first, second and third electrical signals pass through respective selected low threshold voltages;
4. a logic circuit connected to said high and low threshold circuit for providing (A) a first functional digital signal when the voltage of the second incoming electrical signal passes through its high or low threshold voltage, (B) a second functional digital signal when the voltage of the third incoming electrical signal passes through its high or low threshold voltage and (C) a count signal which changes state each time the voltage of the first incoming electrical signal passes through its low or high threshold voltage to a higher voltage and also each time the voltage of the first incoming electrical signal passes through its high or low threshold voltage to a lower voltage;
5. a gate control circuit connected to said logic circuit for providing a digital start gate signal when said first functional digital signal is present and a digital stop gate signal when said second functional digital signal is present;
6. a gate circuit connected to said gate control circuit for permitting said count signal to pass through said gate circuit when said start gate signal occurs and preventing said count signal from passing through the gate circuit when said stop gate signal occurs;
7. a counting circuit connected to said gate circuit for counting the number of times said count signal changes state and for providing a plurality of first code signals
8. a decoding circuit connected to said circuit for receiving said plurality of first code signals and providing a plurality of stable digital second code signals representing the total number of times the count signal changed states during the time interval between said start gate signal and said stop gate signal; and
9. a display connected to said decoding circuit for receiving said plurality of stable digital second code signals and displaying the total number counted by a plurality of digits.

The multifunctional circuit analyzer is also capable of measuring the frequency of an incoming electrical signal. In this embodiment, the frequency function switch is activated. This causes the logic circuit to activate a start gate signal when a pulse occurs in the time base signal and a stop gate signal when the next succeeding pulse occurs in the time base signal. The count signal is a digital which changes state each time the voltage of the incoming electrical signal either passes through the low or high threshold voltage to a higher voltage (positive phase) or passes through the high or low threshold voltage to a lower voltage (negative phase). Thus, in this embodiment, the time base signal controls the start and stop gate signals and the incoming electrical signal controls the count signal.

The frequency ratio between a faster signal on one channel and a slower signal on another channel can be measured. In this embodiment the frequency ratio function switch is activated. The circuit function in the same manner as in the frequency measurement except the slower signal is used as the time base signal in starting and stopping the gate signal.

The multifunctional circuit analyzer may also be used to measure volt and ohm meter functions. When this feature is desired a DVM converter is conntected between the input circuit and the analog to digital converter. The DVM converter changes the AC volts to a proportional DC voltage, the DC volts to a proportional DC voltage or the resistance to a proportional DC voltage. This proportional DC voltage is converted into a functional digital signal by the analog to digital converter. This functional digital signal is then processed in the same manner as the peak voltage measurement discussed supra.

The measurement of the duty cycle is very important in determining the over all signal symmetry. The multifunctional circuit analyzer of this invention is capable of measuring the duty cycle of a signal. In this embodiment, the circuit analyzer is comprised of:

1. an input circuit for receiving said incoming electrical signal;
2. a high threshold voltage circuit connected to said input circuit for providing a high threshold digital signal when the voltage of the incoming electrical signal passes through a selected high threshold voltage;
3. a low threshold voltage circuit connected to said input circuit for providing a low threshold digital signal when the voltage of the incoming electrical signal passes through a selected low threshold voltage;
4. a duty cycle circuit connected to said high and said low threshold voltage circuit for providing a first preselected DC signal when the voltage of the incoming electrical signal either (1) passes through the low or high threshold voltage to a higher voltage or (2) passes through the high or low threshold voltage to a lower voltage, and for providing a second preselected DC signal when the voltage of the incoming electrical signal either (1) passes through the high or low threshold voltage to a lower voltage or (2) passes through the low or high threshold voltage to a higher voltage;
5. an analog to digital converter connected to said duty cycle circuit for converting said first and second preselected DC signals into a functional digital signal proportional to the time average voltage of the first and second preselected DC signals;
6. a gate control circuit connected to said analog to digital converter for providing a digital start gate signal when the functional digital signal is present and a stop gate signal when the functional digital signal changes state;
7. a gate circuit connected to said gate control circuit for permitting a time base signal to pass through said gate circuit when said start gate signal occurs and preventing said time base signal from passing through the gate circuit when said stop gate signal occurs;
8. a time base circuit connected to said gate circuit for generating at least one time base signal of known frequency;
9. a counting circuit connected to said gate circuit for counting the number of cycles in the time base signal during the time interval between said start gate signal and said stop gate signal and providing a plurality of first code signals representing the total number of cycles counted;
10. a decoding circuit connected to said counting circuit for receiving said plurality of first code signals and providing a plurality of stable digital second code signals representing the total number of cycles counted by said counting circuit; and
11. a display connected to said decoding for receiving said plurality of stable digital second code signals and displaying the total number of cycles counted by a plurality of digits.

The multifunctional circuit analyzer may also have an autoranging feature. In this embodiment, an autoranging circuit is connected to the counting circuit. When too many cycles are counted in the counters the autoranger provides an overflow digital signal. When too few cycles are counted, the autoranger generates an underflow digital signal. These overflow and underflow digital signals may be used to increase or decrease the time base frequency or they may be coupled with attenuators to increase or decrease the attenuation of the incoming signal. The autoranging circuit may also be connected to the display circuit to change the decimal location in the display when necessary.

In another embodiment, the multifunctional circuit analyzer has a forbidden combination circuit. In this embodiment, the plurality of function switches are connected to a forbidden combination circuit. When two or more switches of different functions are activated, the forbidden combination circuit provides a forbidden combination digital signal. This signal may be used to light a lamp in the display or blank the display digits. In still another embodiment, the forbidden combination digital signal causes all of the display digits to alternately flash the digit eight. This then informs the instrument user that he has selected an improper combination.

In an additional embodiment, the multifunctional circuit analyzer of this invention is equipped with a signal present and signal fault indicators. These indicators are used to inform the operator of the circuit analyzer that the threshold voltage settings are either set with the limits of the incoming electrical signal, signal present, or are set outside the limits of the incoming electrical signal. In this embodiment a signal present—signal fault indicator circuit is connected to the high and low threshold voltage circuit and to the input circuit. This indicator circuit provides a signal present signal when the voltage of the incoming electrical signal passes through both the high and low threshold voltages, and provides a signal fault signal when the voltage at the incoming electrical signal does not pass through both the high and low threshold voltages. The signal present and signal fault signals may be used to light display lamps which inform the operator to reset the threshold voltages.

Other related and additional objects of this invention will be apparent from the drawings, the following description of the invention and the appended claims.

BRIEF DESCRIPTION OF DRAWINGS

FIG. 10 is a voltage-time curve for an exemplary electrical signal wherein a period measurement is made.

FIG. 11 is a voltage-time curve for two exemplary electrical signals wherein a frequency ratio measurement is made.

FIG. 12 is a voltage-time curve for a duel slope integrator.

FIG. 28 depicts a schematic representation of the multiplexing clock circuitry.

FIG. 35 depicts a schematic representation of the function switching circuitry.

FIG. 36 depicts a schematic representation of the time function switching circuitry.

DETAILED DESCRIPTION OF THE INVENTION

Figure 1:
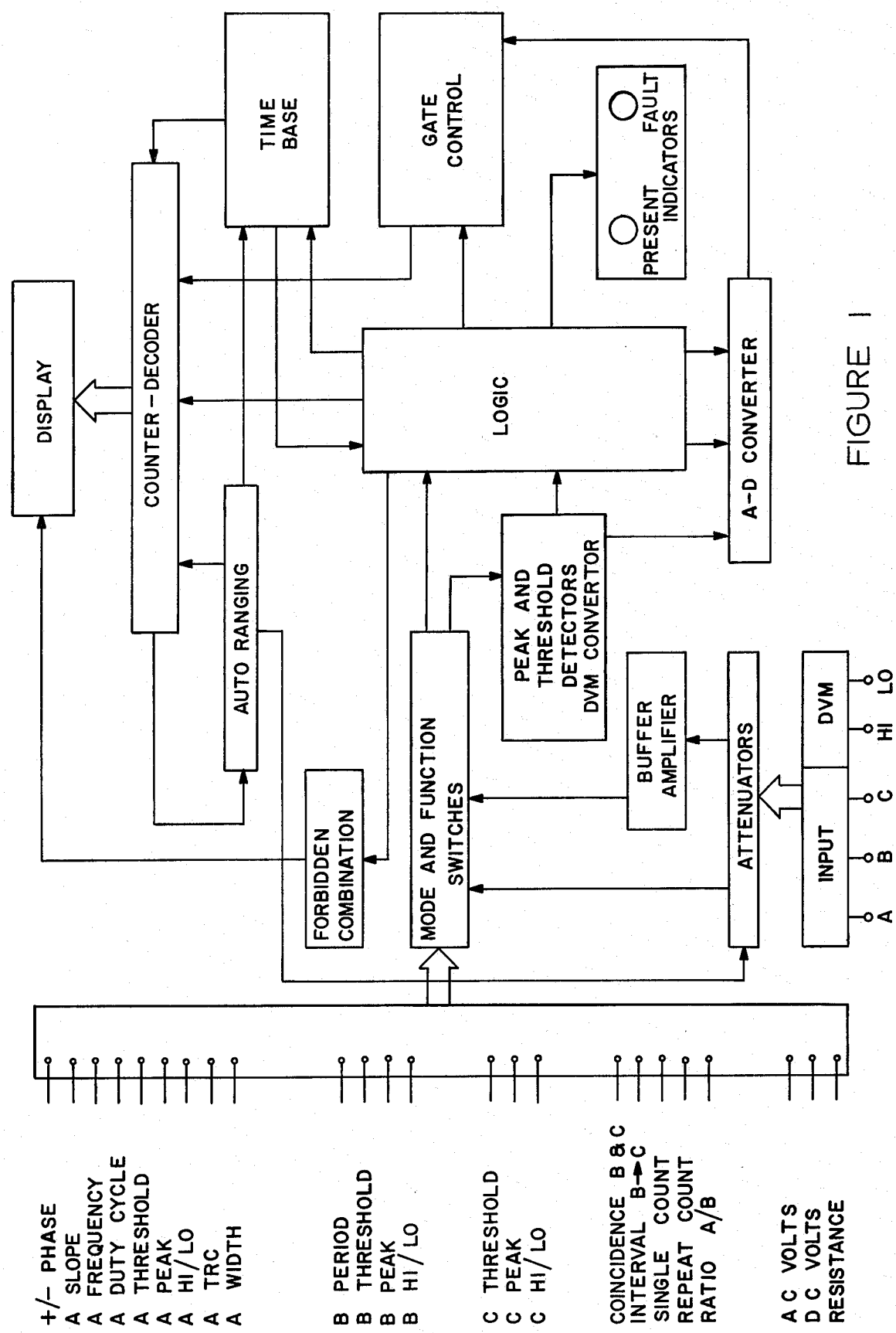
FIG. 1 is a block flow diagram of a multifunctional circuit analyzer in accordance with the present invention.

FIG. 1 is a functional flow diagram of one embodiment of the circuitry of this invention. The function and mode switches are shown along the left hand side of the flow diagram. The input signals enter the Input-DVM box at the bottom of the diagram through Channels A, B, C or through the high and low terminals. These signals then go through attenuators which either reduce the amplitude of incoming signals or allow the incoming signals to pass through without being modified. The attenuators are controlled by digital signals from the auto ranging circuitry or by the function and mode switches. From the attenuators, the signals, if they are DVM signals, go directly into the mode and function switches. If the signals are from Channels A, B or C, they go into the buffer amplifiers. The buffer amplifiers convert the high impedance input signals into low impedence signals. From the buffer amplifiers, the signals go into the mode and function switches are selected the signals pass into the Peak and Threshold Detectors. These detectors convert the incoming signals into a constant DC voltage which is proportional to the peak voltage of the input signal, if the peak voltage function is selected, or into an adjustable high and low threshold voltage, if the threshold function switch is selected. If any of the AC volts, DC volts, or resistance function switches are selected, the incoming signals pass into a DVM converter. This converter changes the incoming DC voltage, AC voltage or resistance, into a constant DC voltage which is proportional to the voltage or resistance of the input signal.

The DC signals from the Peak and Threshold Detectors, or from the DVM converter, go into the Analog-to-Digital Converter. The Analog-to-Digital Converter is typically a dual or triple slope integrator. In a typical dual slope integrator the incoming signal of the unknown voltage is integrated for a specified time. It is then integrated backwards by a known voltage until zero crossing. The time it takes for the integrator to integrate backwards is proportional to the input voltage. The output of the A-to-D converter is connected to a Gate Control Circuit which supplies a start and stop signal to the Counter-Decoder circuit. The Logic circuit instructs the Time Base circuit to supply the Counter-Decoder circuit with a signal pulse from an oscillator of known frequency. The counters begin counting the pulses when the Gate Control circuit transmits a start signal. The counter continues to count until the Gate Control circuit transmits a stop signal. After the stop signal has been transmitted to the Counter-Decoder circuit, the total number of pulses counted are transmitted to the display. If the number of pulses overflows or does not register a sufficient number of pulses, the Counter-Decoder circuit sends a signal to the Auto Ranging Circuit. This circuit sends a digital signal to the attenuators to either increase or decrease the attenuation of the incoming signal.

If any of the A, B or C Channel function switches are selected, other than the peak or threshold function switches, the signals pass directly into the Logic circuitry. Two threshold voltages are set, one for the high threshold and one for the low threshold. If the threshold voltages are set too high or two low, so that the incoming signal does not cross both of the thresholds, the logic circuit activates a signal present and a signal fault indicator. If the threshold voltages are within the signal, then the signal present light is activated; however, if one of the threshold voltages is set so that the incoming signal does not attain that threshold voltage, then a signal fault light is activated. All of the functions, except frequency, use the crossing of a threshold voltage to activate the gate control. The frequency function usese the crossing of a threshold voltage to cause a pulse to be sent to the counters. Each one of these functions is illustrated by the following figures.

Figure 2:
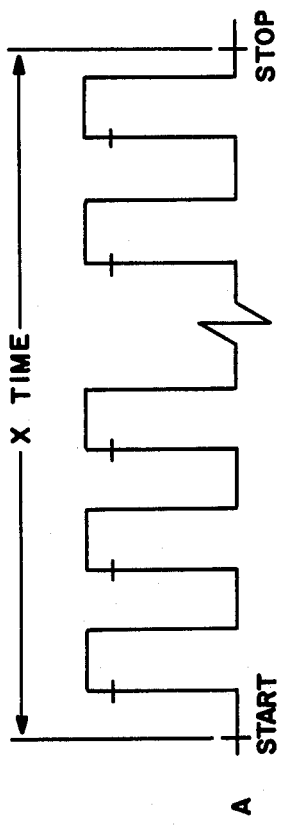
FIG. 2 displays a voltage-time curve for an exemplary incoming electrical signal and illustrates a measurement of the rise or fall time from the low and high threshold voltage setting.

If the positive or negative slope time of the incoming signal is desired, the A slope function switch and the positive or negative phase switch are selected. This measurement is illustrated in FIG. 2. As the incoming signal passes through the low threshold, the logic circuit informs the gate control which sends a start signal to the counter circuit. The counters then begin counting a clock signal of known frequency. When the incoming signal passes through its high threshold voltage, the logic circuit informs the gate control which sends a stop signal to the counters. At that time, the information in the counters is transferred to the decoder and then to the display. If the number of pulses counted are too high, so that there is an overflow of pulses from the counters, the Counter-Decoder circuit sends a signal to an overflow lamp. This lamp is used to inform the instrument user to select a different time base. This illustrates a measurement of the rise time. The fall time is measured by starting the counters when the incoming signal passes through its high threshold and stopping the counters when the signal passes through its low threshold. The display reads out directly in units of time, such as micro-seconds, milliseconds, seconds, etc. If the fall time is desired then the negative phase is chosen.

Figure 3:
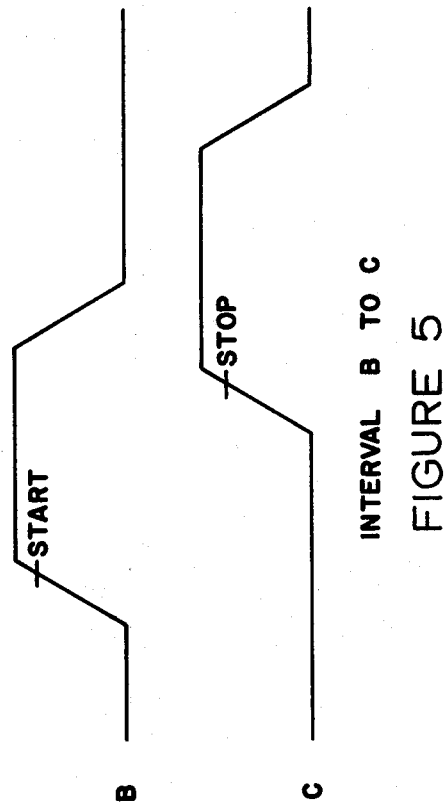
FIG. 3 displays a voltage-time curve for exemplary incoming electrical signal wherein a frequency measurment is made.

A measurement of the frequency of the incoming signal is illustrated by FIG. 3. The function switch instructs the time base circuit to select a clock signal. The first pulse of this clock signal directs the Gate Control to send a start signal to the counters. The counters commence counting each time and incoming signal passes through its high threshold voltage. The counter continues counting until the second pulse from the clock signal occurs. At this time, the Gate Control circuit directs the counters to stop counting. The number of pulses counted are then transferred to the display. If the time base selected was too long or too short a signal goes to the auto ranging circuit. This circuit directs the time base to select a faster or slower clock signal and also orders a change in the demical point location.

Figure 4:
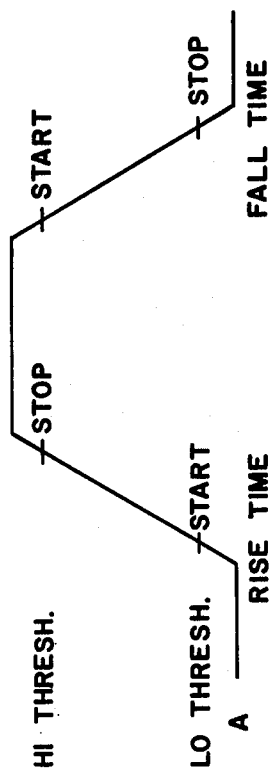
FIG. 4 displays a voltage-time curve for an exemplary electrical signal wherein a width measurement is made.

If the positive or negative width of the incoming signal is desired, the A width function switch and the positive or negative phase switch are selected. The width measurement is illustrated in FIG. 4. When the incoming signal passes through its high threshold voltage, the logic circuit directs the Gate Control circuit to send a start signal to the Counter circuit. The Counter circuit then commences counting a clock signal from the time base circuit, when the incoming signal goes through a low threshold, the Gate Control circuit sends a stop signal to the counter circuit. At that time, the total number of pulses counted is transferred to the display. If the negative phase is selected, the start signal occurs when the incoming signal passes through its low threshold voltage, and a stop signal occurs when the incoming signal passes through its high threshold voltage.

Figure 5:
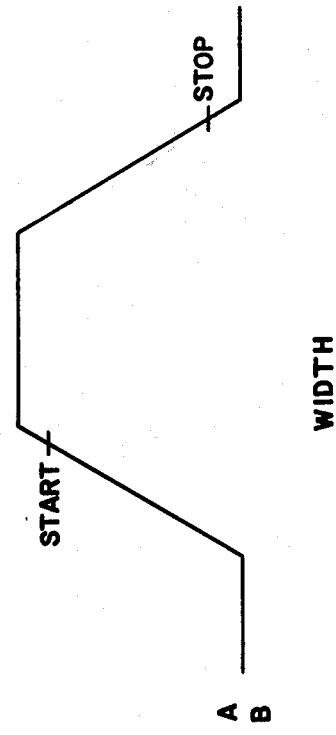
FIG. 5 displays a voltage-time curve for two exemplary electrical signals with the time interval between the two signals being measured.

If the interval B to C function is selected, the incoming signals from B and C channels go through the Mode and Function Switches, into the Logic circuit. This measurement is illustrated in FIG. 5. When the incoming signal in the B channel passes through its high threshold, the Gate Control circuit sends a start signal to the Counter circuit. At this time the counters commence counting a clock from the Time Base circuit. When the incoming signal in C channel passes through its high threshold, the Gate Control circuit sends a stop signal to the Counter circuit. The total number of pulses counted during this period are then transferred to the display. As in the slope function, if too many pulses are counted, the counter Decoder circuit sends a signal to an overflow lamp. This lamp is used to inform the instrument user to select a slower clock signal from the time base.

Figure 6:
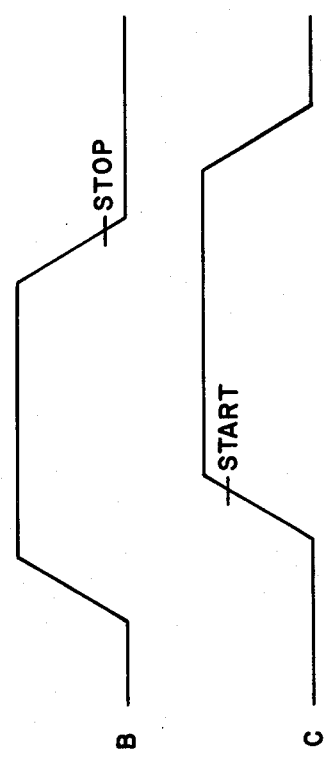
FIG. 6 displays a voltage-time curve for two exemplary electrical signals with the time interval when the two signals are coincident being measured.

The coincidence B and C function is illutrated in FIG. 6. The coincidence B and C function is similar to the interval B to C function, except that the Gate Control orders the Counter circuit to begin counting when both the incoming signal in B channel passes through its high or low threshold voltage and the incoming signal in C channel passes through its high or low threshold voltage. The stop order occurs when either the incoming signal in B channel goes through its low or high threshold or the incoming signal in C channel goes through its low or high threshold, whichever occurs first. The start Gate Control is controlled by the high threshold voltages when the positive phase is selected and the low threshold voltages when the negative phase is selected.

Figure 7:
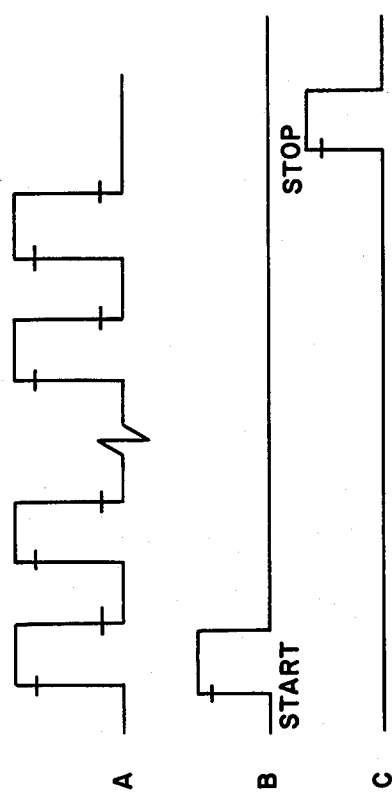
FIG. 7 is a voltage-time curve for three exemplary electrical signals for measuring the total number of positive and negative slopes in the A channel signal commencing with an event on the B channel signal and terminating with an event on the C channel signal.

The TRC measurement of the total number of positive and negative slopes occurring on A channel during an interval commencing with an event on B channel and terminating with an event on either B channel or C channel. This measurement is illustrated in FIG. 7. In this measurement the incoming signal in Channel A goes to the logic circuit when the incoming signal in B channel goes through its high or low threshold. The gate Control circuit transmits a start signal to the counters. When the incoming signal in C channel goes through its high or low threshold voltage, the Gate Control circuit orders the counters to stop counting. The Counter circuit counts each time the incoming signal in A channel passes through its high threshold, and each time it passes through the low threshold.

Figure 8:
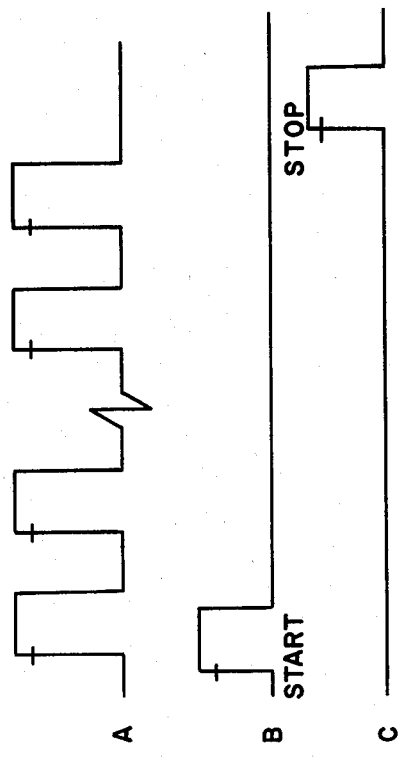
FIG. 8 is a voltage-time curve for three exemplary electrical signals for measuring the total number of positive or negative slopes in the A channel signal commencing with an event on the B channel signal and terminating with an event on the C channel signal.

When the Single or Repeat Count function is selected the Single Count and Repeat Count switches are activated. These measurements are shown in FIG. 8. When the incoming signal in B channel passes through its high or low threshold, the Gate Control circuit sends a start signal to the Counter circuit. This causes the counters to begin counting each time the incoming signal in A channel goes through its high or low threshold. When the incoming signal in C channel passes through its high or low threshold voltage, the Gate Control circuit orders the counters to stop counting. The counter circuit counts each time the incoming signal in A channel goes through its high or low threshold. In the Single Count mode, the counter circuit measures only a single sample of the incoming signal on A channel. When the Repeat Count function is chosen, the Counter circuit continuously samples the signal on A channel, and continually updates the results of each sampling.

The frequency Ratio A to B function is illustrated in FIG. 11. When this function is selected, the Gate Control circuit sends a start signal to the counters when the incoming slower signal in B channel goes through its high or low threshold. A stop signal is sent to the counters when the incoming signal in B channel goes through its high or low threshold voltage for a second time. The counters accumulate the numnber of times the incoming faster signal in A channel goes through its high or low threshold. The display will show the number of cycles in A channel for each cycle on B channel.

The Period Function is illustrated in FIG. 10. When this function is selected, the Gate Control circuit sends a start signal to the Counter circuit when an incoming signal in B channel goes through its high or low threshold. The counters begin counting the pulses from a clock of known frequency from the time base. The counter continues to count the pulses from the clock until the incoming signal in B channel goes through its high or low threshold a second time. When this occurs, the Gate Control circuit orders the counters to stop counting. The total number of pulses accumulated in the counters is then transferred to the display. If too many pulses from the clock are measured, the auto ranging circuit lights an overflow lamp. This informs the user to select a slower time base.

Figure 9:
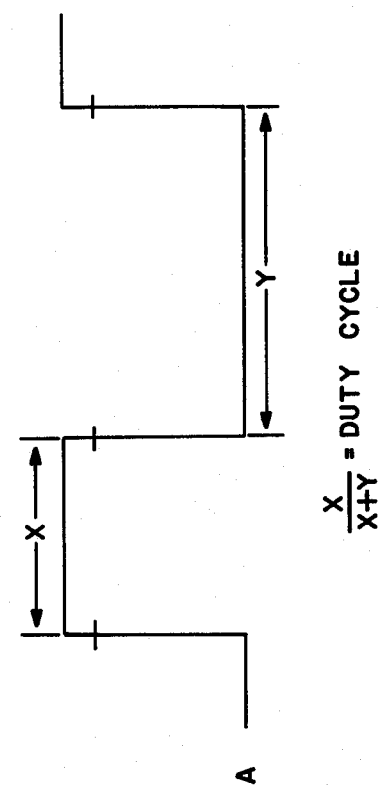
FIG. 9 is a voltage-time curve for an exemplary electrical signal wherein a duty cycle measurement is made.

With the Duty Cycle function, illustrated in FIG. 9, selected the incoming signal in A channel goes into the logic circuit. Each time the incoming signal passes through its high threshold voltage, a two volt signal is sent to the A to D converter. Each time the signal passes through its low threshold voltage, a zero volt signal is sent to the A to D converter. This alternating two volt/zero volt signal is integrated over a known time period. This results in the integration of an average having a value between 0 and 2. This average voltage is converted to a digital signal which directs the gate circuit to start counting a selected clock for a time period proportional to the average voltage. Since a two and zero volt input signal and a 500 kHz clock is employed, the displayed number will be equal to the Duty Cycle.

If two or more function switches are selected at the same time or an incorrect combination of switch settings is selected, the logic circuit instructs a forbidden combination circuit. The forbidden combination circuit sends a signal to the display which overrides any coded information from the counters.

The invention can be more readily understood by following the detailed description of the invention which represents only one embodiment of this invention.

SINGLE CHANNEL FUNCTIONS

High and Low Peak Voltages

In order to set the appropriate threshold voltages, the high and low peak voltages of the incoming signal must be ascertained. The following is directed to the circuitry involved in measuring the high and low peak voltages for an incoming signal in channel A. The incoming signal in Channel A enters line 1 in FIG. 13 through fuse F1 and into line 2. Line 2 is connected to switch Sw1 which allows selection between two voltage ranges. When the switch is in the 3 volt range, the signal passes through switch Sw1 into line 3. Line 3 goes into the buffer amplifiers as shown in FIG. 14. As illustrated, the signal in line 3 goes through resistor R16 into line 35 and through resistor R17 into line 36. Capacitor C6 is connected across resistor R16 and Capacitor C7 is connected across resistor R17. Capacitors C6 and C7 provide a high frequency compensation to line 36. The signal in line 36 is fed into the base of a field effect transistor FT1. One side of the field effect transistor FT1 is connected by line 39 to a positive source and through diode D2 to line 36. Line 36 is also connected through diode D1 to line 37 which is connected to a negative voltage source and to the gate of field effect transistor FT2. Line 37 is also connected to the other side of field effect transistor FT2 through variable resistor VR5 and resistor R19. The output of field effect transistor FT1 is connected through resistor R18 to the output of field effect transistor FT2 at line 38. Diodes D1 and D2 are positioned so that the negative phase goes into line 37 and the positive phase goes into line 39. This provides over voltage protection. The signal in line 38 is of lower impedence than the signal in line 3 and has the same wave form. Line 38 is connected to the base of transistors T1 and T2. The collector of transistor T1 is connected by line 37 to a negative voltage source and the collector of transistor T2 is connected by line 39 to a positive voltage source. The emitter of transistor T1 is connected to line 40 and to a positive voltage source through resistor R20. Line 40 is connected to the base of transistor T3. The emitter of transistor T2 is connected to line 41 and to a negative voltage source through resistor R21. Line 41 is connected to the base of transistor T4. The collector of transistor T3 is connected to a positive voltage source. The collector of transistor T4 is connected to a negative voltage source. The emitters of transistors T3 and T4 are commonly connected through resistors R22 and R23 respectively to line 42. As the high impedence signal in line 36 goes positive, the gate of field effect transistor FT1 goes high and causes line 38 to go high. The high in line 38 causes transistor T1 to conduct less and transistor T2 to conduct more. Field effect transistor FT2 is a constant current source to line 38. Variable resistor VR5 adjusts the value of this constant current source. VR15 is adjusted to provided zero volts at line 38 when line 3 is at zero volts. When the signal in line 36 goes negative, the gate of field effect transistor FT1 goes low and causes line 38 to go low. The low in line 38 causes transistor T1 to increase conduction and causes transistor T2 to conduct less. When transistor T1 is conducting less, transistor T3 is conducting, thereby supplying a low impedence signal at line 42 during the positive cycle. When transistor T2 is conducting less, transistor T4 is conducting more, thereby supplying a low impedence signal at line 42 during the negative cycle. The signal at line 42 has the same wave form as the signal at line 3.

The signal in line 42 goes through impedence matching resistor R24 into line 43. Line 43 goes through a calibration variable resistor VR10 with frequency compensation capacitor C11 across it, shown in FIG. 15, into line 52. The calibration capacitor/resistor connection is used as a voltage divider. Line 52 goes into switch SW7 which is the A peak switch, and into line 53.

Figure 16:
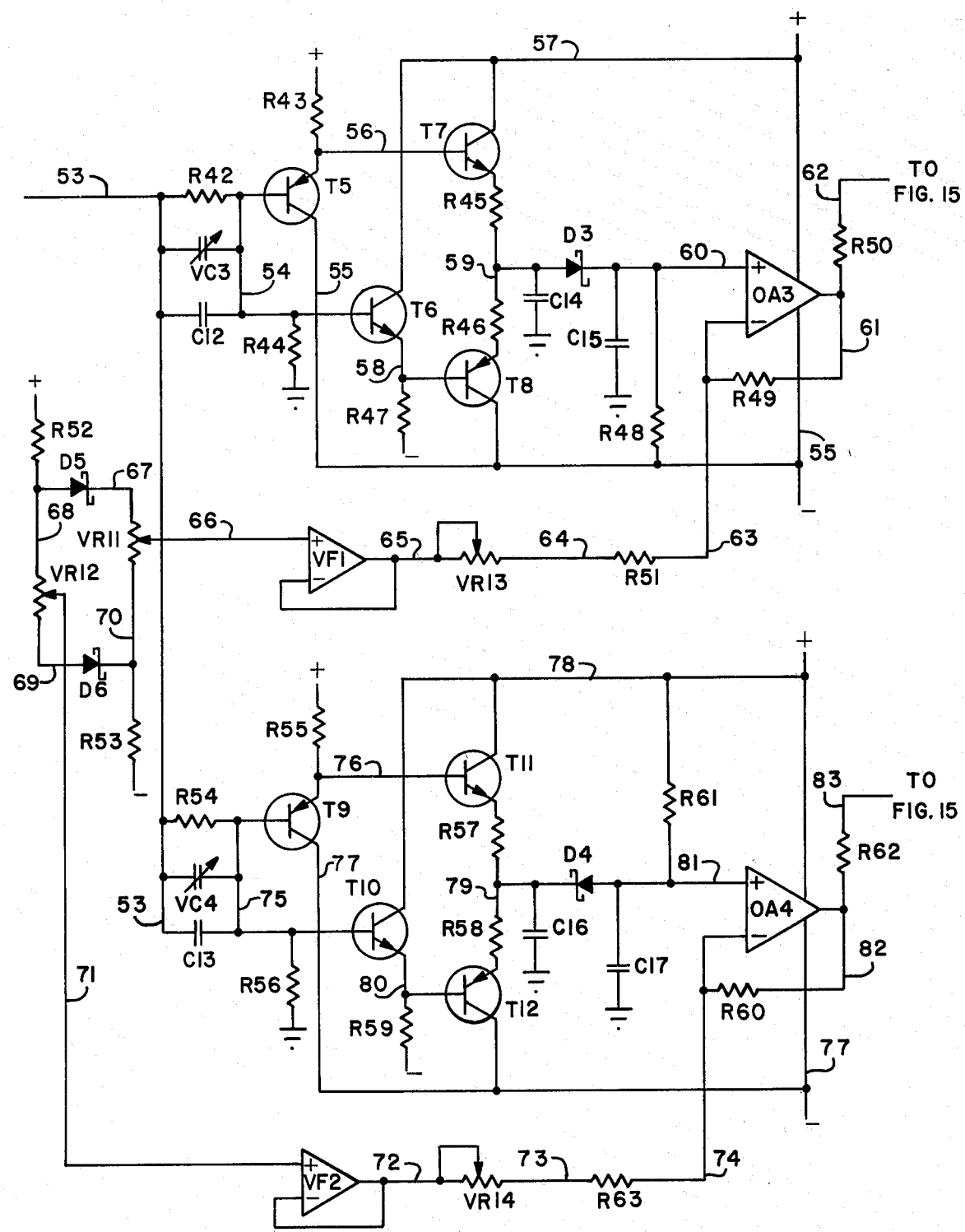
FIG. 16 depicts a schematic representation of the high and low peak detector circuitry.

Line 53 goes into both the high and low peak detector circuits as shown in FIG. 16. Line 53 goes into the high level peak detector through parallel connected resistor R42, capacitor C12, and variable capacitor VC3. The other side of resistor R42 is connected by line 54 to the base of transistors T5 and T6. The capacitor C12 and variable capacitor VC3 are for frequency compensation to assure that the signal at line 54 is the same as the input signal in line 54 goes through attentuator resistor R44 to reduce the voltage in line 54. The emitter of transistor T5 is connected through line 56 and resistor R43 to a positive voltage source. The emitter of transistor T6 is connected by line 58 through resistor R47 to a negative voltage source. The collector of transistor T5 is connected by line 55 to a constant negative voltage source and the collector of T6 is connected by line 57 to a constant positive voltage source. The emitter of transistor T5 is connected to the base of transistor T7 and the emitter of transistor T6 is connected to the base of transistor T8. The collector of transistor T7 and the and the collector of transistor T8 are connected to positive and negative sources respectively. The emitters of transistors T7 and T8 are commonly connected through resistors R46 and R45 respectively to line 59. Line 59 is connected to grounded capacitor C14 and to Schottky diode D3. The output of Schottky diode D3 is connected to the positive input of the operational amplifier OA3 by line 60. Line 60 is also connected to grounded capacitor C15 and to a negative voltage source through resistor R48. The negative side of the operational amplifier OA3 is connected by line 63 to its output, line 61, through resistor R49. During the positive rise of the signal in line 53, transistor T5 conducts less and causes line 56 to become more positive. This causes transistor T7 to conduct more resulting in a positive signal on line 59 of similar amplitude as in line 54, but with decreased impedance. The high frequency noise in line 59 is removed by capacitor C14. The positive rise in line 59 goes through diode D3 and charges capacitor C15. the capacitance in capacitor C15 is selected so that it rapidly charges to the most positive point of the signal. During the fall of the signal in line 53 and correspondingly at line 59, the diode D3 disconnects the positive charge on the capacitor C15 from line 59. Because of the capacitance of capacitor C15 and the resistance in resistor R48, a significantly long time constant is achieved to provide a stable peak voltage to operational amplifier OA3. The voltage across diode D3 varies with temperature, thereby introducing error into the circuit. To overcome this error, the operational amplifier OA3 is zeroed by adjusting its negative input. The negative input is connected by line 63 to resistor R51 and by line 64 to variable resistor VR13. Variable resistor VR13 is connected to the output of voltage follower VF1 at line 65. Line 65 is also connected to the negative input of the voltage follower to assure that the output is always equal to the voltage at the input. regardless of the current draw. The positive side of the voltage follower is connected by line 66 to variable resistor VR11. One end of VR11 is connected by line 67 to Schottky diode D5, and the other side of VR11 is connected by line 70 to Schottky diode D6. Line 70 is also connected to a negative voltage source through resistor R53. Schottky diode D5 is connected by line 68 to a positive source through resistor R52 and to a variable resistor VR12. The anode of Schottky diode D6 is connected by line 69 to variable resistor VR12. The operational amplifier OA3 is zeroed by adjusting the voltage with VR11 on line 66. When no signal is present on line 53, VR11 is adjusted so that there is zero voltage at the output of operational amplifier OA3. When diode D3 has a change in the voltage drop due to a temperature increase, an offsetting decrease in voltage occurs across diode D5 due to an increase in temperature.

The circuit is calibrated by providing an input signal with known peak voltage at line 53. The variable resistor VR13 is used to adjust the gain on the operational amplifier OA3. This adjustment is made so that the output at line 61 is a selected value of the signal at line 53. The signal at line 61 goes through resistor R50 into line 62.

The incoming signal in line 53 also goes to the low level peak detector circuit. Line 53 is connected through resistor R54 to line 75. Capacitor C13 and variable capacitor VC4 and connected across resistor R54 to provide high frequency compensation. Line 75 is connected to the base of transistors T9 and T10 and through attenuator resistor R56 to ground. The emitter of transistor T9 is connected to a positive voltage source through resistor R55 and its collector is connected to a constant negative voltage source. The emitter of transistor T10 is connected through resistor R59 to a negative voltage source and its collector is connected to a constant positive voltage source. The emitter of transistor T9 is connected by line 76 to the base of transistor T11, and the emmitter of transistor T10 is connected by line 80 to the base of transistor T12. The collector of Transsistor T12 is connected to a negative voltage source. The collector of transistor T11 is connected to a positive voltage source. The emitters of transistors T11 and T12 are connected to line 79 through resistors R57 and R58 respectively. Line 79 is connected to grounded capacitor C16 to remove any high frequency noise. Line 79 is also connected to Schottky diode D4. The anode of Schottky diode D4 is connected to the positive side of operational amplifier OA4 by line 81. Line 81 is also connected to grounded capacitor C17 and to a positive voltage source through resistor R61. The low level peak detector works in the same manner as the high peak detector, with the exception that Schottky diode D4 is inverted so that capacitor C17 charges to the most negative peak. During the subsequent rise of the signal in line 79, the Schottky diode D4 holds the negative charge on the capacitor. Because of the selected capacitance in capacitor C17 and the resistance in resistor R61, a relatively long time constance is achieved providing a signal to the positive input of the operational amplifier OA4. The negative input of the operational amplifier OA4 is connected by line 74 to resistor 63, which is connected by line 73 to variable resistor VR14. Variable resistor VR14 is connected to the output of voltage follower VF2 by line 72. Line 72 is also connected to the negative input of VF2. The positive input of voltage follower VF2 is connected by line 71 to variable resistor VR12. VR12 can be adjusted so as to zero the operational amplifier OA4. The operation of the low level peak detector circuit is essentially the same as the operation of the high level peak detector circuit.

The output of the operational amplifier OA4 on line 82 goes through resistor R62 to line 83. The output of the operational amplifier OA4 is also connected to its negative input through resistor R60. Thus the signal on line 62 represents the high level peak voltage and the signal on line 83 represent the low level peak voltage.

Figure 15:
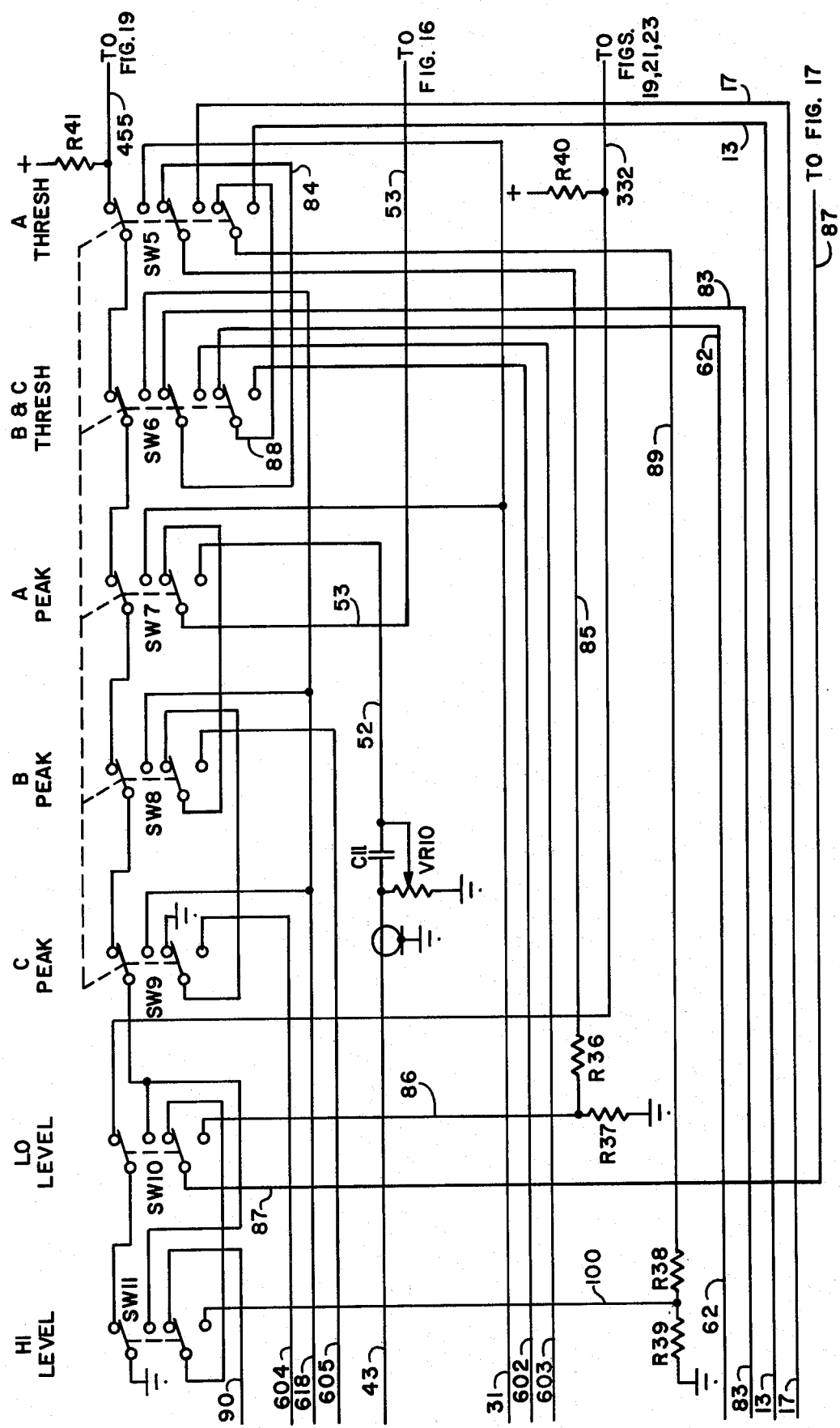
FIG. 15 depicts a schematic representation of the high and low level peak and threshold switching circuitry.

Line 62 is connected through switches SW6 and SW5 in FIG. 15 to line 89. Line 89 is connected through resistor R38 to line 100. Line 100 is connected to grounded resistor R39 and to the high level switch SW11. The low level peak signal in line 83 is connected through switches SW6 and SW5 to line 85. Line 85 is connected through resistor R36 to line 86. Line 86 is connected to grounded resistor R37 and to the low level switch SW10. If the high level switch SW11 is depressed, the signal in line 100 goes through the high level switch SW11 and through low level switch SW10 into line 87. If the low level switch SW10 is depressed the signal in line 86 goes directly into line 87.

Figure 17:
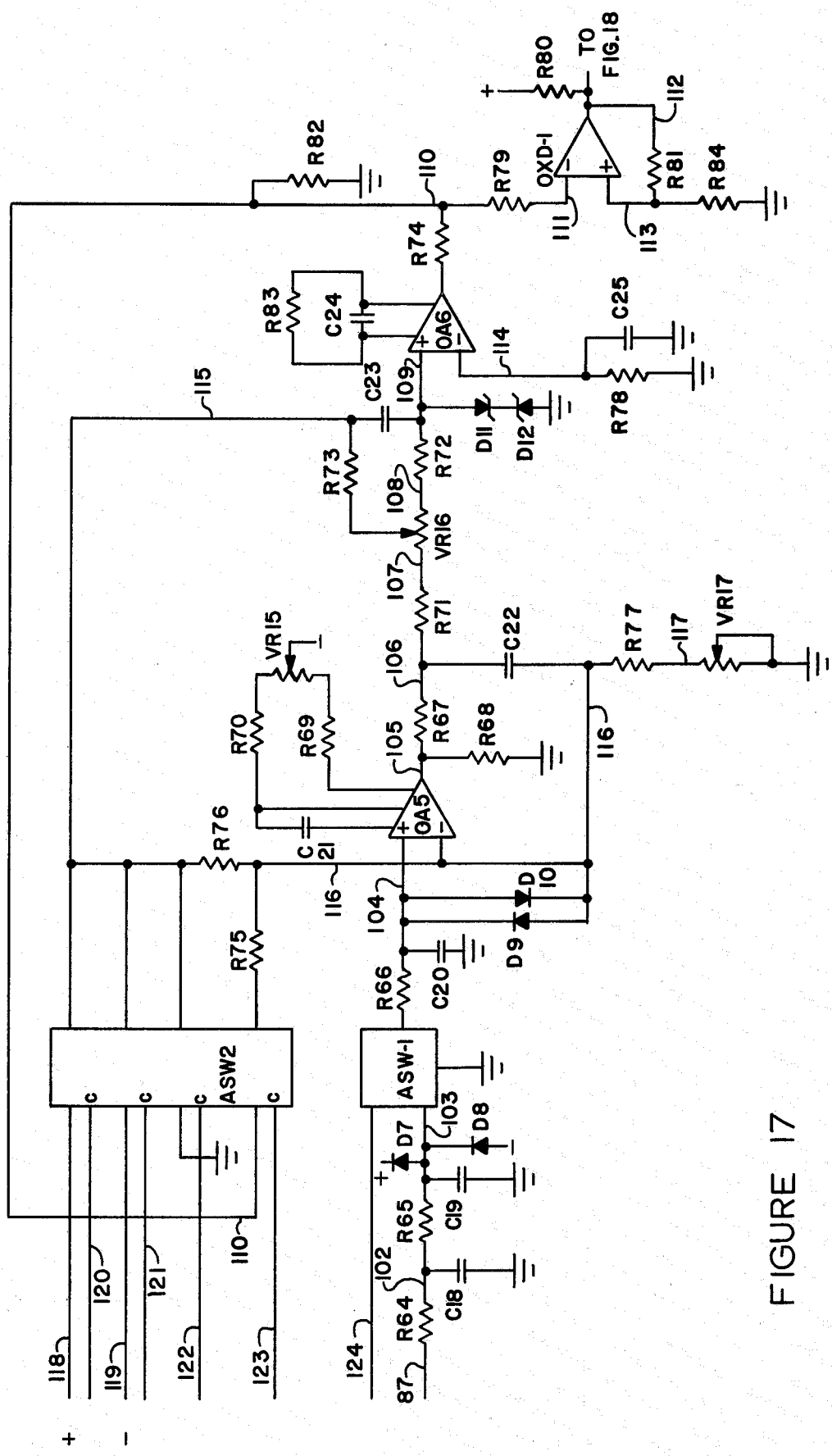
FIG. 17 depicts a schematic representation of the analog to digital converter circuitry.

Line 87 goes to the analog to digital converter circuit in FIG. 17. Line 87 is connected through resistor R64 to line 102 which is connected through resistor R65 to line 103. Line 102 is also connected to grounded capacitor C18. Line 103 is connected to grounded capacitor C19 and to analog switch ASW1. Capacitors C18 and C19 are used as filter capacitors to remove the high frequency components in line 103. Line 103 is connected through diode D7 to a positive voltage source and through diode D8 to a negative voltage source. The output of the analog switch ASW1 goes through resistor R66 to the positive input of operational amplifier OA5 at line 104. Control line 124 is connected to analog switch ASW1. The signal on control line 124 causes the analog switch ASW1 to connect line 103 with line 104. This allows the operational amplifier to begin integrating the incoming signal on line 87. When no signal is present on control line 124, the analog switch connects line 104 with ground. The signal on line 124 is connected to a clock signal so that a pulse of a known time duration is applied to the analog switch. For illustration purposes only, the line 124 is connected to a 100 millisecond clock so that the signal on line 87 is connected to line 104 for a duration of 100 milliseconds.

The output of operational amplifier OA5 is connected by line 105 through resistor R67 to line 106. Line 105 is also connected to grounded resistor R68. Line 106 is connected to capacitor C22 which is connected by line 116 to the negative input of the operational amplifier OA5. Diodes D9 and D10 are connected across the amplifier's positive and negative inputs to protect the amplifier from any overload input conditions. During the time the DC voltage at line 87 is impressed upon the positive input of the operational amplifier, capacitor C22 will slowly charge. Hence, the voltage at line 106 will continuously increase for 100 milliseconds. After the 100 millisecond control signal ceases, analog switch ASW1 grounds line 104. Also, after the 100 millisecond control signal ceases, a control signal on line 120 causes analog switch ASW2 to connect a positive reference voltage on line 118 with line 115. The positive signal on line 115 goes through resistor R76 to the negative input of operational amplifier OA5 at line 116. This causes the operational amplifier to integrate backwards slowly discharging capacitor C22.

Line 106 is connected through resistor R71 to line 107. Line 107 is connected to variable resistor VR16. The other side of variable resistor VR16 is connected to line 108 and then through resistor R72 to line 109. Line 115 from the analog switch ASW1 is also connected through capacitor 23 to line 109 and through resistor R73 to the arm of VR16. Line 109 is connected to the positive input of operational amplifier OA6. The negative input of operational amplifier OA6 is connected to a grounded resistor R78 and grounded capacitor C25 at line 114. The high frequency noise from the amplifier is eliminated by capacitor C24.

The output of operational amplifier OA goes through resistor R74 into line 110. The voltage curve at line 106 is illustrated by FIG. 12. As shown in FIG. 12, the voltage at point A jumps to an unknown voltage upon the connection of input signal on line 103 to line 104. The voltage increases over the 100 millisecond integration period at line 106 as operational amplifier OA5 compensates for the discharge of C22 through R77, R76 and VR17. VR17 adjusts this discharge rate. Line 115 is grounded during this 100 millisecond period through ASW-2 by control line 122. After 100 milliseconds, the analog switch ASW1 grounds the input on the operational amplifier OA5. This is illustrated at point B in FIG. 12. A short time thereafter, approximately 100 microseconds, a positive reference voltage on line 118 is impressed upon the negative input of the operational amplifier. At this time, an edge of the referenced voltage passes through capacitor C23 to provide a compensation pulse at the beginning of the declining ramp. This is illustrated as point C in FIG. 12. A portion of the referenced voltage on line 115 passes through resistor R73 and variable resistor VR16. This provides linear compensation of the signal at the beginning of the declining ramp. As the voltage on capacitor C22 approaches zero, the output in line 110 approaches zero volts. This is illustrated by point D in FIG. 12. The time from point C to point D, i.e., the second ramp, is proportional to the input voltage. Thus a measurement of this time is a measurement of the input voltage.

Referring now to FIG. 17, line 110 is connected through resistor R79 to the negative input of zero crossing detector OXD-1. The output of zero crossing detector OXD-1 is connected through resistor R80 to a positive source, and through resistor R81 to the positive input of the OXD-1 at line 113. Line 113 is connected to grounded resistor R84. As the voltage on line 110 goes to zero, the zero crossing detector OXD-1 no longer supplies a negative output and line 112 goes positive. This occurs at point D in FIG. 12. Variable resistor VR15 adjusts the output at line 106 to zero volts when the input line 103 is zero volts. The high frequency noise is eliminated by capacitor C21.

Line 110 is also connected to the analog switch ASW-2. Analog switch ASW-2 connects line 110 with the negative input of the operational amplifier OA5 when a signal in line 123 is present. This is to bring the output of OA6 back to zero if the positive reference voltage causes amplifier OA5 to integrate beyond zero crossing. This is illustrated by points E and F of FIG. 12. Line 115 is connected to the analog switch ASW-2 and is connected to ground whenever a signal on line 122 occurs. This signal maintains the operational amplifier OA6 at zero output.

In the event that a low peak voltage is selected and this low peak is negative, a negative reference voltage is supplied to line 115 through line 119. This is accomplished by a signal on control line 121. The circuit operates in the same manner as the integration of a positive signal discussed above, except that the negative phase is used.

Figure 18:
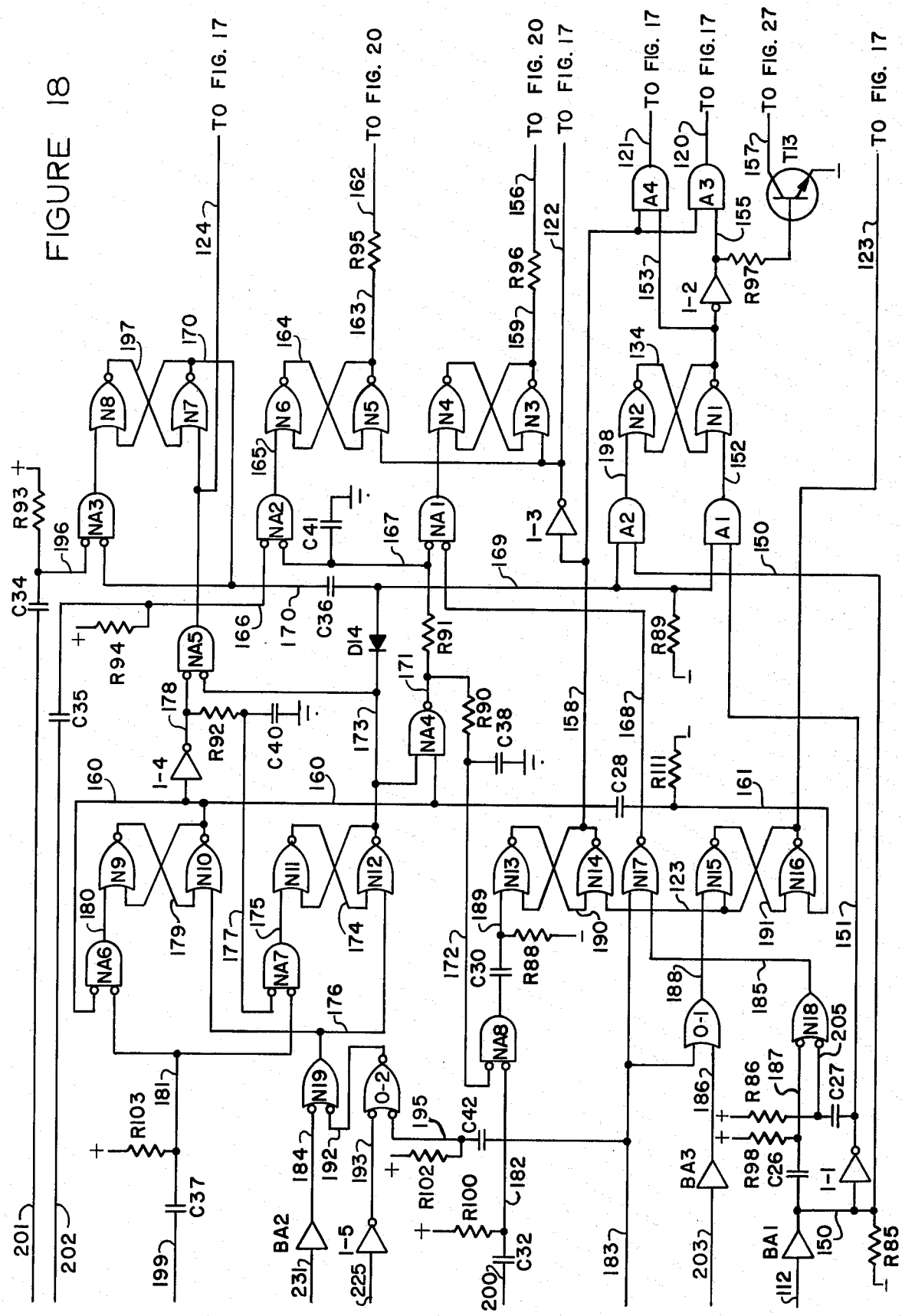
FIG. 18 depicts a schematic representation of the control circuitry for the analog to digital converter circuitry.

Line 112 goes through buffer amplifier BA1 in FIG. 18 into line 150. Line 150 is connected to AND gate A2 and also to AND gate A1 through inverter I1 at line 151. Line 150 is also connected through capacitor C26 to line 187. Line 187 is connected to the input of NOR gate N18 and to a positive voltage source through resistor R98. The other input to NOR gate N18 is connected to a positive source through resistor R86 and to capacitor C27. The other side of capacitor C27 is connected to line 151. The signal on line 112 goes high when the zero crossing occurs at point D as shown in FIG. 12. This causes line 150 to go high and line 151 to go low. The leading edge of the signal on line 151 passes through capacitor C27 causing line 205 to go low. The low on line 205 causes the output of NORgate N18 on line 185 to go high. Line 185 is connected to NORgate N17 which causes the output of NORgate N17 on line 168 to go low. Line 168 is connected to NANDgate NA1. The other input to NANDgate NA1 is controlled by the digital logic circuit. In order to determine the status of this point, the following description of the applicable logic circuit will be set forth.

The signal that is being measured is a high or low peak signal. Hence, when low or high level switch SW10 or SW11 in FIG. 15 is activated, line 332 goes high. Line 332 is connected through inverter I39 in FIG. 463. This line is low. Line 463 is connected to NORgate N36. The output of NORgate N36, which is high, is connected by line 475 through inverter I40 to line 336. Line 336, which is low, is connected to inverter I41 to line 231. Line 231 is high. Line 231 goes through buffer amplifier BA2 in FIG. 18 to line 184. Line 184 is connected to the input of NORgate N19.

When a transfer signal occurs, the positive voltage passes through line 203, through buffer amplifier BA3, into line 186. Line 186, which is high during transfer, is connected to ORgate O-1. The output of ORgate O-1, which is high, goes through line 188 and into NORgate N15. The output of NORgate N15 is connected to the input of NORgate N16 by line 191. Line 191 goes low during transfer which causes the output of NORgate N16 on line 123 to go high. Line 123 is connected back to the input of NORgate N15. This causes line 191 to remain low after the transfer signal has terminated. Line 123 is a control line to analog switch ASW2 as shown in FIG. 17. During the time there is a signal on line 123, the A to D converter is zeroed by the analog switch ASW2 connecting the output of line 110 with the input, line 116, through resistor R75 (See point E in FIG. 12).

A short time thereafter, a positive reset signal occurs on line 225 as shown in FIG. 18. Line 225 is connected through inverter I5 to line 193 which is low during the reset pulse goes through ORgate O-2. The output of ORgate O-2 is connected by line 192 to NORgate N19. The other input to NORgate N19 is line 184 as discussed above. Line 192 is low during reset so that the output of NORgate N19 on line 176 is high during this period. Line 176 is connected to NORgate N12 and NORgate N10. Since line 176 is high, the output or NORgate N10 on line 160 is low. Line 160 is connected to NORgate N9. The output of NORgate N9 which is high, goes back to the input of NORgate N10. This assures that the output of NORgate N10 is low even after the reset signal on line 225 ceases. Line 160 is also connected to and enables NANDgate NA6. The low on line 160 arms NANDgate NA6.

The output of the NORgate N12 on line 173 is low during reset. Line 173 is connected to NORgate N11. The output of NORgate N11 on line 174 is connected to the input of NORgate N12. Line 174 is high which assures the output of NORgate N12 on line 173 of being low even after the reset signal disappears.

Line 160 is connected through capacitor C28 to line 161 which is connected to NORgate N16. When line 160 goes high, the edge of the signal goes through capacitor C28 and causes line 161 to go low momentarily. This signal does nothing to NORgate N16 as a positive signal is required to energize NORgate N16.

Line 160 is connected through inverter I4 into line 178. Line 178, which is high, is connected to NANDgate NA5. The other side of NANDgate NA5 is connected to line 173. This line is low from the reset signal. Line 178 is connected through resistor R92 to line 177. Line 177 is connected to the input of NAND gate NA7 and since line 177 is high, it disables NANDgate NA7. NANDgate NA7 and NANDgate MA6 are commonly connected by line 181 and through capacitor C37 to line 199. Line 199 is connected to a 100 millisecond clock signal. The trailing edges of the 100 millisecond pulses on line 199 pass through capacitor C37 causing line 181 to become negative every 100 milliseconds. The first 100 millisecond pulse occurs immediately after reset. The low edges on line 181 pass through enabled NANDgate NA6 into line 180. Line 180, which is high, goes into NORgate NA9 and causes the output on line 179 to become low. The low on line 179 assures that the output of NORgate N10 on line 160 is high after the first edge of the 100 millisecond pulse ceases. The high on line 160 causes line 178 to become low and a high signal then passes through NANDgate NA5 into line 124. Line 124 is the control line to analog switch SW2 in FIG. 17, and a signal causes the integrator to begin integrating.

Line 124 is connected to NORgate N7. The output of NORgate N7 on line 170 goes low. Line 170 is connected to NORgate N8 and to NANDgate NA3. The output of NORgate N8 which is high, is connected to the input of NORgate N7 and assures a low output of NORgate N7. The high on line 160 passes through capacitor C28 into NORgate N16. The output of NORgate N16 goes low on control line 123 which stops the integrator from zeroing. Line 123 is connected to NORgates N15 and N14. The output of NORgate N15 is connected by line 191 to NORgate N16 latching NORgates N15 and N16. Line 124 holds the state of NORgates N7 and N8 for 100 milliseconds. Then line 124 will go low as described below allowing a 100 microsecond clock. Approximately every 100 microseconds a signal passes through line 201 into capacitor C34. The negative edge of the signal passes through capacitor C34 and causes line 196 to go low. This low causes the output of NANDgate NA3 to go high thereby resetting NORgates N7 and N8. The next 100 millisecond pulse which occurs into line 181, passes a positive signal through NANDgate NA7 into line 175. The high on line 175 causes the output of NORgate N11 on line 174 to become low. This in turn causes the output of NORgate N12 to become high and latches NORgate N11. This assures that the signal on line 173 will remain high after the edge of the 100 millisecond pulse has ceased. The high on line 173 disables NANDgate NA5 causing line 124 to become low. This low instructs analog switch ASW1 to disconnect the input signal from the integrating circuit thereby stopping the integrator from integrating. After the second 100 millisecond signal passes through the circuit, both line 160 and line 173 become high. This causes the output of NANDgate NA4 on line 171 to become low. A low on line 171 enables NANDgate NA1, NANDgate NA2, and NANDgate NA8. Resistor R90 and capacitor C38 connecting line 171 to NANDgate NA8 provide a short delay in enabling NANDgate NA8. Also, resistor R91 and capacitor C41 provide a short delay in enabling NANDgates NA2 and NA1. Approximately, 50 microseconds after NANDgate NA8 has been enabled, a signal from the divider DIV7 in FIG. 25 passes on line 200 through capacitor C32. The edge of this signal causes NANDgate NA8 to go high. The leading edge of this high passes through capacitor C30 and causes line 189 to go high. Line 189 is connected to NORgate N13. The output of NORgate N13 is connected to NORgate N14 by line 190. When line 190 goes low, the output of NORgate N14 on line 158 goes high. Line 158 is also connected to NORgate N13 which latches the high signal from NORgate N14. Line 158 is connected to the inputs of ANDgates A3 and A4. The other side of ANDgate A3 is connected through inverter I2 and line 153 to the output or NORgate N1. NORgate N1 is connected by line 152 to the output of ANDgate A1. ANDgates A2 and A1 were previously disabled and enabled respectively by the low and high on lines 151 and 150. ANDgates A1 and A2 are also connected by line 169 to capacitor C36. This capacitor is connected by line 170 to the output of NORgate N7. When NORgate N7 went high, approximately 100 microseconds after control line 124 went low, the edge of the high signal passes through capacitor 36 and causes line 169 to go high. This in turn causes ANDgate A1 to go high and changes the state of the latch comprising NORgates N1 and N2. The resulting high on line 155 causes ANDgate A3 to pass a high signal into line 120. The high on line 155 also passes through resistor R97 into the base of transistor T13. The collector of transistor T13 is connected to line 157 which codes the positive light in display DS-1 of FIG. 27.

The high signal on line 120 causes analog switch ASW2 in FIG. 17 to connect the positive reference voltage on line 118 to the negative input of the integrator. This starts the integrator integrating backwards from the unknown voltage Approximately 200 microseconds after the second 100 millisecond pulse passes through the circuit, the edge of the clock signal on line 202 passes through capacitor C35 into line 166. Line 166 is connected to the enabled NANDgate NA2. Since both inputs to NANDgate NA2 are low, the output on line 165 is high. Line 165 is connected to NORgate N6. The output of NORgate N6 is connected to NORgate N5 and the output of NORgate N5 is connected back to NORgate N6 thereby forming a latch. The high into NORgate N6 from line 165 causes a high out of NORgate N5 into line 163 and latches NORgate N6. Line 163 is connected through resistor R95 to line 162. Line 162, which is high, is the start latch signal to the gating circuitry.

When the voltage from the A to D converter passes through the zero crossing, a positive signal appears at line 112. As discussed supra, this causes a low on line 168. Since NANDgate NA1 was previously enabled, a high signal passes into NORgate N4. The output of NORgate N4 is connected to the input of NORgate N3 which is connected back to NORgate N4 by line 159 thereby forming a latch. The high signal from NANDgate NA1 causes the latch to change state leaving a high on line 159. Line 159 goes through resistor R96 into line 156. The high signal on line 156 is the stop latch signal to the gating circuitry.

Figure 38:
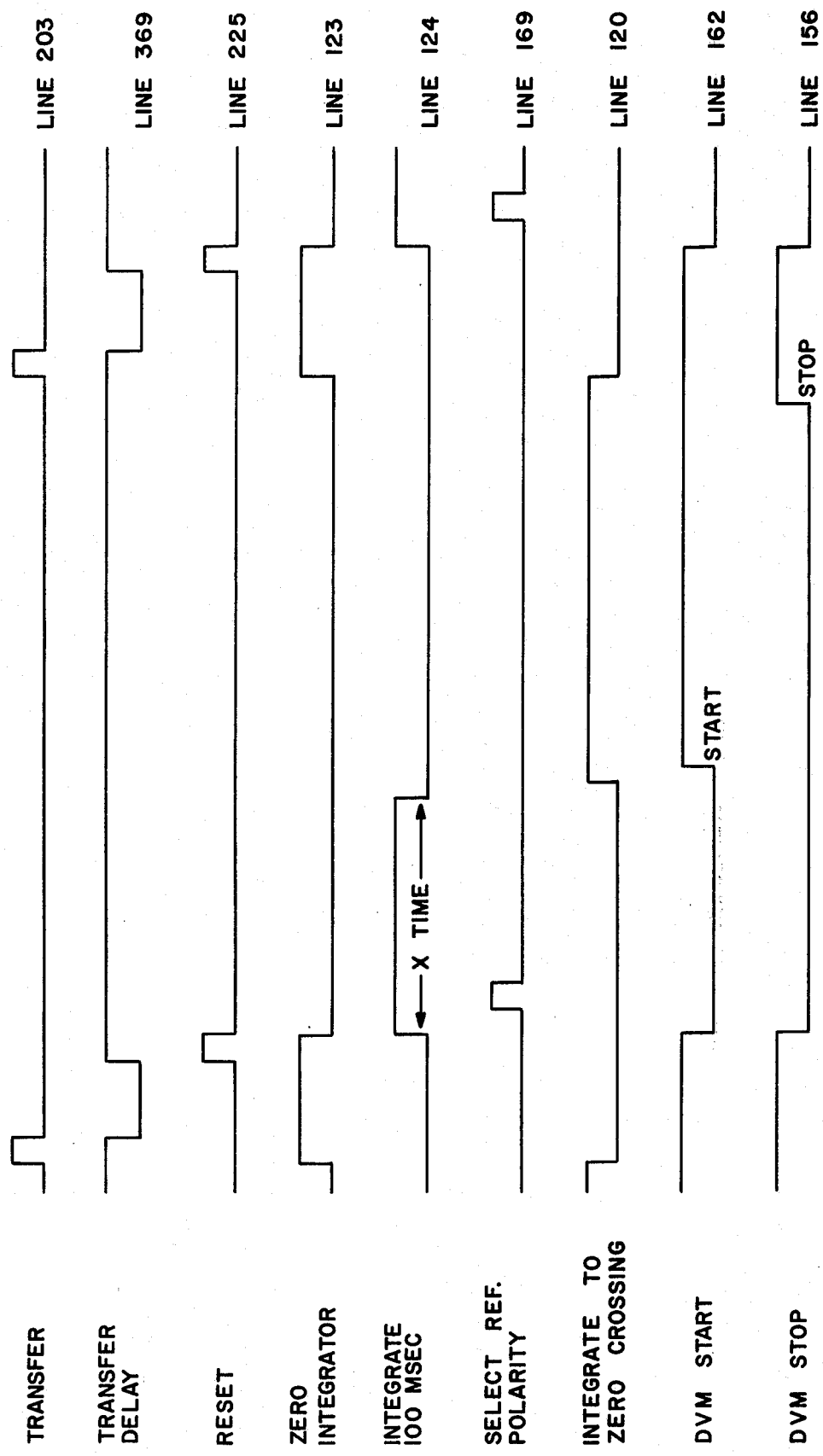
FIG. 38 displays a voltage-time curve for the various control and output signals for the multifunctional circuit analyzer of this invention.

The time/signal relationship developed in this circuitry for the A to D converter is shown in FIG. 38. Thus, at transfer, line 203, the integrator, is zeroed until the reset pulse occurs. Reset is delayed by the transfer delay line 369. At reset, line 225, a signal on line 124 allows the integrator to integrate to the unknown voltage for 100 milliseconds (X-time). At the end of 100 milliseconds, control signal on the line 120 allows the integrater to integrate backwards. the reference polarity selected to integrate backwards is selected by the polarity of line 112 during the positive pulse on line 169. At the same time the integrator is allowed to integrate backwards, a start signal, line 162, is applied to the gating circuitry. The integrator is allowed to integrate backwards until zero voltage crossing at which time a step signal, line 156, is applied to the gating circuit. When transfer occurs, a signal on line 123 zeros the integrator for the next signal The start latch signal on line 162 is connected to ANDgate A8 in FIG. 20. The input to ANDgate A8 is connected to line 231 which is high whenever the high or low level switches are depressed as discussed supra. The output of ANDgate A8 is connected to NORgate N56 by line 237. The output of NORgate N56 is negative. NORgate N56 is connected by line 240 to capacitor C50 in FIG. 21. When the signal line 240 went low, the trailing edge of that signal passes through capacitor C50 causing line 380 to go low. Line 380 is connected to NANDgate NA9. NANDgate NA9 was enabled after the reset signal on line 225 changed the state of latched NORgate N23. The signal passes through NANDgate NA9 into line 382. Line 382 is connected to NORgate N22 and causes the output of NORgate N22 at line 339 at line 339 to become low. The output of NORgate N22 is latched by connecting its output to the input of NORgate N23.

The low in line 339 enters NANDgate NA14 through resistor R26 and grounded capacitor C66, a delay network, at line 340. The other input into NANDgate NA14 is line 341 which was previously enabled after the reset signal on line 225 changed the state of latched NORgate N26. the signal from NANDgate NA14 at line 371 is the gate control signal. Line 371 is also connected through inverter I15 to line 375. This is connected to NORgate N27. The output of NORgate N27 is connected by line 376 and through inverter I17 to line 377. This line is low and activates the gate lamp in FIG. 27. Line 376 is also connected to grounded resistor R128 and through capacitor C52 to inverter I16. The output of inverter I16 is connected by line 373 to the input of NORgate N27. This circuitry provides a time constant for driving the gate lamp after the signal on line 375 ceases.

The output of NORgate N22 at line 339 is also connected to NORgate N24. The output of NORgate N24 is connected through resistor R127 to line 342. Line 342 is connected to a grounded capacitor C51 and to inverter I14. This resistor and capacitor provide a slight delay in the signal to prevent a start and stop on the same edge of the same pulse. This is the latch delay circuit. This delay circuit is bypassed in DVM functions by a low at line 336. Line 336 is connected to inverter I40 in FIG. 19 which is low in this and all DVM functions. The other input to NANDgate NA15 is line 329 which is connected through capacitor C54 to the stop signal on line 245. When the stop signal occurs the edge of the signal on line 245 causes line 329 to go low. When this occurs, the output of NANDgate NA15 on line 344 goes high. Line 344 is connected to NORgate N25. The output of NORgate N25 is line 345 which is connected to NORgate N26. The output of NORgate N26 is connected back to NORgate N25 thereby forming a latch. When line 344 goes high, line 345 goes low and the output of NORgate N26 on line 341 goes high. This high on line 341 disables NANDgate NA14 causing the gating signal on line 371 to go low.

Line 381 went high from the start signal and line 341 went high after the stop signal occured. These two lines are connected to NANDgate NA35. These two highs caused the output of NANDgate NA35 on line 346 to go low. Line 346 is connected to NANDgate NA12. The other side of NANDgate NA12 is connected to the output of NANDgate NA13 through line 357. NANDgate NA13 is connected to the Single Count switch SW24 by line 333. Since the Single Count switch has not been activated, line 333 is high. The other side of NANDgate NA13 is connected to line 231. As discussed supra, line 231 is high whenever the high or low peak voltage switch is activated. Thus, NANDgate NA13 output is low into line 357. Since the two inputs are low, the output of NANDgate NA12 is high. This output is connected through inverter I18 by line 348. Inverter I18 is connected to capacitor C57 by line 349 and to a positive voltage source through resistor R133. The other side of the capacitor C57 is connected to NORgate N30 by line 350. The negative edge of the signal on line 349 passes through capacitor C57 into line 350. This negative edge passes through NORgate N30 causing line 354 to become high. The positive signal on line 354 passes through capacitor C61 through ORgate 07 and into inverter I19. The output of inverter I19, which is a low pulse, is connected back to NORgate N30 by line 351. This maintains NORgate N30 enabled until the capacitor C61 is discharged through resistor R136. This provides a square pulse at the output of inverter I19 on line 351. The duration of this pulse is determined by the time constant of capacitor C61 and resistor R136. For purposes of illustration, the capacitance is selected so that a square pulse of approximately 5 microseconds in duration is provided on line 354. This line is also connected through resistor R141 into ORgate 09. ORgate 09 is connected to the base of transistor T14. The high signal on line 354 causes transistor T14 to conduct. During the time that transistor T14 is being driven by the output of ORgate 09, line 366, which is connected to the collector of transistor T14, is low. Line 366 is connected through inverter I22 to line 203. Line 203 is the transfer line.

Other things can cause a transfer signal to occur. For example, when the circuit is turned on, a positive pulse is applied to NORgate N31 from capacitor C58 and grounded resistor R143. The output of NORgate N31 which is driven low, is connected through diode D20 to line 359 and grounded capacitor C60. Line 359 is connected through ORgate 08 to inverter I23. The output of inverter I23 on line 353 is high and is connected through resistor R136 to ORgate 07. A high at the output of ORgate 07 causes a low at the input of NORgate N30. This causes a transfer signal to occur as discussed supra.

The other side of NORgate N31 is line 356 which is connected to grounded capacitor C59, grounded resistor R144 and diode D21. Diode D21 is connected by line 334 through resistor R145 to a positive source and to ground through the function switches SW14 through SW26 in FIG. 33. When any one of the switcheds are activated, line 334 momentarily goes high. This signal passes through NORgate N31 and causes a transfer signal to occur.

A transfer signal also occurs when the manual reset switch is activated at line 331 or when the High and Low level switches are activated at line 332. When the manual reset switch is depressed, line 331 becomes positive which causes the output of NORgate N29 to become low. The negative edge of this signal passes through capacitor C49 and causes a transfer signal to occur. When either the High or Low level switch is depressed, line 332 becomes high. The positive edge of this high signal passes through capacitor C56 into NORgate N29. The negative edge from the output of NORgate N29 passes through capacitor C49 and causes a transfer signal to occur.

The negative square pulse of approximately 5 microseconds in duration in line 351 is connected to capacitor C62. This capacitor allows the trailing edge of the signal to go into line 361. Line 361 is connected to NORgates N32 and N33. The reason the leading edge of the pulse did not pass through capacitor C62 and activate NORgates N32 and N33, is that line 361 is tied through resistor R139 to ground. This prohibits the voltage in line 361 from meeting the activating voltage of the NORgates. Hence, only the trailing edge has sufficient voltage to activate NORgates N32 and N33. The output of NORgate N32 is connected through capacitor C63 to line 363. Line 363 is connected to a positive voltage source through resistor R137 and to inverter I20. Inverter I20 is connected by line 362 to ANDgate A36 and back to the other input of NORgate N32. This circuitry provides a square pulse during the period that capacitor C63 is discharging. The capacitance in capacitor C63 and the resistance in resistor R137 are selected so that the square pulse has a duration of approximately 150 milliseconds.

NORgate N33 is connected through capacitor C64 to line 364. Line 364 is connected through resistor R112 to a positive voltage source and to inverter I21. The output of inverter I21 is connected to ANDgate A35 by line 365. Line 365 is also connected back to the input of NORgate N33. This provides a square pulse at line 365 during discharge of capacitor C64. The capacitance of capacitor C64 and resistance of resistor R112 are selected so that the square pulse has a duration of approximately 5 microseconds. ANDgate A36 is connected by line 335 to an auxiliary terminal. This line is always high unless auxiliary equipment is employed. ANDgate A35 is connected to the decoded counter function discussed previously. The outputs of ANDgates A35 and A36 are connected to NORgate N34 by lines 367 and 368 respectively. The negative signal from NORgate N34 goes via line 369 into capacitor C65. The trailing edge of this passes through capacitor C65 into line 370. Line 370 is connected to a grounded resistor R146 and grounded diode D22. Line 370 is also connected through buffer amplifier BA6 to line 225. The square pulse signal in line 225 is the reset signal.

Figure 22:
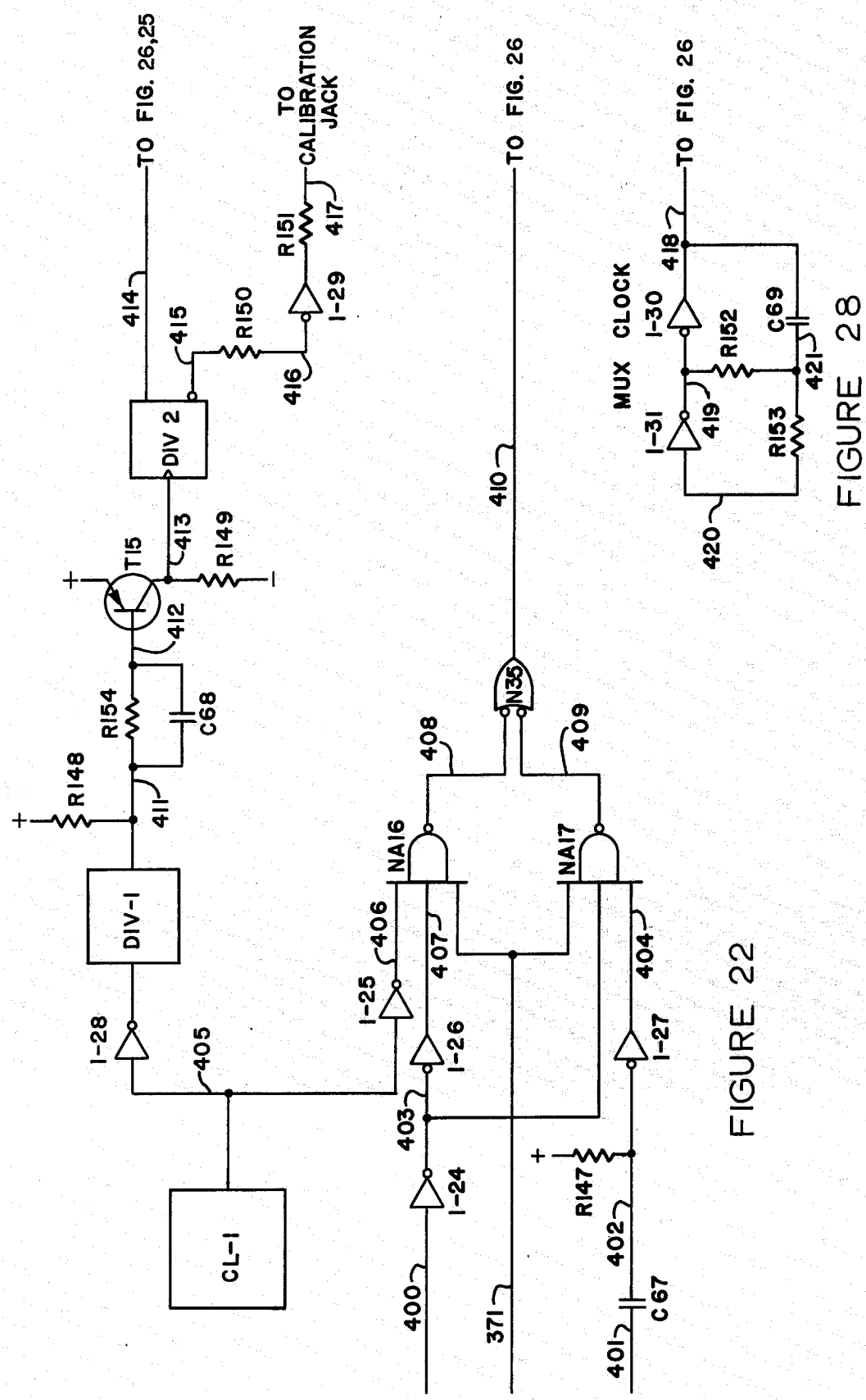
FIG. 22 depicts a schematic representation of the gate circuitry and the time base generator circuitry.

The gate signal on line 371 goes into NANDgates NA16 and NA17 in FIG. 22. The other side of NANDgate NA16 is connected by line 406 through inverter I25 to a clock signal. For purposes of illustration only, clock CL1 has a frequency of ten megahertz. The third input to NANDgate NA16 is line 407. The digital signal in this line is controlled by the logic circuit and function switches. In order to determine the high or low state of the signal on line 407, the effect of the switches on the logic circuit must be analyzed.

Figure 23:
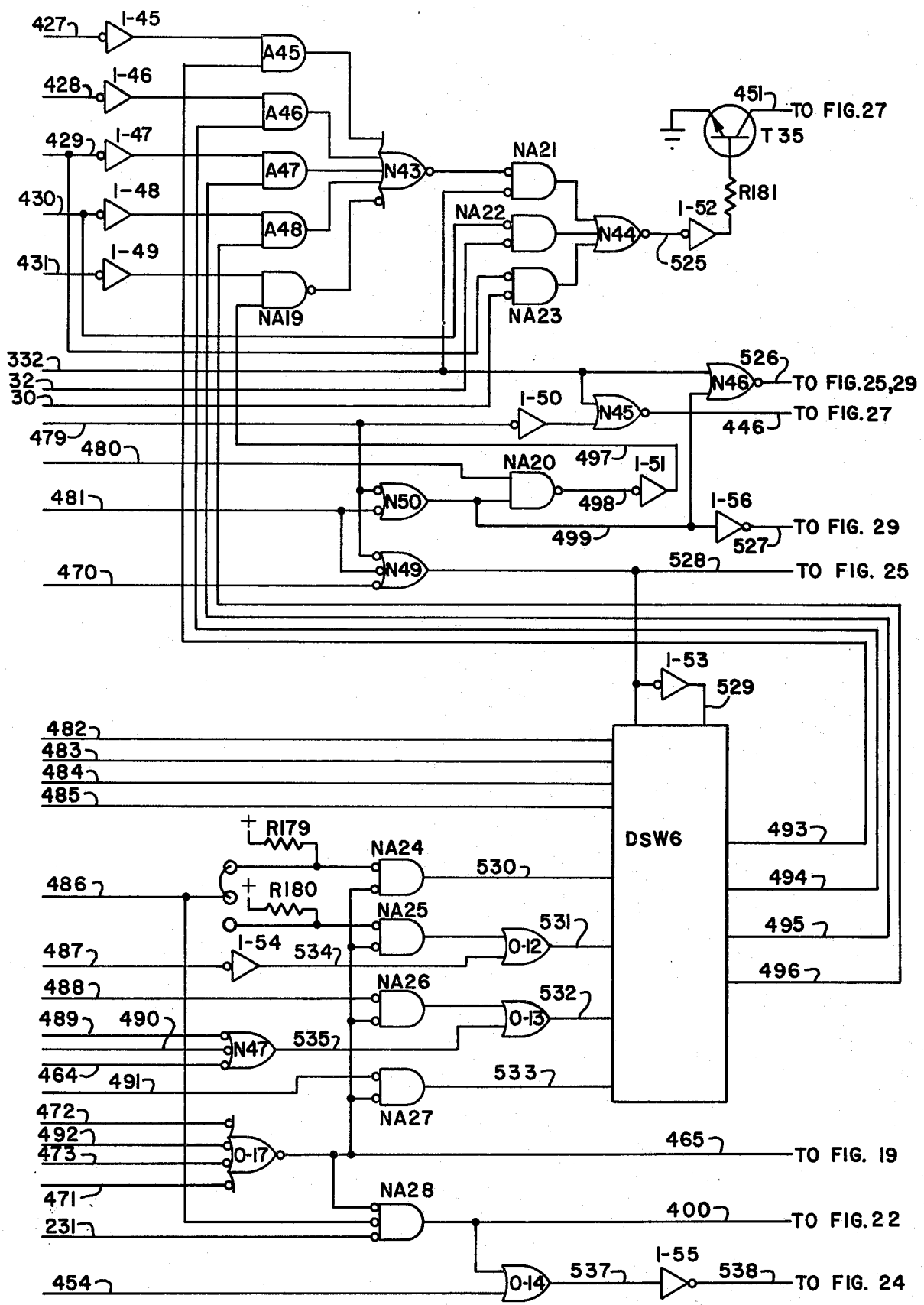
FIG. 23 depicts a schematic representation of the logic circuitry.

Referring now to FIG. 23, ORgate O-17 is connected by lines 472, 492, 471 and 473 to coincidence B and C switch SW26, interval B to C switch SW25, Width switch SW21, and Slope switch SW22 respectively. Since none of these switches have been selected, the output of ORgate O-17 is high. ORgate O-17 is connected to NANDgate NA28 by line 465. The other input to NANDgate NA28 is line 231. As previously discussed, line 231 is high when the High or Low peak switch has been activated. Line 486 may be high or low as selected by S10 in FIG. 36. Therefore, the output of NANDgate NA28 is low. This output is connected by line 400 to inverter I24 in FIG. 22. Inverter I24 is connected by line 403 to inverter I26 and to NANDgate NA17 by line 407. Inverter I26 is connected to NANDgate NA16 by line 407. Since line 400 is low, line 407 is low and disables NANDgate NA16. The high on line 403 enables NANDgate NA17. The third input to NANDgate NA17 is line 404 which is the count signal. To determine which count signal will be coming in at line 404, the mode switching logic must be determined.

As discussed supra, the output of NANDgate NA28 on line 400 of FIG. 23 is low. This line is connected to ORgate O-14. ORgate O-14 is connected to inverter I55 at line 537. Inverter I55 in turn is connected to ANDgate A70 in FIG. 24 by line 538. The high signal in line 538 enables ANDgate A70. The other input to ANDgate A70 is the clock signal in line 579. Line 579 is connected to the data select switch DSW10 in FIG. 25. Data select switch DSW10 is connected to a 100 microsecond pulse source from divider DIV7 by line 571. The switch is also connected to a 2 microsecond pulse source from divider DIV8 by line 570. Data select switch DSW10 is also connected to a one microsecond pulse source by line 414. The particular clock selected will depend upon the coded input on lines 568 and 569 to data select switch DSW10. Line 568 is the output from buffer amplifier BA17 which is connected to analog switch ASW3. Line 569 is connected to the output of buffer amplifier BA18 which is connected to a different terminal in analog switch ASW3.

Analog switch ASW3 is controlled by the function and mode switching logic. When the high or low peak switches are activated, line 332 becomes high. This causes the output of NORgate N46 in FIG. 23 to become low. The output of NORgate N46 is connected by line 526 to ANDgate A50 in FIG. 25. The output of ANDgate A50, which is low, is connected by line 566 to control terminals of analog select switch ASW3 and through inverter I71 to line 567. Line 567 is connected to other control terminals of analog switch ASW3. Since the signal in line 567 is high, the analog switch ASW3 connects line 564 with line 569 and line 565 with line 568. Line 565 is connected to the output of NANDgate NA31. Line 564 is connected to the output of NANDgate NA30. NANDgate NA31 is connected to line 231. This line is high when the High or Low peak switch is depressed. This disables NANDgate NA31 and causes line 565 to be low. NANDgate NA30 is connected by line 563 to inverter I70. The other side of I70 is connected to line 231. Thus, line 563 is low and enables NANDgate NA30. The other side of NANDgate NA30 is connected by line 539 to inverter I60. Inverter I60 is connected to line 526 which is low whenever the High or Low peak switch is activated. This causes line 539 to be high and disables NANDgate NA30. The low output in lines 564 and 565 codes the data select switch DSW10 to connect line 579 to line 414. Line 579 carrying the one microsecond clock signal enters NANDgate NA70 in FIG. 24.

The one microsecond pulses on line 579 passes through ANDgate A70 and into NORgate N52. NORgate N52 is connected by line 589 to inverter I76. The output of inverter I76 is connected to line 590 which goes to an auxiliary jack. The signal in line 589 goes through resistor R195 into line 401. Line 401 is the count signal which goes into capacitor C67 in FIG. 22. The edge of each pulse passes through capacitor C67 into inverter I27 at line 402. The output of inverter I27 goes to NANDgate NA17 by line 404. NANDgate NA17 was previously armed when the gate signal appeared in line 371. The clock signal from NANDgate NA17 goes through line 409 into NORgate N35. The output of NORgate N35 is connected by line 410 to buffer amplifier BA7 in FIG. 26. The output of buffer amplifier BA7 is connected to counter CO1 by line 422. The signal pulse in line 422 is counted by counter CO1 with every 10th pulse carrying into counter CO2 by line 436. Every 100th pulse goes from counter CO2 into counter CO3 by line 437. Every 1000th pulse goes through counter CO3 into counter CO4 by line 438. Every 10,000th pulse goes from counter CO4 to counter CO5 by line 439. Every 100,000th pulse goes through counter CO5 and enters capacitor C71 at line 440. The edge of this signal passes into latch L4. Line 440 also takes the signal of every 100,000th pulse through inverter I90 into divider DIV9. When the first 100,000th pulse occurs, latch L4 provides a high in line 542. This high is the $1 \times 10^5$ carry signal. When the second 100,000th pulse occurs, DIV9 sends a low signal through line 442 to capacitor C72. Capacitor C72 allows the leading edge of the pulse to go into latch L3. When this occurs, the output of latch L3 goes high in line 540. This high is the $2 \times 10^5$ carry signal. Line 439 which is connected to counter CO4 is also connected to capacitor C70. The other side of capacitor C70 is connected to latch L5. If a 10,000th pulse occurs, the edge of the pulse passes through capacitor C70 into latch L5. This causes the output of latch L5 in line 541 to go high. This high is the $1 \times 10^4$ carry signal.

The counter continues counting until the gate signal in line 371 of FIG. 22 ceases. At this time the count signal no longer passes through NAND gate NA17, and counters CO1 through CO5 cease counting. The next event that occurs is a transfer signal in line 203. This signal passes through resistor R157 into transistor T17 of FIG. 26. This causes transistor T17 to stop conducting. The collector of transistor T17 is connected to tristate latches, LT1 through LT5 by line 426. The signal in line 426 causes the tristate latches LT1 through LT5 to transfer the information from the counters CO1 through CO5. Line 426 is also connected to tristate inverters IT1 and IT2. At transfer, the signals from DIV9 are then allowed to pass through the tristate inverters into latch L2. A low signal in line 442 and a high in line 441 corresponds to a $2 \times 10^5$ carry. This passes into latch L2, and causes the output of latch L2 to go positive. The output of latch L2 goes through buffer amplifier BA28 into line 450. Line 450 goes into transistor T34 in FIG. 27. A high signal in line 450 causes transistor T34 to conduct. Since the collector of transistor T34 is connected to display DS1, it causes the display to light the digit one.

After the information has been transferred from counters CO1 through CO5 to the tristate latches LT1 through LT5, a reset signal in line 225 occurs. The signal passes through resistor R155 into the base of transistor T16. This causes transistor T16 to stop conducting. The collector of transistor T16 is connected by line 423 to inverter I33. The output of inverter I33 is high when a reset signal occurs. Inverter I33 is connected by line 424 to counters CO1 through CO5, to DIV9 and through inverter I34 to latches L3, L4 and L5. The reset signal causes the counters to reset to zero and also causes DIV9, L3, L4 and L5 to reset.

The information stored in tristate latches LT1 through LT5 is transferred to the display board by multiplexing. The multiplexing clock is illustrated in FIG. 28. The clock comprises inverter I31 connected to inverter I30 by line 419. The output of inverter I30 is connected through capacitor C69 by line 418. Capacitor C69 is connected to resistor R153 by line 421. Resistor R153 is connected to the input of inverter I31. Line 421 is also connected to the output of inverter I31 through resistor R152. The values of the capacitance in capacitor C69 and the resistance in resistor R152 are selected so that the output in line 418 is a clock signal of approximately 50 kilo hertz.

Figure 26:
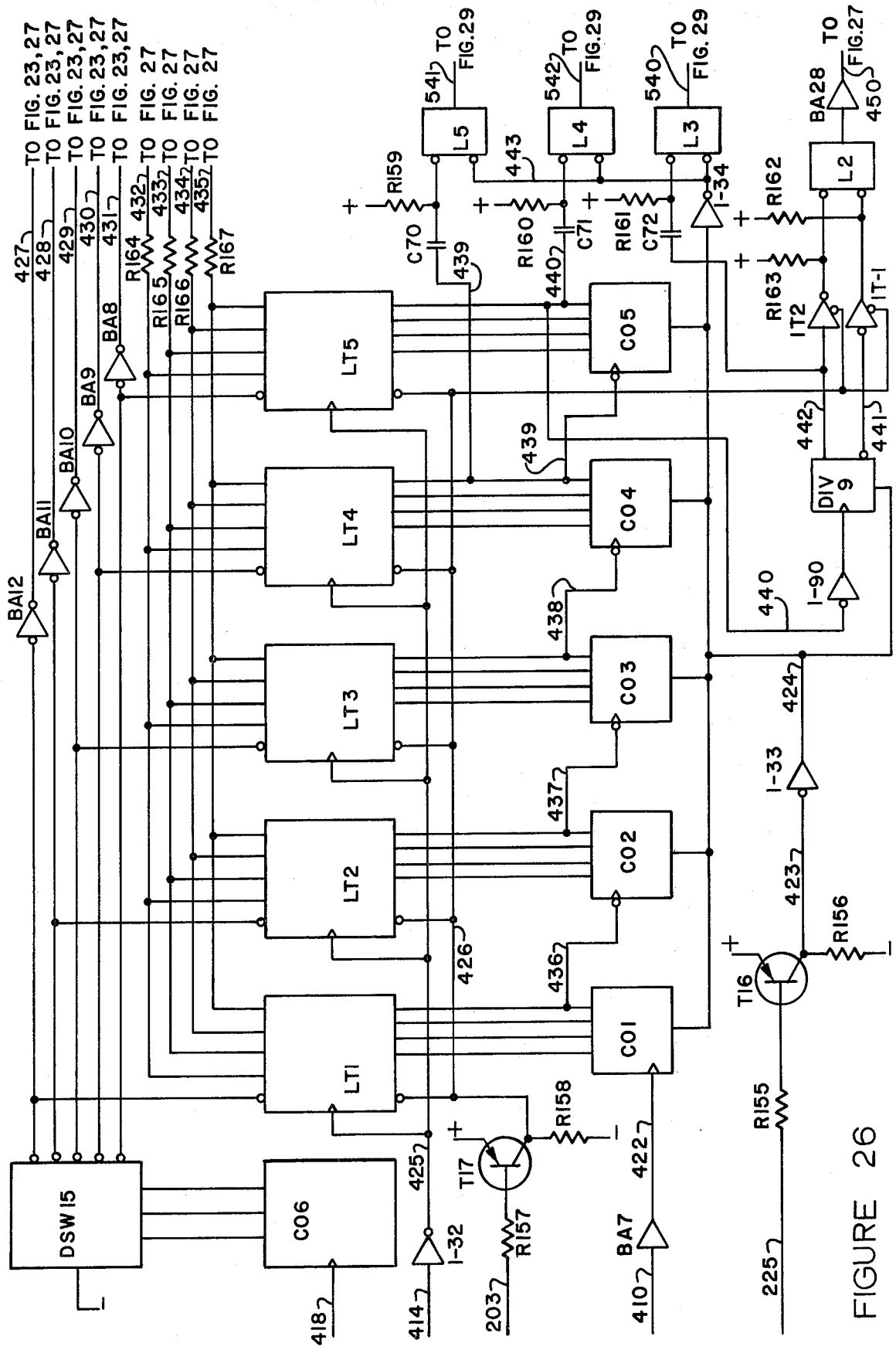
FIG. 26 depicts a schematic representation of the counter and decoder circuitry.

This 50 kilo hertz signal in line 418 is connected to binary counter CO6 in FIG. 26. The output of counter CO6 is connected to multiplexing data select switch DSW15. This data select switch sequentially connects a negative voltage source with lines 427, 428, 429, 430 and 431 through buffer amplifiers BA12, BA11, BA10, BA9 and BA8 respectively. When line 427 is low, the information in tristate latch LT1 is taken through resistor R164 to line 432, through resistor R165 to line 433, through resistor R166 to line 434, and through resistor R167 to line 435. When line 428 goes negative, the information from LT2 is transferred to lines 432 through 435. When line 429 goes negative the information is taken from LT3 into lines 432 through 435. When line 430 goes negative, the information from LT4 is transferred to lines 432 through 435. Finally, when line 431 goes negative, the information from LT5 is transferred to lines 432 through 435.

Figure 27:
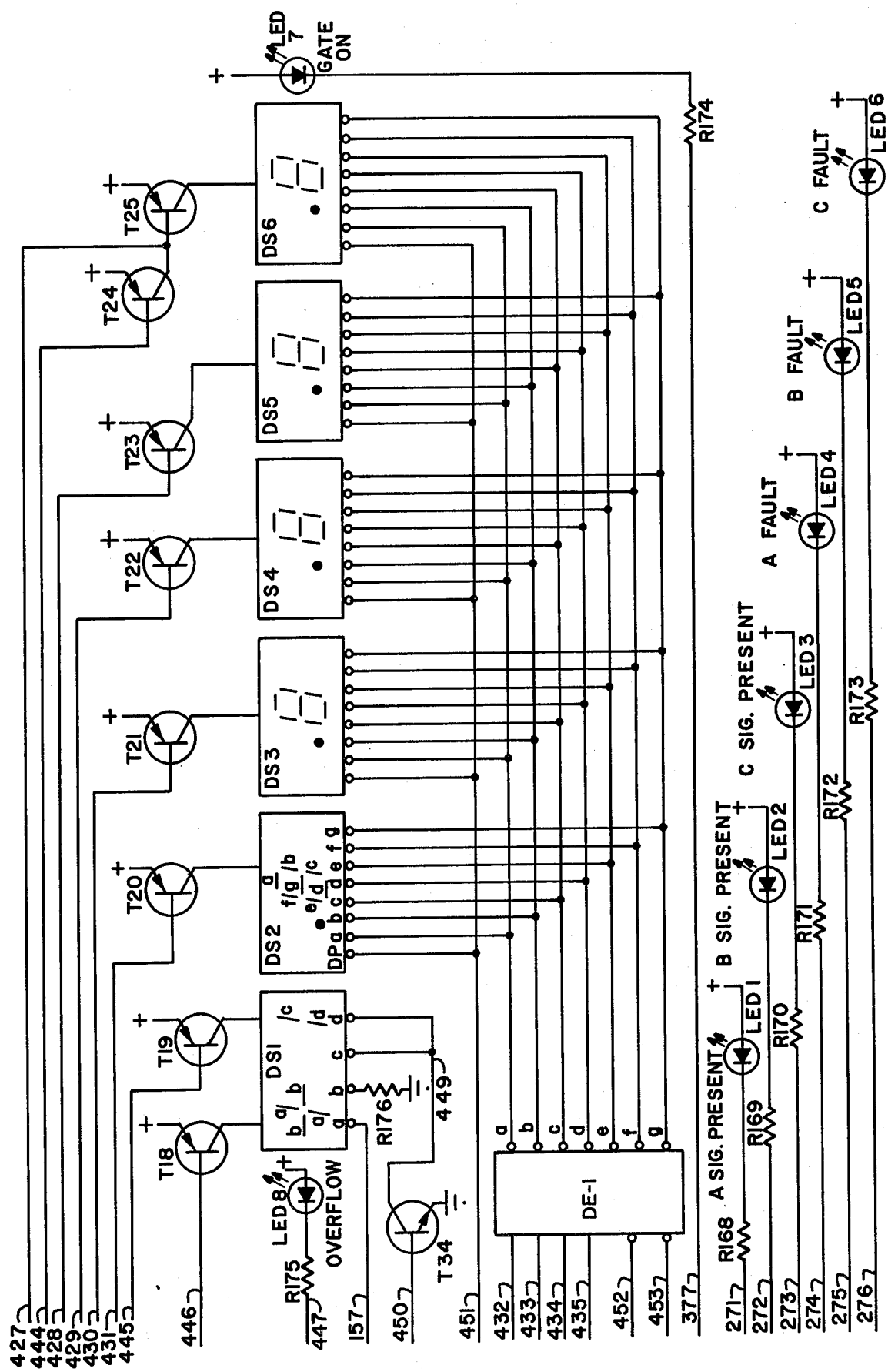
FIG. 27 depicts a schematic representation of the display circuitry.

The coded information in lines 432 through 435 go into 4 to 7 line decoder DE1 in FIG. 27. The coded lines 432 through 435 are connected to appropriate lines $a$ through $g$ in the output of 4 to 7 line decoder DE1 to a positive voltage source through 7 line displays DS2 through DS6. Lines $a$ through $g$ go to each of the five displays DS2 through DS6. The signal in lines $a$ through $g$ control the seven segment display lights as shown as $a$ through $g$ in FIG. 27. Thus, if line $b$ and line $c$ are negative, the displays DS2 through DS6 light the digit one. Display DS2 is lit when a negative signal appears in line 431. This negative signal causes transistor T20 to conduct. The collector of transistor T20 is connected to display DS2 and lights the coded signals for visual observation. Line 430 is connected to the base of transistor T21 and its collector is connected to display DS3. Line 429 is connected to the base of transistor T22 and its collector is connected to display DS4. Line 428 is connected to the base of transistor T23 and its collector is connected to display DS5. Line 427 is connected to the base of transistor T25 and its collector is connected to the display DS6. The multiplexing signals cause displays DS2 through DS6 to light sequentially. However, since each display is let every 100 microseconds, it appears to the eye of the observer that all of the displays are lit at the same time.

Figure 29:
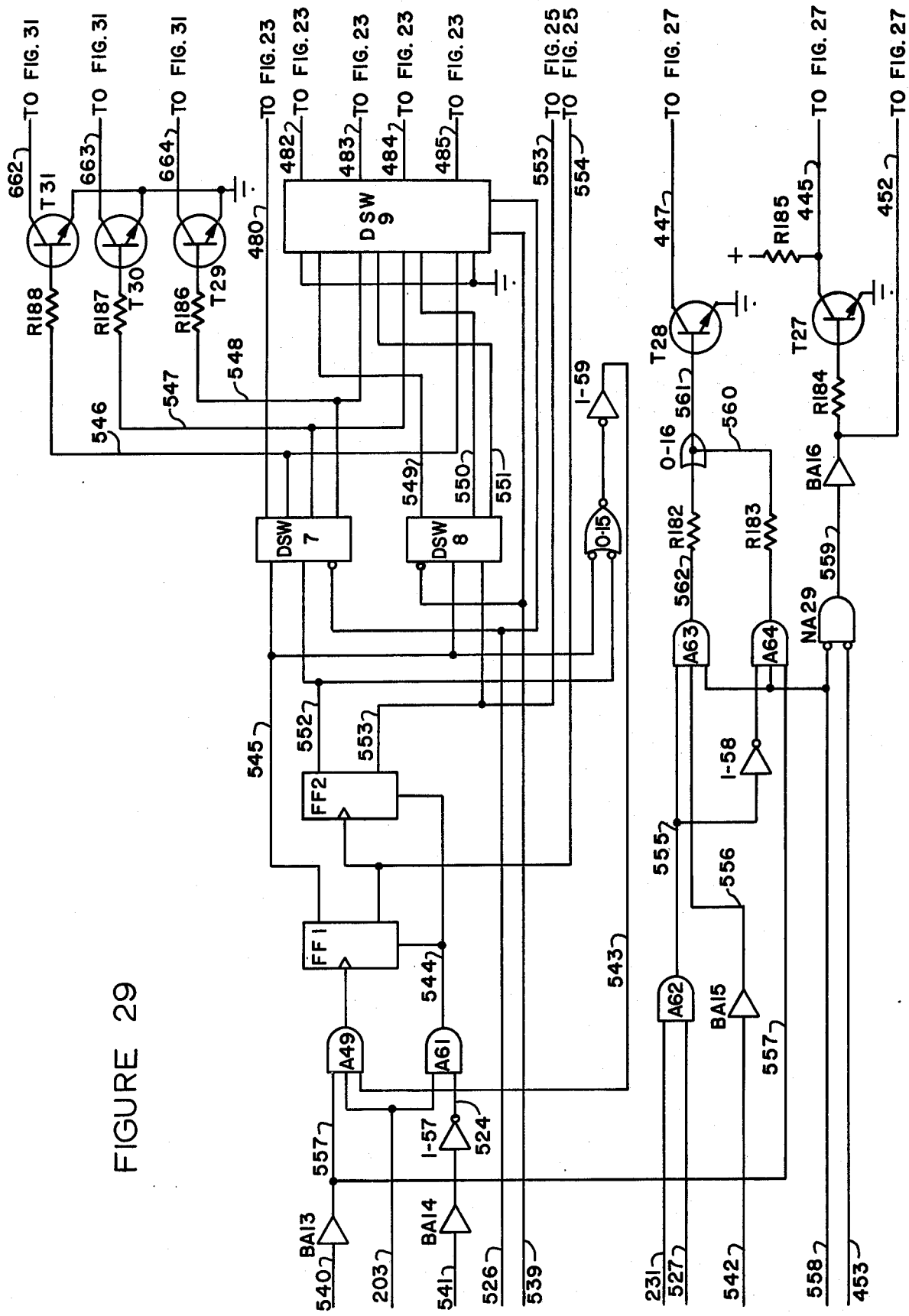
FIG. 29 depicts a schematic representation of the auto-ranging circuitry.

When a $1 \times 10^5$ carry signal in line 542 occurs, it goes through buffer amplifier BA15 into line 556 in FIG. 29. Line 556 is connected to ANDgate A63. Another input to ANDgate A63 is line 558. Line 558 comes from divider DIV6 in FIG. 25. The signal in line 558 is high for 200 milliseconds and low for 800 milliseconds. The third input to ANDgate A63 is line 555. Line 555 is connected to the output of ANDgate A62. One input to ANDgate A62 is line 231. This line is high when the High or Low peak switch is depressed. The other input to ANDgate A62 is line 527. Line 527 is from inverter I56 as shown in FIG. 23. Inverter I56 is connected to NORgate N50 through line 499. NORgate N50 is connected to the AC function switch SW18 through line 481. Since this switch has not been activated, line 481 is high. The other input to NORgate N50 is line 479. Line 479 goes to the DC voltage switch SW17. Since this switch has not been activated, line 479 is also high. This provides a low in line 499 and a high in line 527. Thus, line 555 is high in FIG. 29. Because all three inputs to ANDgate A63 are high, the output in line 562 is pulsed high due to line 558. Line 562 connected through resistor R182 to ORgate O-16. ORgate O-16 is connected to the base of transistor T28. Since line 561 is pulse high, transistor T28 conducts causing collector at line 447 to become pulsed low. Line 447 is connected through resistor R175 to light emitting diode LED8 in FIG. 27. This diode is the overflow lamp. Thus, when a $1 \times 10^5$ carry signal occurs, the overflow lamp goes on for a period of 200 milliseconds and off for a period of 800 milliseconds.

The following discussion is directed to determining where the decimal point in the display will be located. When the High or Low Level peak switch SW10 or SW11 is activated, line 332 becomes high. This line is connected to NANDgate NA21 in FIG. 23 and disables that NANDgate. The input signal at line 1 in FIG. 13 goes through switch SW1, which is a three position switch. When the switch is in the three volt range, line 32 is connected to line 31. Line 31 is connected to the A peak switch SW7 in FIG. 15. Since the A peak switch has been activated, line 31 is connected to the ground. This makes line 32 low. Line 32 is connected to NANDgate NA22 in FIG. 23. The other side of NANDgate NA22 is connected to line 430 (FIG. 23). When line 430 from the multiplexing data switch DSW15 goes low, a signal passes through NANDgate NA22 into NORgate N44. The output of NORgate N44 is connected by line 525 to inverter I52. The output of inverter I52 is connected through resistor R181 to the base of transistor T35. The signal in line 430 causes transistor T35 to conduct, thereby pulling its collector low. The collector of transistor T35 is connected by line 451 to the decimal point control terminal in displays DS2 through DS6 in FIG. 27. A negative pulse in line 430 turns on transistor T21 causing display DS3 to light. This lights the decimal point in display DS3.

If a 30 volt signal is connected to the input of A channel, the counter circuit will have a $1 + 10^5$ carry signal. This causes the overflow lamp LED8 in FIG. 27 to light. The switch SW2 in FIG. 13 would then be moved to the 30 volt position. This will cause line 30 to become low. Line 30 is connected to NANDgate NA23 in FIG. 23. The other side of NANDgate NA23 is line 429. When a negative signal from line 429 occurs, the output of NANDgate NA23 will go high. NANDgate NA23 is connected to NORgate N44 and to the decimal multiplexing line 451. When a signal occurs in line 429, transistor T22 in FIG. 27 causes display DS4 to light. The signal in line 451, at that time, would cause the decimal point to light in display DS4.

Determination of the high and low peak voltages in channels B and C function essentially the same as that in channel A. In channel B, the signal comes in through fuse F3 to switch SW27 by line 623 in FIG. 30. If the switch is in the 3 volt position, the signal passes through switch SW11 into line 626. Line 626 is connected to the bottom gang of switch SW27 which is connected to line 621. Line 621 is connected to a high impedance buffer amplifier HBA2. High impedance buffer amplifier HBA2 has essentially the same circuitry as the buffer amplifier shown in FIG. 14 for the A channel. Line 605 goes into the B peak switch SW8 in FIG. 15. When the B peak switch is activated, the incoming signal passes into line 53 of switch SW7. Since switch SW7 has not been activated, the signal passes into line 53. From this point, the signal in B channel is processed in the same manner as the signal in A channel.

Figure 30:
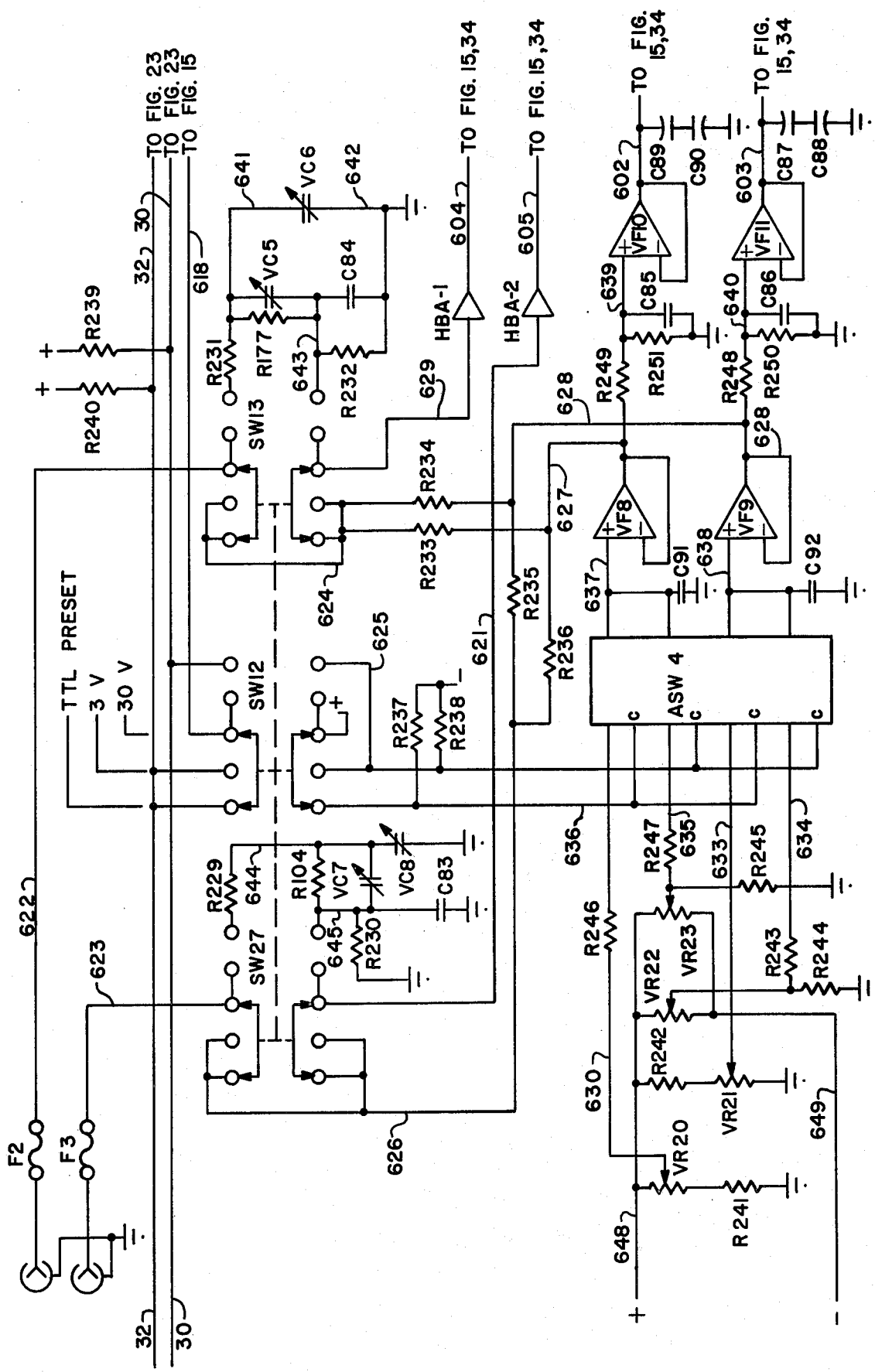
FIG. 30 depicts a schematic representation of the high and low threshold setting circuitry for B and C channels.

If switch SW11 in FIG. 30 is thrown into the 30 volt position, the signal from line 623 passes through resistor R229 into line 644. Line 644 is connected to line 645 through resistor R104 and variable capacitor VC7. Line 645 is also connected to grounded resistor R230 and grounded capacitor C83. The resistor R104, R23, capacitor C83 and variable capacitor VC7 provides a 10 fold attenuation of the amplitude of the input signal. Line 645 is connected through switch SW27 to line 621. The signal on line 621 is then processed in the same manner as the three volt signal.

When the switch SW12 in FIG. 30 is in the three volt position, line 618 is connected to line 32. When switch SW12 is in the 30 volt position, line 618 is connected to line 30. Line 618 is connected to the B and C peak switches SW8 and SW9 in FIG. 15. When either the B or C peak switch SW8 or SW9 is depressed, line 618 becomes low. A low on line 618 causes either line 30 or line 32 to become low as selected by switch SW12 in FIG. 30. Lines 30 and 32 go to NANDgates NA23 and NA22 respectively in FIG. 23. A low on lines 30 or 32 sets the location of the decimal point in the display in the same manner as the signal in A channel.

In C channel, the signal enters through fuse F2 to switch SW13 by line 622. If the switch is in the 3 volt position, the signal passes through switch SW13 into line 624. Line 624 is connected to the bottom gang of switch SW13 and permits the signal to enter line 629. Line 629 is connected through high impedance buffer amplifier HBA-1 to line 604. HBA1 and HBA2 are essentially the same. Line 604 is connected to C peak switch SW9 in FIG. 15. When this switch is activated, the signal passes through switches SW8 and SW7 into line 53. From this point, the signal in B channel is processed in the same manner as the signal in A channel.

AC VOLTS MEASUREMENT

Figure 31:
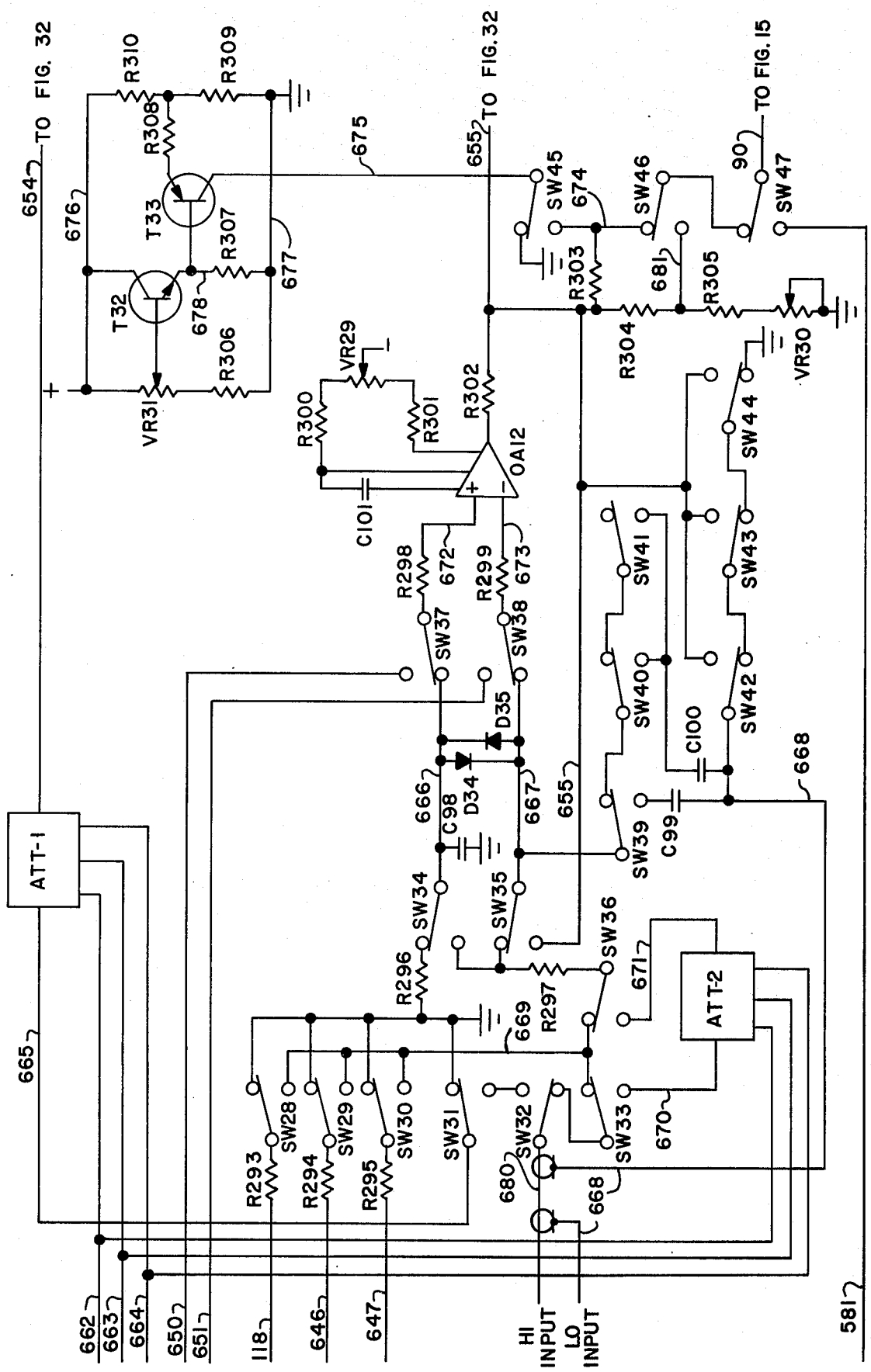
FIG. 31 depicts a schematic representation of the DVM converter circuitry.

When an unknown AC voltage is measured, the high input enters the circuit at line 680, FIG. 31, and goes through switch SW32 and switch SW14 into line 665. Line 665 goes into $\times 1$, $\times 10$, $\times 100$ and $\times 1000$, attenuator, ANT-1. The attenuated signal then passes through line 654 into resistor R267 in FIG. 32. Line 654 is connected to grounded variable capacitor VC9 and to grounded capacitor C95 (frequency compensation for ATT-1). Resistor R267 is connected to the positive input of operational amplifier OA11. The output of operatonal amplifier OA11 is connected to diodes D29 and D28 by line 652. Whenever the signal in line 652 goes positive, the positive half wave passes through diode D28 into line 599. The positive signal on line 599 passes through resistor R269 into line 653. Line 653 is connected back through resistor R269 into line 653. Line 653 is connected back through resistor R268 to the negative terminal of operational amplifier OA11. Line 653 is also connected to grounded resistor R276. In one embodiment, the resistance in resistor R269 is equal to the resistance in resistor R276. This renders the gain in operational amplifier OA11 twice the amplitude of the input signal at line 654. Line 599 is also connected through resistor R270 to line 650. Line 650 is connected to grounded resistor R273 and grounded capacitor C96. The positive portion of the signal going through diode D28 into line 650 is averaged by capacitor C96 and resistor R270 to provide a constant DC voltage in line 650. Since the positive half wave signal going through diode D28 was amplified by a fixed gain, the averaged voltage in line 650 is directly proportional to the average AC voltage in line 654.

The negative half wave on line 652 passes through diode D29 into line 598. Line 598 is connected through resistor R271 to line 653. Because the resistance in resistor R271 is equal to the resistance in R276, the gain in the operational amplifier is set at two. The negative wave on line 598 goes through resistor R272 into line 651. Line 651 is connected through capacitor C97 and through resistor R274 to line 661. Line 661 is connected through resistor R277 to grounded variable resistor VR26. Because of the capacitance in capacitor C97, the negative half wave is averaged into a constant DC voltage. This DC voltage is proportional to the average AC voltage on line 654.

The average positive DC voltage on line 650 goes to switch SW37 and through resistor R298 to line 672 in FIG. 31. Line 672 is connected to the positive input of operational amplifier OA12. The negative DC voltage on line 651 goes to switch SW38 through resistor R299 to line 673. Line 673 is connected to the negative input of operational amplifier OA12. The output of operational amplifier OA12 goes through resistor R302 into line 655. Line 655 is connected to line 661 through resistor R275 in FIG. 32. Line 661 goes through resistor R277 and through variable resistor VR26 to ground. This variable resistor VR26 can be adjusted so that the output of operational amplifier OA12 can be made directly proportional to the root mean square of the input AC voltage. The signal on line 655 also goes through resistor R303 into line 674. Line 674 is connected through switch SW46 and SW47 to line 90. Line 90 is connected through switch SW11 and SW10 to line 87 in FIG. 15. Line 87 goes to the analog to digital converter as shown in FIG. 17. The processing of this signal through the A to D converter and through the latching and gating circuitry is the same as for the high or low peak voltages.

Figure 33:
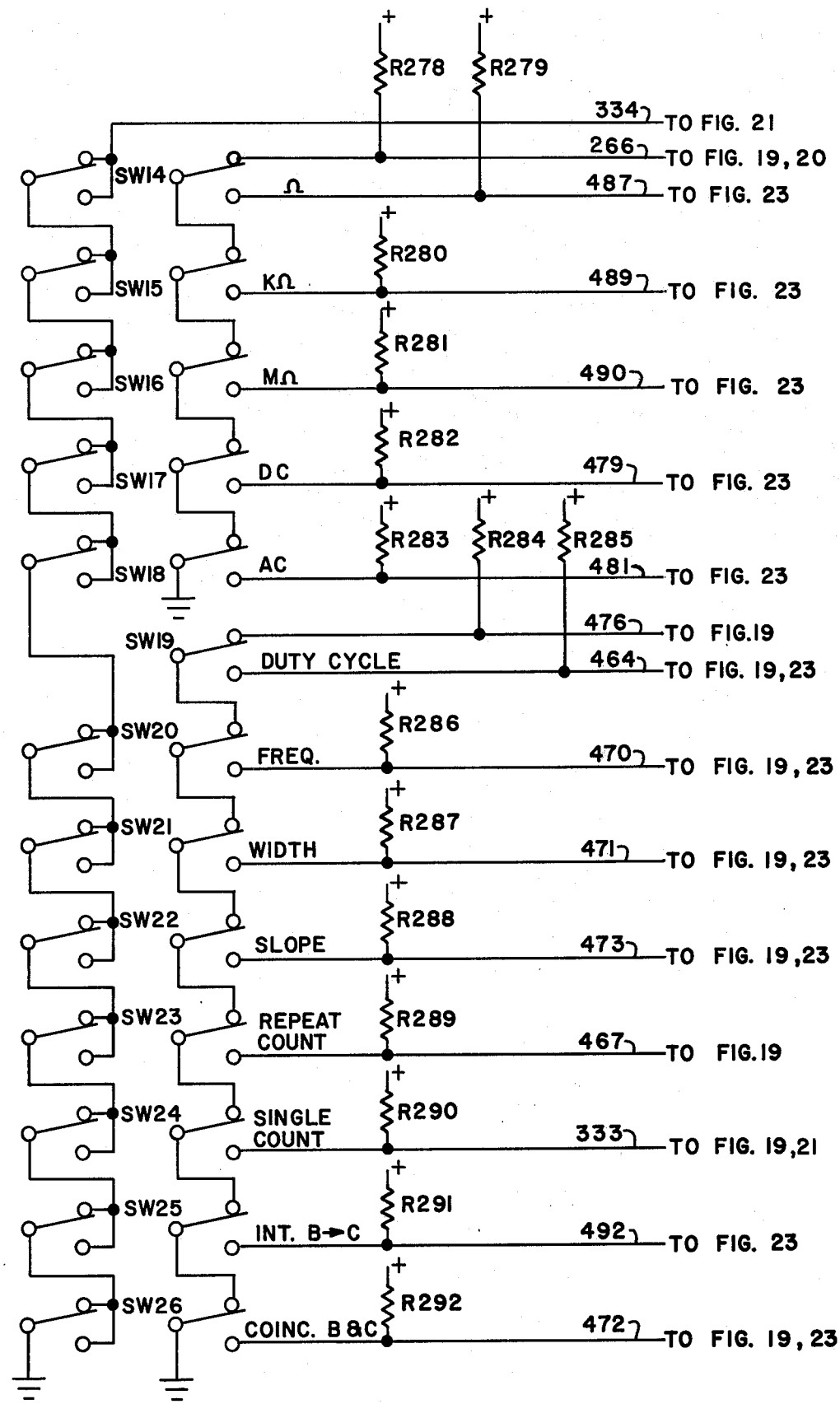
FIG. 33 depicts a schematic representation of the function switching circuitry.

The particular clock signal which is counted is controlled by the function switches. Accordingly, switch SW18 in FIG. 33 is activated. This causes line 481 to go low. At the same time this causes line 266 from switch SW14 to become high: Line 266 is connected through inverter I38 to line 462 in FIG. 19. Line 462 is connected to the input of NORgate N36. Since line 266 went high, line 462 went low. Therefore, the output of NORgate N36 into line 475 is high. This makes the signal on line 231 high. This high online 231 disables NANDgate NA31 and enables NANDgate NA30 in FIG. 25.

Line 481, which is low from switch SW18 in FIG. 33, is connected to NORgates N49 and N50 in FIG. 23. NORgate N49 is connected to NANDgate NA30 by line 528 in FIG. 25. The low on line 481 causes line 528 to become high and enables ANDgate A50. The output of NORgate N50 is high and is connected to NORgate N46 in FIG. 23. NORgate N46 is connected to the other side of ANDgate A50 by line 526 in FIG. 25. Since line 526 is low, it disables ANDgate A50 and causes analog switch ASW3 to connect line 565 with line 568 and line 564 with line 569. The low on line 526 causes line 539 to go high and disables NANDgate NA30. Thus, the outputs of NANDgate NA30 and NANDgate NA31 are low. This codes data select switch DSW10 to connect line 579 with the one microsecond clock, line 414. This is the same clock as used in the High or Low peak detection.

When the gate signal goes high at line 371 in FIG. 22, NANDgate NA17 is enabled. This allows NANDgate NA17 to pass the positive pulses from the one microsecond clock to the couters. The third terminal at NANDgate NA17 was high since the high in line 231 disabled NANDgate NA17 was high since the high in line 231 disabled NANDgate NA28 is FIG. 23 making line 400 low. The low on line 400 enables NANDgate NA17. The positive pulses pass through line 410 into the counters CO1 through CO5. These pulses continue until the gate signal at line 371 goes low.

The following is directed to the location of the decimal point in the display. If it is assumed that × 1000 (one kilovolt) attenuation is chosen, this would require line 664 to the one kilovolt relay to be low. Line 664 is connected to the collector of transistor T29 with the emitter grounded in FIG. 29. The base of transistor T29 is connected through resistor R186 to line 548. Line 548 is connected to data select switch DSW7 and to data select switch DSW9. Data select switch DSW7 and DSW7 are controlled by line 526 and line 539. Line 526 is low and line 539 is high when the AC volt switch SW18 is activated. This code connects line 482 with ground, line 483 with line 548, line 484 with line 547 and line 546. Lines 482 through 485 go into data select switch DSW6 in FIG. 23. Data select switch DSW6 in turn is controlled by line 528 and through inverter I53 by line 529. Line 528 is high when the AC volt switch SW18 is activated. This puts a low at line 529. This code connects line 482 with line 493, line 483 with line 494, line 484 with line 495, and line 485 with line 496. Lines 482, 484 and 485 are low and line 483 is high from the 1 kilovolt relay driver input line 548. Line 494 is connected to ANDgate A46. The high on line 494 arms ANDgate A46. When a negative pulse occurs on line 428 from the multiplexing data switch DSW15, a pulse goes through ANDgate A46 into NORgate N43. The output of NORgate N43 is connected to NANDgate NA21. The other side of NANDgate NA21 was previously enabled since the high or low level switch SW10 and SW11 on line 332 was not activated. Thus a signal passes through NANDgate NA21 into NORgate N44. This produces a low signal on line 451. This line is connected to the decimal point control terminals of displays DS2 through DS6. When line 428 goes negative, transistor T23 in FIG. 27 conducts and causes display DS5 to light. Thus, with the one kilovolt attenuation, the decimal point is located in display DS5.

If the input signal is less than one kilovolt, a $1 \times 10^4$ carry signal will not occur and line 541 will remain low. Line 541 is connected to buffer amplifier BA14 in FIG. 29. The output of buffer amplifier BA14 is connected to inverter I57. Inverter I57 is connected to ANDgate A61 through line 524. Since there was no $1 \times 10^4$ carry signal, the line 524 is high and enables ANDgate A61. The other input to ANDgate A61. The other input to ANDgate A61 is line 203. When the transfer signal occurs a pulse goes through ANDgate A61 into flipflops FF1 and FF2 by line 544. This causes line 545 of flipflop FF1 to become low and line 544. This causes line 545 of flipflop FF1 to become low and line 552 of flipflop FF2 to become low. It also causes line 554 from flipflop FF1 and line 553 from flipflop FF2 to become high. Lines 545 and 552 are connected to data select switch DSW7. Lines 554 and 553 go into analog ASW3 in FIG. 25. Line 553 is also connected to data select switch ASW8.

Data select switch DSW7 is activated by a low signal on line 526. Line 526 goes low when the AC voltage switch SW18 is activated. This codes data select switch SW7 to put a high on line 480, a low on line 546, a low on line 547 and a low on line 548. The low on line 546 prevents transistor T31 from conducting and disables the × 10,20 volt, attentuator. A low on line 547 prevents transistor T30 from conducting, thereby disabling the ×100, 200 volt, attenuator. The low on lne 548 prevents transistor T29 from conducting and disables the × 1000, 1 kilovolt, attentuator. Thus, there is no attenuation to the incoming signal.

The high on line 480 enables NANDgate NA20 shown in FIG. 23. The other side of NANDgate NA20 is line 499 which goes high when the AC switch SW18 is activated. Thus, output of NANDgate NA20 is low. NANDgate NA20 is connected by line 498 to inverter I51. Inverter I51 is connected by line 497 to NANDgate NA19. The signal on line 497 is high and enables NANDgate NA19. The other side of NANDgate NA19 is connected to line 431 through inverter I49. When a negative signal occurs on line 431 from the multiplex data select switch DSW15, a signal passes through NANDgate NA19 and into NORgate N43. The output of NORgate N43 goes through the decimal setting circuitry and provides a low signal on line 451. Line 451 goes to the decimal point control terminal of each of the displays DS2 through DS6 is FIG. 27. When line 431 goes negative, transistor T20 conducts and lights the decimal point in display DS2. If a 20 volt AC input signal was being measured, a $2 \times 10^5$ carry signal would occur. This would cause line 540 to become high in FIG. 26. The signal on line 540 goes through buffer amplifier BA13 in FIG. 29, into line 557. The signal on line 557 enables ANDgate A49. The other side of ANDgate A49 is connected to line 543. Line 543 is connected to ORgate 0-15 through inverter I59. One input of ORgate 0-15 is connected to line 552. The other input of ORgate 0-15 is connected to line 545. Both line 552 and line 555 were rendered low during the preceding transfer event. This causes line 543 to be high and enables ANDgate A49. ANDgate A49 is also connected to the transfer signal at line 203. ANDgate A61 has been disabled by the negative signal from the $1 \times 10^4$ carry signal. ANDgate A49 will pass a signal to flipflop FF1 when a transfer signal occurs. This causes line 545 to go high and line 554 to go low. Line 554 does not trigger flipflop FF2 because it is a low signal. Data select switch DSW7 now has a high on line 545 and a low on line 552. This code causes line 480 to go low, 546 to go high, 547 to go low and 548 to go low. Line 546 goes through resistor R188 to transistor T31. A high on this line turns on transistor T31 and causes line 662 to go low. A low on line 662 causes attenuator ANT-1 in FIG. 31 to select the $\times 10$, 20 volt attentuation.

Line 546 also goes to data select switch DSW9. This switch connects line 546 with line 485. Line 485 goes into data select switch DSW6 and is connected to line 496. Line 496 is connected to the input of ANDgate A48 in FIG. 23. The other side of ANDgate A48 is connected through inverter I48 to line 430. When a negative pulse occurs online 430, from the multiplexing switch DSW15, the pulse goes through ANDgate A48 into NORgate N43. This provides a low signal on line 451 at the same time a low signal appears at line 430. Line 430 is connected to transistor T21 in FIG. 27 and lights the decimal point in display DS3.

If there is another $2 \times 10^5$ carry signal, another signal passes into flipflop FF1 in FIG. 29. This causes line 545 to go low and line 554 to go high. The high on line 554 passes into flipflop FF2 and causes line 552 to go high and line 553 to go low. Thus, the coded signal into data select switch DSW7 provides a low on line 480, a low on line 546, a high on line 547, a low on line 548. The high on line 547 causes transistor T30 to conduct thereby activating the 200 volt attenuator Line 547 is also connected to data select switch DSW9. The data select switch DSW9 connects line 547 with line 484. Line 484 is connected to data select switch DSW6 in FIG. 23. This line is connected to line 495 which is connected to ANDgate A47. The other side of ANDgate A47 is connected through inverter I47 to line 429. When a negative signal occurs on line 429, a positive signal from ANDgate A47 is connected through inverter I47 to line 429. When a negative signal occurs on line 429, a positive signal from ANDgate A47 goes into NORgate N43. This provides a negative signal on line 451. When the negative signal occurs in line 429, transistor T22 in FIG. 27 lights the decimal point in display DS4.

When an additional $2 \times 10^5$ carry signal occurs, flipflop FF1 again changes state. This causes line 545 in FIG. 29 to go high and line 554 to go low. The low on line 554 does not cause flipflop FF2 to change state. A high on line 545 and a high on line 552 codes data select switch DSW7 to present a high on line 548. This high causes transistor T29 to conduct and engage the $\times 1000$, one kilovolt, attenuator. Line 548 is also connected to data switch DSW9 and to line 483. The high on line 483 causes the decimal point to appear in display DS5.

DC VOLTAGE MEASUREMENT

When the DC voltage measurement is made, the high DC signal enters the circuit on line 680 as shown in FIG. 31. This signal goes through switch SW32 into switch SW33. Switch SW33 is activated so that the signal passes into line 670. Line 670 goes to attenuator ANT-2. The attenuator attenuates the signal by $\times 1$ (2 volt range), $\times 10$ (20 volt range), $\times 100$ (200 volt range) or $\times 1000$ (1 kilovolt range). The attenuator is activated by lines 662, 663, and 664. These lines are the same lines that activate the attenuator for the AC circuit. From the attenuator, the signal passes through line 671 and switch SW36. For switch SW36, the signal passes through resistor R297 into switch SW34 into line 666. Line 666 is connected to grounded capacitor C98 to switch SW37. The signal passes through switch SW37 and resistor R298 into line 672. This line is connected to the positive input to the operational amplifier OA12. The output of operational amplifier OA12 passes through resistor R302 into line 655. Line 655 is connected to line 673 through SW35, SW38 and R299. Line 673 is the negative input of OA12. This connection forms a noninverting amplifier with unity gain. At this point the signal is treated in the same manner as the AC signal.

When the DC switch SW17 in FIG. 33 is activated, line 479 goes low. Line 479 is connected to NORgate N50 and to NORgate N49 in FIG. 23. This gives the digital signal to the logic circuit which is the same as the AC digital logic. Thus, the same clock signal and attenuator signals are used.

In addition, however, line 479 is connected through inverter I50 to the input of NORgate N45 in FIG. 23. This causes the output of NORgate N45 to become low. NORgate N45 is connected by line 446 to transistor T18 of FIG. 27. A low on line 446 causes transistor T18 to conduct. This causes display DS1 to light the plus portion of the display when the control line to display DS1 is low. The control line, line 157, is connected to the collector of transistor T13 in FIG. 18. This line goes low from a high on line 155. Line 155 is high when the input signal is positive. Thus, when the input signal is positive, transistor T13 conducts and sends a signal to the positive sign indicator in display DS1. When a negative signal enters the dual slope integrator, transistor T13 does not conduct and a control signal is not sent to the display. This results in a negative sign being lit in the display. The negative sign appears everytime the display it lit in DC function due to T18 conducting and grounded resistor R126. The negative sign is converted into a positive sign by lighting a vertical line which bisects the negative line.

OHM FUNCTION

Figure 32:
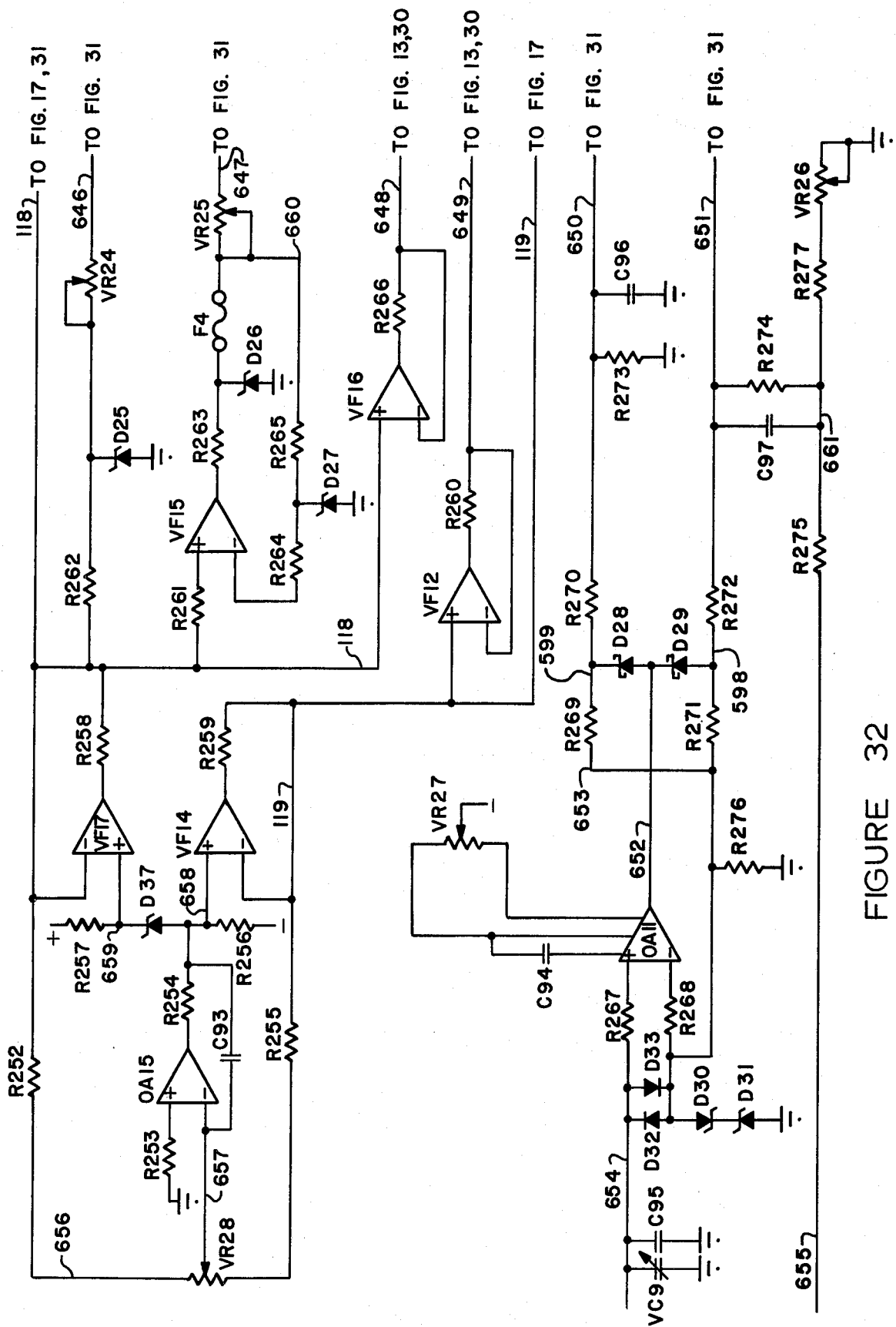
FIG. 32 depicts a schematic representation of the DVM converter circuitry.

When an OHM function is measured, the high input across the unknown resistor enters the circuit by line 680 in FIG. 31. The low input across the unknown resistor enters the circuit through line 668. Line 680 is connected through switch SW32 and switch SW33 to line 669. Line 669 is connected through switch SW28 to the megohm current source through switch SW29 to the kilohm current source and through SW30 to the OHM current source. The OHM, kilohm and megohm current sources are provided by the circuit in FIG. 32 and resistors R293, R294, and R295 in FIG. 31. As shown in FIG. 32, a positive power source is applied through resistor R257 to line 659. Line 659 is connected to the positive side of voltage follower VF17. A negative power source is connected through resistor R256 to line 658. Line 658 is connected to the positive input of a voltage follower VF14. The output of voltage follower VF17 goes through resistor R258 into line 118. the output of voltage follower VF14 goes through resistor R259 into line 119. Zener diode D37 is selected so that line 118 is a positive 3.2 volts and line 119 is a negative 3.2 volts. Line 118 is connected to the negative input of voltage follower VF17 to provide a constant DC voltage on line 118. Line 119 is connected to the negative input of voltage follower VF14 to assure the voltage on line 119 is a constant 3.2 volts. Line 118 is connected through resistor R252 to line 256. Line 256 is connected to one side of a variable resistor VR28. The other side of the variable resistor VR28 is connected through resistor R255 to line 119. The variable arm of VR28 is connected by line 657 to the negative input of operational amplifier OA15. The positive input of operational amplifier OA15 is connected to grounded resistor R253. The output of operational amplifier OA15 is connected through resistor R254 to line 658. Line 658 is connected through capacitor C93 to the negative input of operational amplifier CA15. This capacitor is provided to eliminate any AC signals on line 658. OA15 balances the positive and negative 3.2 volt supplies. Adjustment of balance is provided by VR28. Line 118 with R293 is the megohm current source. It is also connected through resistor R262 and variable resistor VR24 to line 646. Line 646 and 284 is the kilohm current source. Line 118 is also connected through resistor R261 to the positive input of voltage follower VF15. The output of voltage follower VF15 is connected through resistor R263 and fuse F4 to line 660. Line 660 is connected through resistors R265 and R264 to the negative input of voltage follower VF15. Line 660 is also connected through variable resistor VR25 to line 647. Line 647 and R295 is the ohm current source.

When the Ohms Surtch SW30 is activated, the current on line 647 passes through resistor R295 into line 669. The current on line 669 passes through the switche SW36 into line 667 through resistor R297 ans SW35 into line 667 through resistor R297 and SW35 into line 667. Line 667 is connected to line 673 through switch SW38 and resistor R299. Line 673 is the inverting input to operational amplifier OA12. The noninverting input of OA12 is grounded through resistor R296, switches SW34, SW35 and resistor R298. The output of OA12 is connected to line 655 through resistor R302. Line 665 connects to the low input, line 668, through switch SW44. This connects the unknown resistor from the output of OA12 to the inverting input of OA12. A known current is presented to the inverting input of OA12 as previously described. The operational amplifier OA12 will present an equal current through the unknown resistor to balance the inverting input with the grounded noninverting input. The voltage developed on the output of OA12, line 655, will be proportional to the value of the unknown resistor. Capacitor C100 is connected from the low input to the inverting input of OA12 through switches SW41, SW38 and resistor R299. The effect of this capacitor is to slow the circuit and reduce noise sensitivity. Operation of the kilohm and megohm ranges is similar. Only the current source resistor is changed by selection of SW29 or SW28. On the megohm range capacitor C100 is switched out and capacitor C55 is switched in by switches SW41, SW40 and SW39 respectively. This changes the speed of the circuit to suit the higher resistances measured on this range. Line 655 is connected through resistor R303 to line 674. Line 674 is connected through switches SW46 and SW47 to line 90. Line 90 goes through the High and Low level switches SW11 and SW10 to line 87 in FIG. 15. From here the signal is processed in the same manner as discussed for the High or Low peak voltages.

Line 674 is also connected through switch SW45 to line 675 on the ohms range of Ohm function. Line 675 is connected to the collector of transistor T33. the base of transistor T33 is connected to the emitter of transistor T32 by line 678. Line 678 is connected through resistor R307 to line 677. The emitter of transistor T33 is connected through resistor R308 and resistor R309 to line 677. Resistor R308 is also connected to resistor R310 to line 676. Line 676 is connected to the collector of transistor T32 and to a positive voltage source. Line 677 is connected to ground through resistor R306 and to variable resistor VR31. The other side of variable resistor VR31 is connected to line 676. The arm of the variable resistor VR31 is connected to the base of transistor T32. Thus, by varying the voltage at the base of transistor T32 by variable resistor VR31, the emitter on line 678 can be adjusted to go high or low. This causes the current on line 675 to be variable depending upon the voltage applied to the base of transistor T32. The current on line 675 goes through switch SW45 into line 674 and through resistor R303 to line 655. Because the output of operational amplifier OA12 is connected by line 655 through the unknown resistance back to the negative input of the operational amplifier, the gain of the amplifier is proportional to the resistance of the unknown resistor. The adjustment of current on line 674 allows small adjustments in the voltage drop across resistor R303. Line 674 is connected on line 90 through switches SW46 and SW47. The voltage on line 90 is measured by the A to D converter and is directly proportional to the unknown resistance.

When the kilohm swith is activated, the kilohm source on line 646 is connected through resistor R294 to the high side of the unknown resistor. It is also connected through resistors R297 and R299 to operational amplifier OA12. The signal from the high and low sides of the unknown resistor are connected through capacitor C100 by switch SW40. Thiscapacitor eliminates any AC fluctuations across the unknown resistor. The output of operational amplifier OA12 on line 655 is connected to the low side of the unknown resistor, through switch SW43. Because the output of operational amplifier OA12 is connected through an unknown resistor back to the negative input of the amplifier, the gain through the amplifier is proportional to the value of the unknown resistance. This causes the voltage on line 655 to fluctuate in a manner proportional to the unknown resistance. This voltage signal on line 655 goes through resistor R303 into line 674. Line 674 is connected to the A to D converter and the signal is processed in the same manner as the AC or DC voltages.

When the Megohm switch SW28 is activated, the megohm source on line 118 and resistor R293 is connected through line 669 to the high side of the unknown resistor. This line is also connected to the negative input of the operational amplifier OA12. The positive input is connected as ohm and kilohm functions. The high and low input is connected across capacitor C99 by switch SW39 to eliminate any AC fluctuations across the unknown resistor. The unknown resistor is connected between the negative input of the operational amplifier and its output through switch SW42. This causes the output on line 655 to fluctuate in the same manner as discussed for the kilohm measurement. Line 655 is connected through resistors R304 and R305 and variable resistor VR30 in FIG. 31 to ground. By adjusting the resistance in variable resistor VR30, the voltage drop across resistor R304 into line 681 can be adjusted to calibrate this function. The current source for ohm and kilohm function is adjustable by variable resistors VR25 and VR24 respectively. Line 681 is connected through switch SW46 to line 90 through switch SW47. This line goes to the A to D converter and the signal is processed in the same manner as the AC or DC signals.

In the logic circuitry, switch SW14, for the ohms measurement, or switch SW15, for the kilohm measurement, or switch SW16, for the megohm measurement is activated. These switches are shown in FIG. 33. If any of these switches are activated line 266 goes high. The high online 266 causes line 231 in FIG. 19 to go high. A high on line 231 disables NANDgate NA28 in FIG. 23 causing line 400 to go low. The low on line 400 disables gating NANDgate NA16 in FIG. 22 and enables gating NANDgate NA17. Thus, the count signal on line 401 passes into the counters when the gate signal on line 371 is high.

Figure 24:
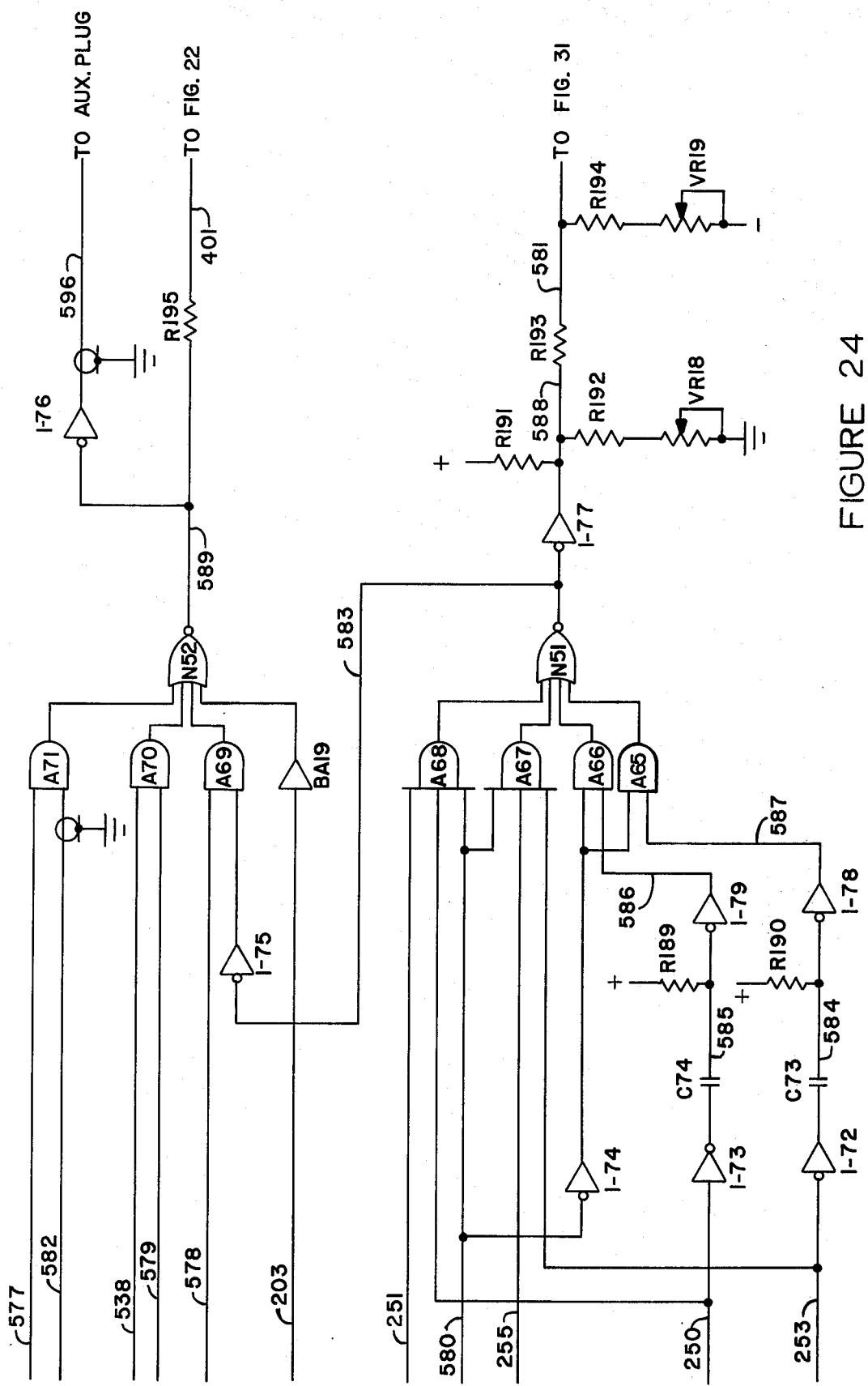
FIG. 24 depicts a schematic representation of the logic circuitry and the duty cycle circuitry.
Figure 25:
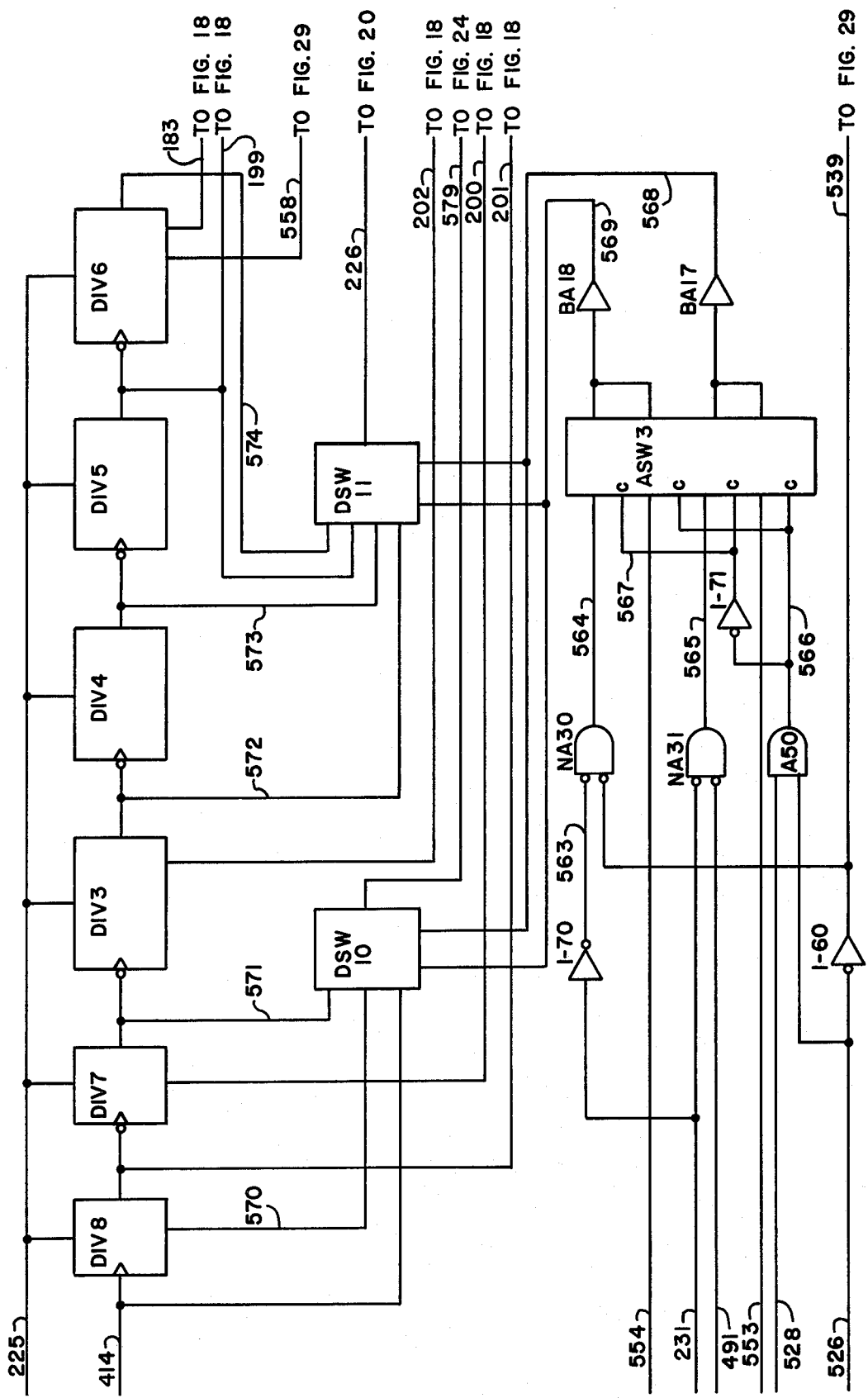
FIG. 25 depicts a schematic representation of the logic circuitry and the time base circuitry.

When line 231 goes high, it also enables NANDgate NA30 in FIG. 25. The other side of NANDgate NA30 is connected through inverter I60 to line 526. Line 526 is connected through NORgate N46 in FIG. 23 to line 332. Line 332 is connected to the High or Lowlevel switches. Since these switches are not activated in the ohms function, line 332 is low. The other side of NORgate N46 is connected to the output NORgate N50. NORgate N50 is connected to the AC volt switch SW18 and to the DC volt switch SW17. Since neither of these switches have been activated, the output of NORgate N50 is low. This causes the output of NORgate N46 on line 526 to be high. A high in line 526 enables NANDgate NA30 in FIG. 25 and a positive signal passes into line 564. The high on line 231 inactivates NANDgate NA31 causing a low on line 565. Lines 564 and 565 are connected to analog switch ASW-3. The analog switch ASW-3 is controlled by the output of ANDgate A50. One input to ANDgate A50 is line 526 which is high as discussed supra. The other input to ANDgate A50 is line 528. Line 528 is connected to the output of NORgate N49 in FIG. 23. Line 528 is low when the DC volt switch SW17, the AC volt switch SW18 and the frequency switch SW20 are not activated. This low disables ANDgate A50 and causes a low on control line 566 and a high on control line 567. This causes analog switch ASW-3 in FIG. 25 to connect line 564 with line 569 and line 565 with line 568. A high on line 569 and a low on line 568 causes a data select switch DSW10 to connect clock line 570 with count signal line 579. Line 570 is connected to divider DIV8 and provides a 2 microsecond clock signal. The clock signal on line 579 passes through ANDgate A70 in FIG. 24 and through NORgate N52. The output of NORgate N52 is connected through resistor R195 to line 401. Line 401 is the count signal and is a 2 microsecond clock signal, whenever any of the ohm functions are selected.

The decimal location depends upon which Ohm function switch has been activated. If the Ohm function switch SW14 has been activated, line 487 in FIG. 33 goes low. Line 487 is connected through inverter I54 to line 534 in FIG. 23. Line 534 is connected through ORgate O12 to line 531. Line 531, which is high, goes into data select switch DSW6. The control signal to data select switch DSW is from line 528. This line is low as discussed supra and causes control line 529 to be high. A high on line 529 orders data select switch DSW6 to connect lines 530 through 533 with lines 493 through 496 respectively. Line 531 is high which causes line 494 to be high. Line 494 is connected to ANDgate A46. The other side of ANDgate A46 is connected through inverter I46 to line 428. Whenever a negative signal occurs on line 428, a positive signal passes through ANDgate A46 into NORgate N43. This causes line 451 to go negative. Line 451 is connected to the decimal point control terminals in displays DS2 through DS6. When a negative signal appears on line 428, transistor T23 in FIG. 27 lights display DS5. Thus, when the Ohm function has been selected, the decimal point will appear in display DS5.

If the Kilohm switch SW15 is activated line 489 goes low. This causes a high signal to pass through NORgate N47 in FIG. 23 into ORgate O13. This makes the output of ORgate O13 at line 532 become high. Line 532 is connected through data select switch DSW6 to line 495. Line 495 is connected to ANDgate A47. Whenever a negative signal appears on line 429, line 451 to the decimal display terminals DS2 through DS6 goes negative. The negative signal on line 429 causes transistor T22 to light display DS4. Thus, when the Kilohm switch is activated, the decimal point appears in display DS4.

When the Megohm switch SW16 is activated, line 490 goes low. Line 490 is connected to the same NORgate as the Kilohm switch line. Thus, the decimal point location is in the same place as the Kilohm range, i.e., in display DS4.

THRESHOLD VOLTAGE SETTING

The other functions use a threshold voltage to process the incoming signals through the circuitry. The following is directed to setting these threshold voltages. The signal on line 42 from the buffer amplifier as shown in FIG. 14 goes through resistor R25 into line 44. Filter bypass switch SW4 is connected across resistor R25 and provides a bypass to resistor when the switch is not activated. When switch SW4 is activated, it is connected to a grounded capacitor C8. This capacitor is provided to filter all the high frequency noise in the signal. The signal on line 44 goes through resistor R26 to line 46 and through resistor R28 to line 48. Capacitor C10 is connected across resistor R26 and capacitor C9 is connected across resistor R28 and provides high frequency compensation of the signal. Line 46 is connected to the positive input to high threshold differential video amplifier VA1. Line 48 is connected to the positive input of low threshold differential video amplifier VA2. Line 46 and line 48 are connected to grounded resistor R27 and grounded resistor R29 respectively so as to reduce the voltage on lines 46 and 48. The negative input to differential video amplifier VA1 is connected by line 47 to resistor R32 and the variable resistor VR6. Line 47 is also connected to variable resistor VR8 and to a grounded resistor R34. The other side of variable resistor VR8 is connected by line 13 to the output of voltage follower VF5 in FIG. 13. Line 47 provides the high threshold voltage setting for the incoming signal being processed through line 46. When the signal online 46 passes above its high threshold voltage, the output of differential video amplifier VA1 on line 51 goes low.

The negative input of differential video amplifier VA2 is connected by line 49 through resistor R33 to variable resistor VR7. Line 49 is also connected to one side of variable resistor VR9 and to grounded resistor R35. The other side of variable resistor VR9 is connected by line 17 to voltage follower VF7 in FIG. 13. The voltage setting on line 49 establishes the low threshold value for the incoming signal on line 48. When the signal on line 48 passes above its low threshold voltage, the output of differential video amplifier VA2 goes high on line 50. These signals on line 50 and 51 provide the gating logic and count signals for the circuit.

Figure 13:
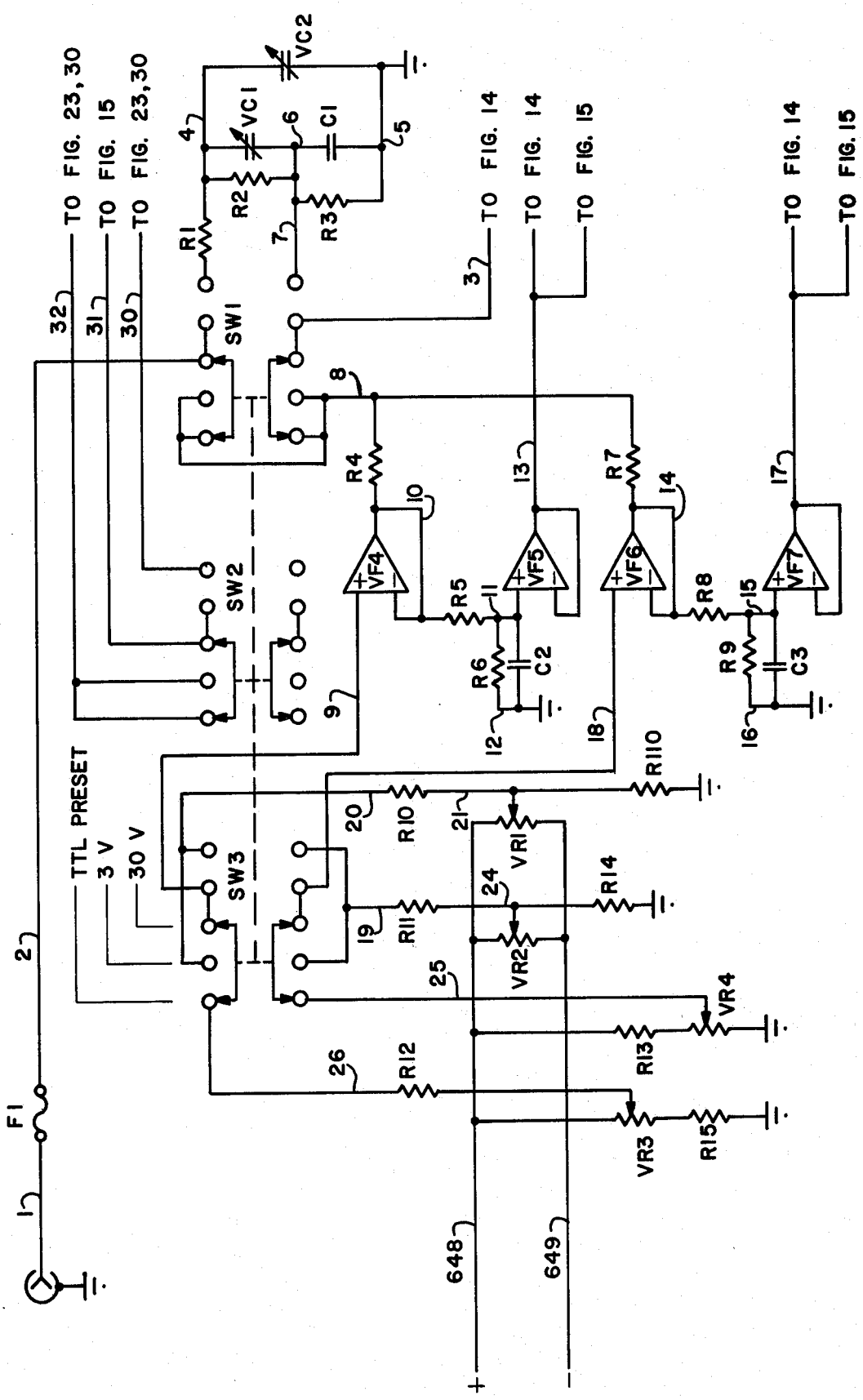
FIG. 13 depicts a schematic representation of an exemplary high and low threshold setting circuitry for channel A.
Figure 14:
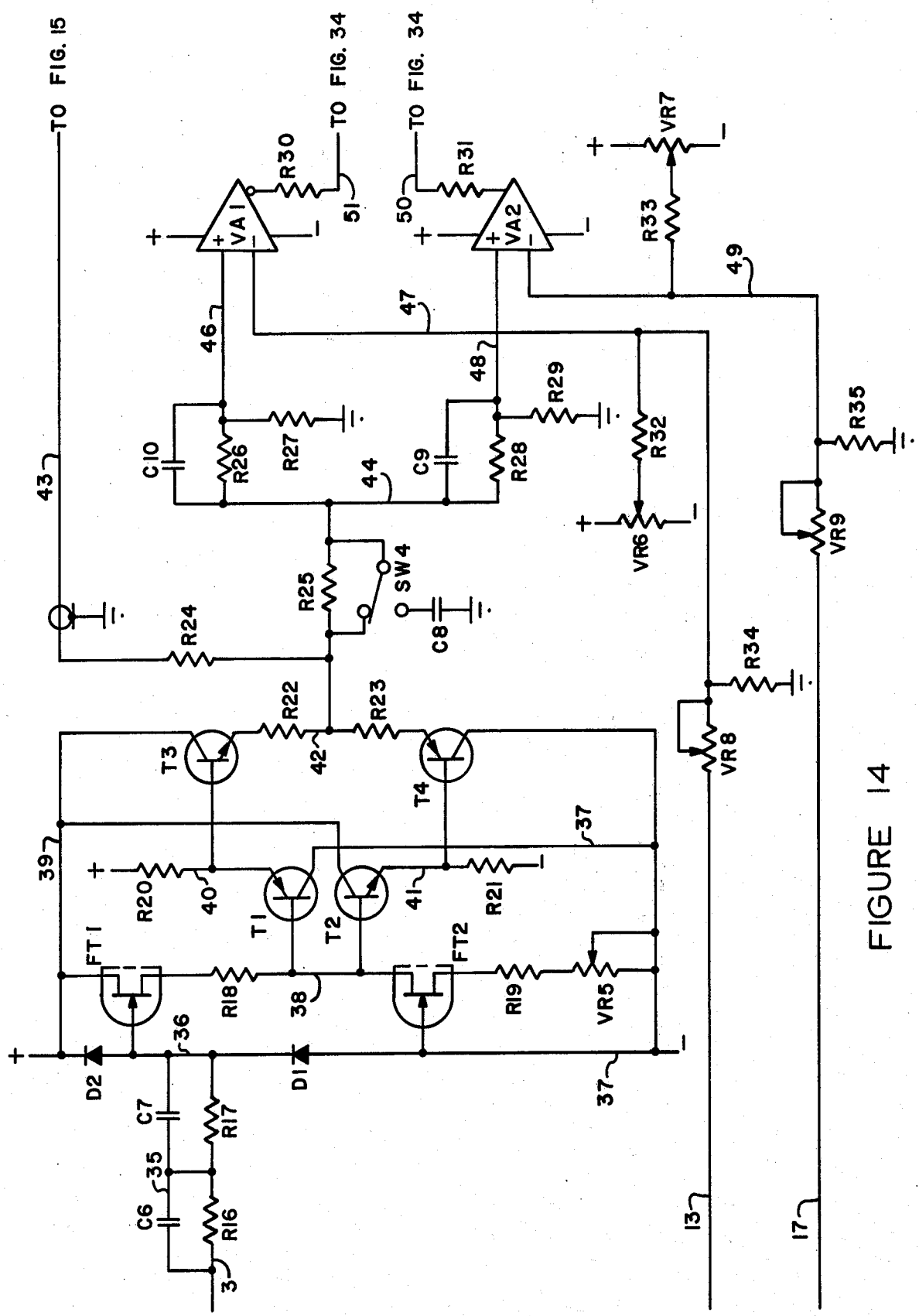
FIG. 14 depicts a schematic representation of a buffer amplifier circuitry and a high and low threshold detector circuitry.

To provide the high and low threshold voltages to the amplifiers, switch SW3 in FIG. 13 connects line 20 with line 9, and line 19 with line 18. Line 20 is connected through resistor R10 to line 21. Line 21 is also connected to grounded resistor R110. Line 21 is connected to variable arm of high threshold variable resistor VR1. One side of high threshold variable resistor VR1 is connected to a positive voltage source by line 648 and the other side of the high threshold variable resistor VR1 is connected to a negative voltage source through line 649. This adjustable voltage signal passes through line 20 and passes through line 21 and switch SW3 into line 9. Line 9 is connected to the positive input of voltage follower VF4. The output of voltage follower VF4 is connected to its negative input by line 10 and also through resistor R4 to line 8. The output of voltage follower VF4 is also connected through resistor R5 to the positive input of voltage follower VF5 at line 11. Line 11 is also connected to grounded resistor R6 and grounded capacitor C2. The grounded resistor provides a reduction in the voltage at line 11. The output of voltage follower VF5 is connected to its negative input to insure that the voltage entering at line 11 will equal the voltage at line 13.

The low threshold voltage is set by adjusting variable resistor VR2. Line 24 is connected to the variable arm of variable resistor VR2 and to grounded resistor R14. VR2 is connected across a positive voltage source at line 648 and negative voltage source at line 649. The voltage on line 24 can be adjusted by variable resistor VR2. The voltage signal on line 24 goes through resistor R11 and switch SW3 and into line 18. Line 18 goes into the positive input of voltage follower VF6. The output of the voltage follower, line 14, goes through resistor R7 into line 8. Line 14 is also connected to the negative input of voltage follower VF6. Line 14 is connected through resistor R8 to the positive input of voltage follower VF7 at line 15. Grounded resistor R9 and grounded capacitor C3 are connected to line 15 to provide a reduction of the voltage into voltage follower VF7. The output of voltage follower VF7 is connected to its negative input to maintain the voltage on line 17 the same as the voltage on line 15.

Line 8 is connected through switch SW1 to line 3. If there was a fuse blow or if there was no input signal, the voltage at line 3 would be mid-distance between the high threshold voltage on line 10 and the low threshold voltage on line 14. During the time that signal passes through line 2 into line 3, the large resistances in resistors R4 and R7 prevent any significant effect from the high and low threshold voltages on the incoming signal.

To determine where the high and low threshold variable resistors should be set, the threshold voltages must be determined. This may be done by activating a threshold switch SW5 is FIG. 15. This connects line 13 with line 89 and line 17 with line 85. Line 89 goes through resistor R38 to line 100. Line 85 goes through resistor R36 to line 86. Line 100 goes to the High level switch SW11 and line 86 goes to the low level switch SW10. Line 100 is connected with line 87 when the High level switch is activated and line 86 is connected with line 87 when the Low level switch is activated. Line 87 goes to the A to D converter and is processed in the same manner as the high peak voltage is processed, discussed earlier. The high and low threshold voltages are adjusted until the proper values are set.

The high threshold voltage on line 13 sets differential video amplifier VA1 in FIG. 14 to pass a negative signal into line 51 when the incoming signal on line 46 passes above its high threshold voltage. The low threshold voltage on line 17 sets differential video amplifier VA2 to pass a positive signal into line 50 when the incoming signal on line 48 passes above its low threshold voltage. The output of amplifier VA1 at line 51 is connected through diode D24 to the input of Schmidt Trigger ST2 in FIG. 34. The signal on line 51 goes from 5 volts to zero when the signal on line 46 passes above its high threshold. There is a one volt voltage drop across diode D24. When the output of diode D24 obtains a one volt or lower signal, the output of schmidt trigger ST2 goes high. If the signal on line 51 continues to a lower voltage, schmidt trigger ST2 continues to conduct.

The signal from the low threshold amplifier is connected through diode D23 to schmidt trigger ST1. When the incoming signal on line 46 goes above its lower threshold voltage, the signal on line 50 goes from zero to +5 volts. Diode D23 and resistor R210 provide a one volt voltage drop to the input of Schmidt Trigger ST1. When the signal to the Schmidt Trigger ST1 obtains a one volt or higher voltage, the output of Schmidt Trigger ST1 goes low. Thus, when the signal on line 48 is below its low threshold voltage, the signal to Schmidt Trigger ST1 is below one volt. This causes the output of Schmidt Trigger to be high. When the signal on line 48 passes through its low threshold, the voltage to Schmidt Trigger ST1 attains one volt causing the output of Schmidt Trigger ST1 to go low.

The digital signal from Schmidt Trigger ST1 passes through resistor R211 into line 600. Line 600 is connected through inverter I80 to line 253 and also through buffer amplifier BA21 to line 252. The digital signal from Schmidt Trigger ST2 goes through resistor R213 into line 601. Line 601 is connected through buffer amplifier BA20 to line 250 and through inverter I81 to line 254.

Figure 20:
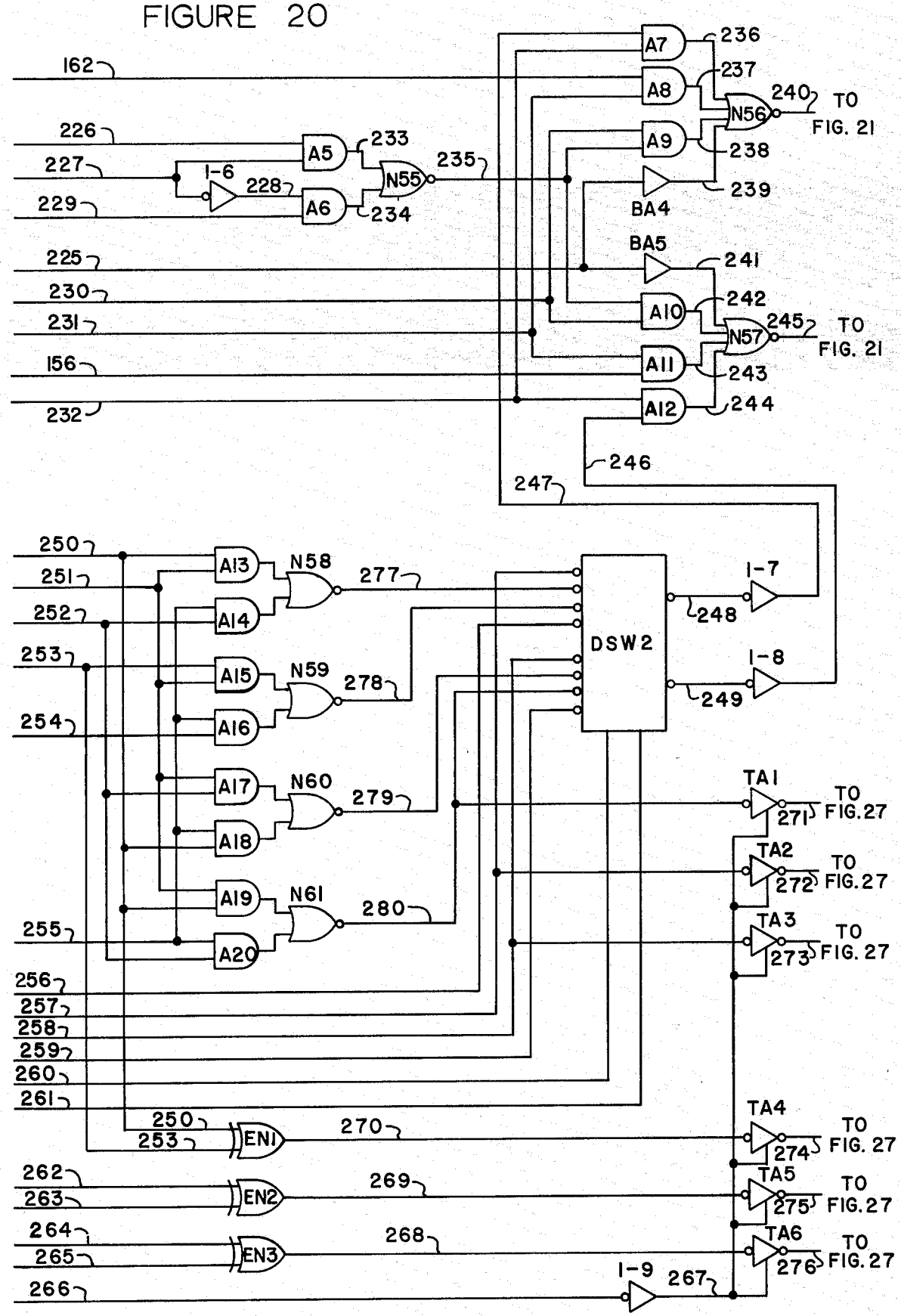
FIG. 20 depicts a schematic representation of the logic circuitry and the signal present and signal fault circuitry.

Line 253 is connected to ANDgate A15 in FIG. 20. Line 252 is connected to ANDgate A14, ANDgate A17 and to ANDgate A20. Line 250 is connected to ANDgate A13 and ANDgare A19. Line 254 is connected to ANDgate A16. Lines 250 and 253 are also connected to exclusive NORgate EN1. These signals are processed in accordance with which of the function switches are activated.

SLOPE

If the function desired to be measured is slope, function switch SW22 is activated. This causes line 473 to go low in FIG. 33. Line 473 is connected to NORgate N41 in FIG. 19. A low on line 473 causes the output of NORgate N41 on line 261 to be high. Since the width function switch and the coincidence C and B function switch have not been activated, lines 471 and 472 are high, thereby making the output of NORgate N40 to be low at line 260. Lines 260 and 261 are the control lines for data select switch DSW2 in FIG. 20.

If the negative slope is desired, switch SW48 in FIG. 35 is activated. This causes line 251 to go low. A low on line 251 diables ANDgates A13, A15, A17 and A19. Line 251 is connected through inverter I61 to line 255. The high in line 255 enables ANDgates A20, A18, A16 and A14. When the signal passes through its high threshold, line 254 goes high and passes a signal into NORgate N59. NORgate N59 is connected by line 278 to the data select switch DSW2. Since ANDgates A13, A14, A15, A17, A18, A19 and A20 are disabled, lines 277, 279 and 280 are high. Control lines 260 and 261 cause data select switch DSW2 to connect line 280 with line 249, and line 289 with line 248. Line 248 is connected through inverter I7 to line 247 and line 249 is connected through inverter I8 to line 246. Line 246 is low and therefore disables ANDgate A12. Line 247 is high and enables ANDgate A7. ANDgate A12 and ANDgate A7 are connected to line 232. Line 232 is connected through inverter I42 to the output of NANDgate NA18 in FIG. 19. NANDgate NA18 in turn is connected to NORgate N37. One input to NORgate N37 is line 465 which is low whenever the slope switch SW22 is activated. Line 465 is connected to the output of ORgate O17 in FIG. 23. Line 473, from SW22 is connected to one input of ORgate O17. This causes the output of NORgate N37 to be high and enables NANDgare NA18. The other side of NANDgate NA18 is connected to line 336 to inverter I40. Inverter I40 is in turn connected to the output of NORgate N36. One terminal of NORgate N36 is connected to the Duty Cycle switch SW19 through line 464. Since the Duty Cycle switch has not been activated, line 464 is high. Another input to NORgate N36 is connected to inverter I38. Inverter I38 is in turn connected to the voltmeter switches SW14 through SW18 in FIG. 32. Since none of these switches have been activated, line 266 is low which is inverted through inverter I38 putting a high on another input to NORgate N36. The third terminal to NORgate N36 is connected to inverter I39 by line 463. Inverter I39 is connected to the High and Low level switches SW11 and SW10 by line 332. Since neither the high or the low peak voltages are being measured line 332 is low which puts a high on line 463. Thus, the output of NORgate N36 is low making line 336 to be high. This causes the output of NANDgate NA18 in line 326 to be low and line 232 to be high. A high in line 232 allows a signal to pass ANDgate A7 in FIG. 20. This signal passes into NORgate N56 through line 236. The output of NORgate N56 is low and goes to the start latch circuitry shown in FIG. 21 through line 240.

When the incoming signal passes through the low threshold voltage, line 252 becomes high and passes a signal through ANDgate A20 into NORgate N61 of FIG. 20. The output of NORgate N61 in line 280 is low. This causes line 246 to be high and passes a signal through ANDgate A12 and through NORgate N57. The output of NORgate N57 is low and is connected to the stop latch circuitry by line 245. The operation of the start and stop latch circuitry is the same as previously discussed for the high and low peak voltage measurements.

The gate signal begins when the incoming signal passes through its high threshold and continues until the incoming signal passes through its low threshold at which time the gate signal ceases. This is a measurement of the fall time of the signal. If a rise time is desired, switch SW48 is not activated. This causes line 251 to be high and line 255 to be low. A low on line 255 disables ANDgates A20, A18, A16 and A14. A high on line 251 enables ANDgates A13, A15, A17, A18 and A19. When the incoming signal passes through its low threshold, line 253 becomes high. This causes a signal to pass through ANDgate A15 into NORgate N59. The signal from NORgate N59 passes through data select switch DSW2 and inverter I7 into line 247. This high on line 247 passes through ANDgate A7 and NORgate N56 and into the start latch circuitry at line 240. When the incoming signal passes through its high threshold, line 250 becomes high. This causes a signal to pass through ANDgate A19 into NORgate N61. This signal passes on line 280 through data select switch SW2 and inverter I8 into line 246. The high online 246 passes through ANDgate A12 and NORgate N57 and into the stop latch circuitry at line 245.

The following is directed to determine the clock signal to be counted in the slope function. When the gating signal is present on line 371, it enables NANDgate NA16 and NANDate NA17 in FIG. 22. NANDgate NA16 is connected by line 407 through inverter I26 to line 403 and through inverter I24 to line 400. Line 400 is connected to NANDgate NA28 in FIG. 23. One input to NANDgate NA28 is line 231. Line 231 is connected through inverter I41 and inverter I40 to NORgate N36 in FIG. 19. NORgate N36 is connected to the Duty Cycle switch by line 464. Since this switch has not been activated, line 464 is high. Another input to NORgate N36 is line 463 which is connected through inverter I39 to the High or Low level switch SW10 and SW11 through line 332. Since the High or Low level switch has not been activated, line 332 is low and line 463 is high. The third input to NORgate N36 is line 462 which is connected through inverter I38 to the voltmeter function switches SW14 through SW18. Since none of these switches have been activated, line 266 is low. This causes line 462 to be high. Since all the inputs to NORgate N36 are high, the output is low causing line 231 to be low. The third terminal to NANDgate NA28 in FIG. 23 is connected to the microsecnd Time switch SW56 in FIG. 36 by line 486. If microseconds have been selected as the display time, then line 486 is low causing the output of NANDgate NA28 in line 400 to be high. This causes line 403 t be low and disables NANDgate NA17 in FIG. 22. Since line 406 is high, it enables NANDgate NA16. The pulses from the 10 megahertz clock CL1, (different clock frequencies could be used), will pass through NANDgate NA16 from line 406 and inverter I25. The output of NANDgated NA16 is connected by line 408 to NORgate N35. The 10 megahertz signal passes through NORgate N35 and into line 410. Line 410 is connected t the counting circuit as shown in FIG. 26.

If the Time switch SW56 has been connected to line 488 to designate milliseconds time, the output of NANDgate NA28 in FIG. 23 is low which enables NANDgate NA17 and disables NANDgate NA16 in FIG. 22. NANDgate NA17 is connected to the count signal line 404. The particular clock selected to be counted is set by the digital circuitry shown in FIG. 25.

In FIG. 25, NANDgate NA31 is enabled by the low on line 231, and NANDgate NA30 is disabled. This causes line 564 to be low. The other input to NANDgate NA31 is connected to the one second terminal in switch SW56. Since the millisecond position has been selected, line 491 is high, disabling NANDgate NA31. This causes line 565 to be low. NANDgate NA49 which controls analog switch ASW3, is connected to line 528. Line 528 is low when DC volt switch SW17, the AC volt switch SW18 and the Frequency switch SW20 has not been activated. This low disables ANDgate A50 and causes line 566 to be low and 567 to be high. This connects line 564 to line 569, and line 565 to line 568. A low in both line 569 and line 568 causes data select switch DSW10 to connect count signal line 579 with clock line 414. Line 414 is connected to the one megahertz signal terminal of divider DIV2 of FIG. 22. Divider DIV2 is connected to the collector of transistor T15 by line 413. This transistor is connected through resistor R154 and capacitor C68 to divider DIV1. Divider DIV1 is connected through inverter I28 to the ten megahertz clock CL1. Divider DIV1 divides the signal by five causing a 2 megahertz signal to go into divider DIV2. Divider DIV2 divides by two resulting in a one megahertz signal going through line 414.

The one megahertz signal on line 579 passes through NANDgate NA17 and through NORgate N35 of FIG. 22 and into the counters. The signal is counted in the same manner as previously discussed in the other functions. The counter continues counting the one megahertz clock until the gate signal on line 371 ceases.

The decimal point location is determined by the switching logic in FIG. 23. When the millisecond position in Time switch SW56 is selected, line 488 goes low and enables NANDgate NA26. The other input to NANDgate NA26 is connected to line 465 which is low when the Slope switch SW22 is selected. This causes a high signal to go to ORgate 013 and into line 532. Line 532 is connected to the data select switch DSW6 which is controlled by the state in control line 528. Since the Frequency switch SW20, AC voltage switch SW18 and the DC voltage switch SW17 have not been activated, the output on line 528 is low. A low on line 528 is inverted into a high on line 529. This code to data select switch DSW6 connects line 532 with line 495. The high on line 495 enables ANDgate A47. When a negative pulse appears on line 429 from the multiplexing data select switch SW15, a high pulse passes through ANDgate A47. This causes decimal point line d451 to go low. Line 451 is connected to the decimal point controls in displays DS2 through DS6 in FIG. 27. The negative pulse on line 429 causes transistor T22 in FIG. 27 to conduct and light the decimal point in display DS4. If the one second position on Time switch SW56 in FIG. 36 is activated, then line 491 goes low and a signal is passed through NANDgate NA31 in FIG. 25. This causes line 565 to go high and codes data select switch DSW10 to connect line 571 to the clock signal line 579. Line 571 is connected to the 100 microsecond clock source. Thus, the clock signal going to the counters is a 100 microsecond signal.

When the second terminal on the Time switch is activated, line 491 goes low and NANDgate NA27, in FIG. 23, passes a signal into line 533. Line 533 is connected to line 496 through data select switch DSW6. The pulse passes through NANDgate NA19 when a negative signal appears on line 431 from the multiplexing data select switch DSW15. This causes NANDgate NA19 to pass a low to NORgate N43. This signal causes line 451 to low. When line 431 goes low, transistor T20 in FIG. 27 lights the decimal point in display DS2.

WIDTH

Figure 19:
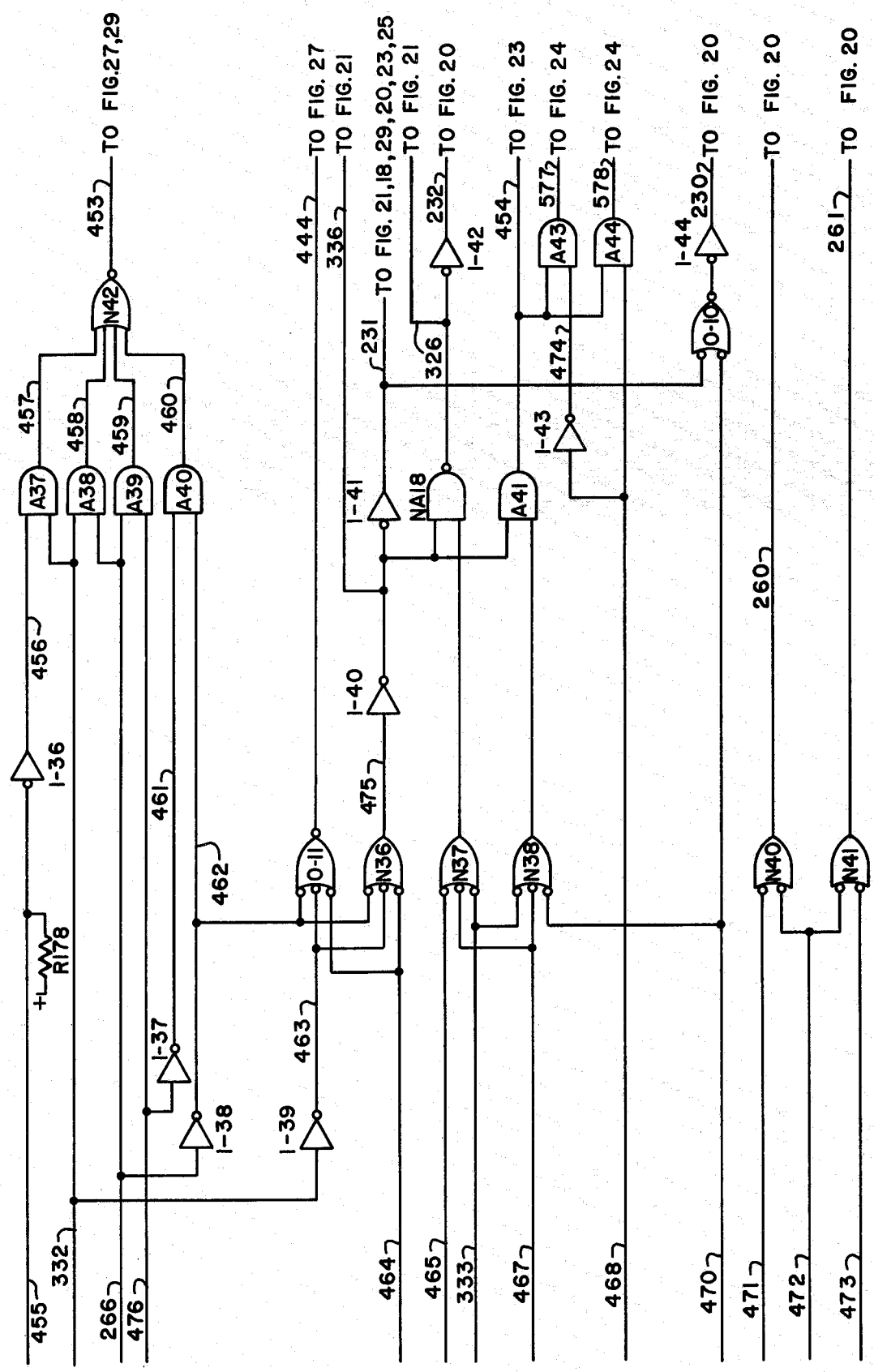
FIG. 19 depicts a schematic representation of the logic circuitry and the forbidden combination circuitry.

The width measurement uses the same circuitry as the slope measurement except that the gate signal goes high when the incoming signal passes through the high threshold voltage and goes low when the incoming signal passes through the low threshold voltage. This occurs when the positive phase is selected. When the negative phase is selected, the gate signal goes high when the incoming signal passes through the high threshold voltage and goes low when the incoming signal passes through the low threshold. The width measurement is made by activating Width switch SW21 in FIG. 33. This causes line 471 to go low. A low on line 471 causes the output of NORgate N40 at line 260 to go high (FIG. 19). The coincidence B to C switch SW26 and the slope switch SW22 are not activated causing lines 472 and 473 to be high. This causes the output of NORgate N41 at line 261 to be low. Lines 260 and 261 control lines for data select switch DSW2 in FIG. 20. A high on line 260 and a low on line 261 causes data select switch DSW2 to connect line 248 with line 277, and line 249 with line 279.

When the incoming signal passes through a positive pulse, its high threshold voltage line 250 goes high and a signal passes through ANDgate A13 into NORgate N58. This causes line 277 to go low. This low signal passes through line 248 and inverter 17 into line 247. This signal which has been inverted to a high, passes through ANDgate A7 into NORgate N56 and line 240. Line 240 is connected to the start latch circuitry and causes the gate signal in line 371 to go high.

When the incoming signal passes through its low threshold voltage, line 252 goes high and passes a signal through ANDgate A17 and through NORgate N60 into line 279. This signal goes into data select switch DSW2 to line 249 and through inverter 18. This signal which has been inverted to a high passes through ANDgate A12, through NORgate N57 and into line 245. The signal in line 245 goes to the stop latch circuitry and causes the gate signal in line 371 to go low.

The decimal location in the width function is the same as in the slope function and depends upon whether the time switch SW56 is connected to the second terminal, the millisecond terminal, or the microsecond terminal. Also, the particular clock used as the count signal depends upon which of the time signals are selected in time switch SW56. This is the same as discussed for the slope function.

DUTY CYCLE

When the duty cycle function is selected duty cycle switch SW19 in FIG. 33 is activated. This causes line 464 to go low. Line 464 is connected to NORgate N36 in FIG. 19. The low into NORgate N36 causes line 475 to go high, line 336 to go low and line 231 to go high. The low in line 336 disables NANDgate NA18 and causes the output of inverter I42 in line 232 to go low. A low in line 232 disables ANDgate A12 and A7 in FIG. 20. A high in line 231 enables ANDgates A8 and A11. One input to ANDgate A8 is connected by line 162 to the A to D converter start signal in the circuitry shown in FIG. 18. The other input to ANDgage A11 is connected to line 156 which is the A to D converter stop signal. The start signal is line 162 goes high when the dual slope integrator starts integrating backwards from the unknown voltage and the stop signal in line 156 goes high when the integrator passes through zero crossing.

Since the output of the A to D converter (FIG. 17) controls the start and stop latch circuitry, the input to the A to D converter must be determined. The positive phase switch SW48 has not been activated. This causes line 251 to be high and enables ANDgate A68 in FIG. 24. If the negative phase had been chosen, switch SW48 would be activated and line 251 would go low. This would disable ANDgate A68 and enable ANDgate A67. Another terminal of ANDgate A68 and ANDgate A67 is connected by line 580 to TRC switch SW51 in FIG. 33. Since that switch has not been activated line 580 in high. This enables both ANDgate A67 and A68. A third terminal to ANDgate A68 is connected to line 250 which goes high when the incoming signal goes through the high threshold. A third terminal to ANDgate A67 is connected to line 253 which goes high when the incoming signal passes through its low threshold. Since these signals are treated the same hereafter, the following is directed to the positive phase measurement. A high in line 250 causes the output of ANDgate A68 to go high. This causes the output of NORgate N51 to go low. NORgate N51 is connected by line 583 to open collector inverter I77 to line 588. Line 588 is connected to a positive voltage source through resistor R191 and to ground through resistor R192 and variable resistor VR18. Line 588 is connected through resistor R193 to line 581. Line 581 is connected through resistor R194 and variable resistor VR19 to a negative source. The value of resistors R191 through R194 are selected so that the voltage in line 581 is two volts when there is a high signal passing through ANDgate A68 and zero volts when there is a low signal passing through ANDgate A68. Thus line 581 alternates between two volts during the time that the incoming signal is above the high threshold and zero volts during the time the incoming signal is below the high threshold. This two-to-zero volt digital signal is connected through switch SW47 in FIG. 31 to line 90. Line 90 goes through high level switch S11 and low level switch S10 in FIG. 15 into line 87. Line 87 goes into the A to D converter in FIG. 17. This signal is averaged by capacitor C18 and C19 and by the time it reaches the operational video amplifier or integrator OA5. In addition, any fluctuations in the signal going into operational video amplifier OA5, is averaged over the integration process. The voltage measured is the average at the time the signal is above the high threshold. Sine the digital signal which is averaged fluctuates between zero and two volt and the counted frequency is 500,000 hertz, the average voltage can be expressed in percentage.

When a start signal appears from the A to D converter in line 162, ANDgate A8 in FIG. 20 passes a signal into NORgate N56 into line 240. this causes a high gate signal to occur in line 371. This gate enables NANDgate NA16 and NA17 in FIG. 22. Both NANDgate NA16 and NA17 are controlled by high or low status of line 400. The signal in line 400 is high since line 231 is rendered high when the duty cycle switch SW19 in FIG. 33 is activated. This high disables NANDgate NA28 in FIG. 23 and causes line 400 to be low. Referring back to FIG. 22, the low in line 400 disables NANgate NA16 and enables NANDgate NA17. The other input to NANDgate NA17 is the count signal at line 401. The count signal going into NANDgate NA17 is determined by clock circuit in FIG. 25. Line 528 to ANDgate A50 is low since the frequency switch SW20, the AC voltage switch SW18 and the DC voltage switch SW17 have not been activated. This causes line 566 to be low and 567 to go high. A high in line 567 causes data select switch DSW12 to connect line 564 with line 569 and line 565 with line 568. Line 564 is connected to output of NANDgate NA30 and line 565 is connected to the output at NANDgate NA31. The high in line 231 disables NANDgate NA31 and enables NANDgate NA30. The other input to NANDgate NA30 is connected through inverter I60 to line 526. Line 526 is high since the AC volt switch, the DC volt switch and the high or low level switches have not been activated. This causes the output of NANDgate NA30 to be high. A high in line 564 and a low in line 565 causes data select switch DSW10 to connect the count signal line 579 with line 570. Line 570 is connected to divider DIV8 which supplies a 500 kilohertz signal. This 500 kilohertz signal passes through NANDgate NA17 in FIG. 22 and through NORgate N35 into line 410. Line 410 then goes to the counters which count the 500 kilohertz signal during the duration that the gate in line 371 is high.

In determining the decimal location, the duty cycle switch SW19 is activated. This causes line 464 to be low and the output of NORgate N47 in FIG. 23 to go high. NORgate N47 is connected through ORgate O13 to line 532. Data select switch DSW6 connects line 532 with line 495. Line 495 is connected to ANDgate A47. When a low signal appears in line 429 a signal passes through ANDgate A47 and causes line 451 to go low. When line 429 goes low transistor T22 in FIG. 27 conducts and lights the decimal point in display DS4.

FREQUENCY

When the frequency function is measured, switch SW20 in FIG. 33 is depressed. This causes line 470 to go low. Line 470 is connected to NORgate N38 and ORgate O10 in FIG. 19. ORgate O10 is connected through Inverter I44 to line 230. A low in line 470 causes line 230 to go high. The output of NORgate N38 is connected to ANDgate A41. A low in line 470 enables ANDgate A41. The other input to ANDgate A41 is connected to line 336 and through inverter I40 to the output at NORgate N36. One input to NORgate N36 is line 464 which is high whenever the duty cycle switch SW19 is inactive. Another input to NORgate N36 is line 463 which is connected through inverter I39 to the high and low level switches SW10 and SW11. Since the high and low level switches have not been activated line 463 is high. The other input to NORgate N36 is connected by line 462 through inverter I38 to voltmeter function line 266. Since voltmeter function switches S14 through S18 in FIG. 33 have not been activated line 266 is low and line 462 is high. Thus, all three inputs to NORgate N36 are high causing line 475 to be low and line 336 to be high. This causes a high signal to pass through ANDgate A41 into line 454. FIG. 19, the high in line 454 goes through ORgate O14 in FIG. 23. This causes a high in line 537 and a low through inverter I55 at line 538. The low in line 538 disables ANDgate A70 in FIG. 24. The high in line 454 also enables ANDgate A43 and ANDgate A44 in FIG 19. Another input to ANDgate A44 is connected by line 468 to an auxiliary input switch. This line is always high unless an auxiliary unit is employed. Auxiliary line 468 is also connected to ANDgate A43 through inverter I43 at line 474. A low in line 474 disables ANDgate A43. Since both inputs to ANDgate A44 are high, a high signal passes into line 578. Line 578 enables ANDgate A69 in FIG. 24. Another input to ANDgate A69 is connected through inverter I75 to line 583. Line 583 is connected through NORgate N51 to the outputs of ANDgates A68, A67, A66 and A65. One input to ANDgate A68 is connected to the positive phase slope switch SW48. Since this switch has not been acitvated line 251 is high. The other input to ANDgate A68 is connected to TRC switch by line 580. Since the TRC switch has not been activated line 580 is high. The third input to ANDgate A68 is line 250. Line 250 goes high whenever the input signal passes through its high threshold voltage. when this occurs, a signal passes through ANDgate A68, NORgate N51, inverter I75 and puts a high on the other input to ANDgate A69. A signal passes through ANDgate A69 and through NORgate N52 into line 401. This signal, which is the count signal, passes into NANDgate NA17 in FIG. 22.

Another input to NANDgate NA17 is connected through inverter I24 to line 400. Line 400 is connected to NANDgate NA28 in FIG. 23. ONe input to NANDgate NA28 is connected by line 465 to the output of ORgate O17. Since coincidence B to C switch SW26, interval B to C switch SW25, slope switch SW22 and width switch SW21 have not been activated, the output of ORgate O17 is high. This disables ANDgate NA28 and causes line 400 to be low. This low enables NANDgate NA17 in FIG. 22 and allows the count signal in line 401 to pass through NANDgate NA17 into the counting circuit when the gate signal in line 371 is high.

The gate signal at line 371 will go high when a start latch signal occurs in line 240 and will go low when a stop latch signal occurs in line 245. Line 240 and 245 are connected to the outputs of NORgate N56 and N57 in FIG. 20. NORgate N56 is connected to NANDgates A7, A8 and A9 and NORgate N57 is connected to ANDgates A10, A11 and A12. Because line 231 is low it disables NANDgate A8 and NANDgate A11. Since line 230 is high when the frequency switch SW20 is activated, ANDgates A10 and A9 are enabled. ANDgate A9 and ANDgate A10 are connected by line 235 to NORgate N55. NORgate N55 is connected to ANDgate A5 by line 233 and to ANDgate A6 by line 234. ANDgate A5 is connected to an auxiliary input connector through line 227 for the selection of an external time base. If an external time base is not being used, line 227 is high which enables ANDgate A5. Line 227 is connected to inverter I6. The output of inverter I6 is connected by line 228 to the input of ANDgate A6. The low in line 228 disables ANDgate A6. The other side of ANDgate A6 is connected by line 229 to the external time base. Enabled ANDgate A5 is connected through line 226 to data select switch DSW11 in FIG. 25. Data select switch DSW11 is controlled by control lines 569 and 568 from analog switch ASW3.

When the frequency switch SW20 is activated line 470 goes low. A low in line 470 causes NORgate N49 in FIG. 23 to go high at line 528. Line 528 enables ANDgate A50 in FIG. 25. The other input to ANDgate A50 is connected by line 526 to the output of NORgate N46 in FIG. 23. Since the AC voltage switch SW18, and the DC voltage switch SW17 have not been activated, line 499 is low causing NORgate N46 at line 526 to go high. A high in line 526 causes a signal to pass through ANDgate A50 in FIG. 25 into analog switch ASW3. This causes analog switch ASW3 to connect line 569 with line 554 and line 568 with line 553. Lines 554 and 553 are connected to the outputs of flipflops FF1 and FF2 respectively in FIG. 29. After the transfer signal occurs, flipflops FF1 and FF2 will reset. This causes line 545 in flipflop FF1 to be low and line 554 to be high. It also causes line 552 in flipflop FF2 to be low and line 553 to be high. A high in both lines 553 and line 554 passes through data analog switch ASW3 and into lines 568 and 569 respectively. Highs in these lines cause data select switch DSW11 to connect line 574 with line 226. Line 574 goes to divider DIV6 and is connected to the one hertz clock output.

The one hertz signal passes through ANDgate A5, through NORgate N55 and into ANDgates A9 and A10. Signals pass through both ANDgates into NORgate N56 and N57. The signal from NORgate N56 passes by line 240, into the start latch circuitry and simultaneously, the signal from NORgate N57 passes by line 245 into the stop latch circuitry. The signal in line 240 causes a gate signal in line 371 to go high. The simultaneous signal in line 245 does not pass through NANDgate NA15 until a short delay has occurred from the input signal. When the next one hertz signal occurs, a signal passes again through lines 240 and 245. This time the signal in line 245 passes through NANDgate NA15 and causes the gate signal to cease.

During the period a gate signal is high in line 371 the number of times the incoming signal passes through its high threshold voltage is counted in counters CO1 to CO5. The decimal location is determined by the status of the flipflops FF1 and FF2 in FIG. 29. Line 545 from flipflop FF1 is connected to data select switch DSW8. Line 553 from flipflop FF2 is connected to another terminal in data select switch DSW8. Line 545 is low and line 553 is high. Data select switch DSW8 is controlled by a low in line 539. Line 539 is connected through inverter 160 to line 526 in FIG. 25. Since line 526 is high as discussed supra, line 539 is low. This enables the output of data select switch DSW8 which is low in line 549, high in lines 550 and low in line 551. Line 549, 550 and 551 go to data select switch DSW9. This data select switch is controlled by lines 539 which is low as discussed above, and by lines 526 which is high also discussed supra. Data select switch DSW9 connects lines 549 with line 482, line 551 with line 483, line 550 with line 484 and line 485 with ground. The high in line 550 causes line 484 to go high. Line 482 through 485 are connected to data select switch DSW6 in FIG. 23.

Data select switch DSW6 is controlled by line 528 and line 529. Line 528 is connected to NORgate N49. Since the frequency switch SW 20 has been activated line 470 is low causing line 528 to go high. This instructs data select switch DSW6 to connect lines 482 through 485 with lines 493 through lines 496 respectively. Since line 484 is positive it enables NANDgate N47. When a negative signal appears in line 429 from the multiplex data select switch DSW15, a signal goes through NANDgate N47 and causes line 451 to go low. When line 429 goes low it turns on transistor T22 in FIG. 27 and lights the decimal point in display DS4.

If a 2 × 10$^5$ carry signal occurs at line 540 then ANDgate A49 in FIG. 29 is enabled. Another input to ANDgate A49 is connected through inverter I59 and ORgate O15 to lines 545 and line 552. Since both lines 545 and lins 552 are low this causes line 543 to be high and ANDgate A49. When the next transfer signal occurs, line 203 sends a high signal through ANDgate A49 into flipflop FF1. This causes line 545 to go high and line 554 to go low. The low signal in line 554 does not change the state in flipflop FF2. Since line 554 went low the signal to data select switch DSW11 in FIG. 25 causes the switch to connect line 199 with line 226. Line 199 is connected to the 10 hertz terminal of divider DIV5. This causes the gate to go high when the first pulse occurs and to go low when the second pulse of the 10 hertz signal occurs.

The decimal place is relocated since line 545 went high. A high in line 545 and a high in line 553 codes data select switch DSW8 in FIG. 29 to apply a low in line 549, a low in line 550 and a high in line 551. The high in line 551 goes through data select switch DSW9 into line 483. A high in line 453 causes line 494 to go high. A high in line 494 enables ANDgate A46 in FIG. 23. When negative pulse occurs in line 428 from the multiplexing data select switch DSW15, line 451 goes low. A negative pulse in line 428 causes display DS5 in FIG. 27 to light the decimal point.

If an additional $2 \times 10^5$ carry signal occurs, another signal passes through ANDgate A49 into flipflop FF1 in FIG. 29. This causes line 545 to go low and line 554 to go high. A high in line 554 causes flipflop FF2 to change state. When this occurs line 552 goes high and line 553 goes low. Since line 553 is now low and line 554 is high, data select switch DSW11 in FIG. 25 connects line 573 to line 226. Line 573 is connected to the 100 hertz terminal of divider DIV4. The gate signal in line 371 goes high when the first pulse from the 100 hertz signal occurs and goes low when the second pulse from the 100 hertz signal occurs.

The low in line 545 and the low in line 553 cause data select switch DSW8 to put a high in line 549, a low in line 550, and a low in line 551. A high in line 549 causes line 482 to go high which in turn causes line 493 in FIG. 23 to go high. The high in line 493 enables ANDgate A45. When a negative pulse occurs in line 427, a signal passes through ANDgate A45 and causes line 451 to go low. The negative signal line 427 also causes transistor T25 to conduct thereby lighting the decimal point in display DS6.

If a $2 \times 10^5$ carry signal occurs again, flipflop FF1 changes state causing line 545 to go high and line 554 to go low. Since line 553 and line 554 are low this causes data select switch DSW11 in FIG. 25 to connect line 572 to line 226. Line 572 is connected to the one kilohertz terminal in divider DIV3. Thus, the gate signal in line 371 goes high when the first pulse from the one kilohertz signal occurs then goes low when the second pulse from one kilohertz signal occurs.

A high in line 545 and a low in line 553 codes data select switch DSW8 to make lines 549 low, line 550 low and line 551 low. Since there is no high signal going to the decimal point logic circuit, the display does not light any decimal points. Also, since line 545 is high and line 552 is high, a high signal passes into inverter I59 which disables ANDgate A49. Since ANDgate A49 is disabled, and subsequent $2 \times 10^5$ carry signal will not pass through ANDgate A49.

MULTIPLE CHANNEL FUNCTIONS

In the multiple channel functions (channels A, B and C) the high and low thresholds for the B & C channels must be established. When switch SW12 in FIG. 30 is in the 3 or 30 volt position, a positive voltage passes through switch SW12 into line 625. Line 625 is connected to a negative voltage source through resistor R238. Thus, when switch SW12 is not in the 3 or 30 volt position, line 625 is pulled low by the connection through resistor R234 to the negative voltage source. Line 625 is connected to analog switch ASW4. A positive signal in line 625 causes analog switch ASW4 to connect line 637 with line 635 and line 638 with line 634. Line 634 is connected through resistor R243 to the arm of variable resistor VR22 and to grounded resistor R244. Variable resistor VR22 is connected to a positive voltage source by line 648 and to a negative voltage source by line 649. By adjusting the arm on variable resistor, the voltage in line 634 may be adjusted. Line 635 is connected through resistor R247 to the variable arm of variable resistor VR23. VR23 is connected to the positive voltage source by line 648 and to the negative voltage source by line 649. By adjusting the arm in variable resistor VR23 the voltage in line 635 may be adjusted.

Line 627 from data select switch DSW14 is connected to the negative input and to the output of voltage follower VF8. Line 627 is also connected through resistor R249 into line 639. Any AC signal in line 637 is removed by grounded capacitor C91. Line 639 is connected to the positive input of voltage follower VF10. Line 639 is also connected to grounded resistor R251 and grounded capacitor C85 which reduces the voltage in line 639. The output of voltage follower VF10 in line 602 is connected to its negative input. The other line from analog switch ASW4 line 628, is connected to the negative input and to the output of voltage follower VF9. Line 638 is connected to grounded capacitor C92 to remove any AC voltage. Line 628 is connected through resistor R248 to line 640. Line 640 is connected to the positive input of voltage follower VF11. Line 640 is also connected to grounded resistor R250 and grounded capacitor C86. To reduce the voltage in line 640. The output of voltage follower VF11 in line 603 is connected to its negative input so that the voltage in line 603 follows the voltage in line 640. Line 627, which is the high threshold voltage, is also connected through resistor R236 to the input signal in channel B at line 626 and also through resistor R233 to the input signal in channel C at line 624. Line 628, which is the low threshold voltage, is connected through resistor R235 to the input signal in B channel at line 626 and through resistor R234 to the input signal in C channel at line 624. Thus, if fuse 2 or fuse 3 is blown or if there is no signal in channel C and B, a voltage will occur in line 621 of B channel and line 629 of C channel which is middistance between high and low threshold voltages. The signal in line 627 and line 628 do not effect the input signal in channel B and channel C because of the high resistance values in resistors R233, R234, R235 and R236.

Line 602 which carries the high threshold voltage for channel B and C, is connected to B and C threshold switch SW6 in FIG. 15. Line 603, which carries the low threshold voltage for channels B and, C is also connected to the B and C threshold switch SW6. When the threshold voltage in these channels is to be determined, switch SW6 is activated. This causes a signal in line 602 to pass through line 88 to the high level switch SW11. It also allows the signal in line 603 to pass through line 84, switch SW5, and line 85 to the low level switch SW10. When the high threshold voltage is desired the high level switch SW11 is depressed. This allows the signal to pass through line 101 and switch SW10 into line 87. Line 87 is connected to the A to D converter. From here the signal is processed in the same manner as the high peak voltage in A channel previously discussed. When the low threshold voltage is desired, switch SW10 is depressed. This allows the low threshold signal in line 86 to pass directly into line 87. The variable resistors VR23, and VR22 can be adjusted so that the high and low threshold voltages are in the proper position.

Figure 34:
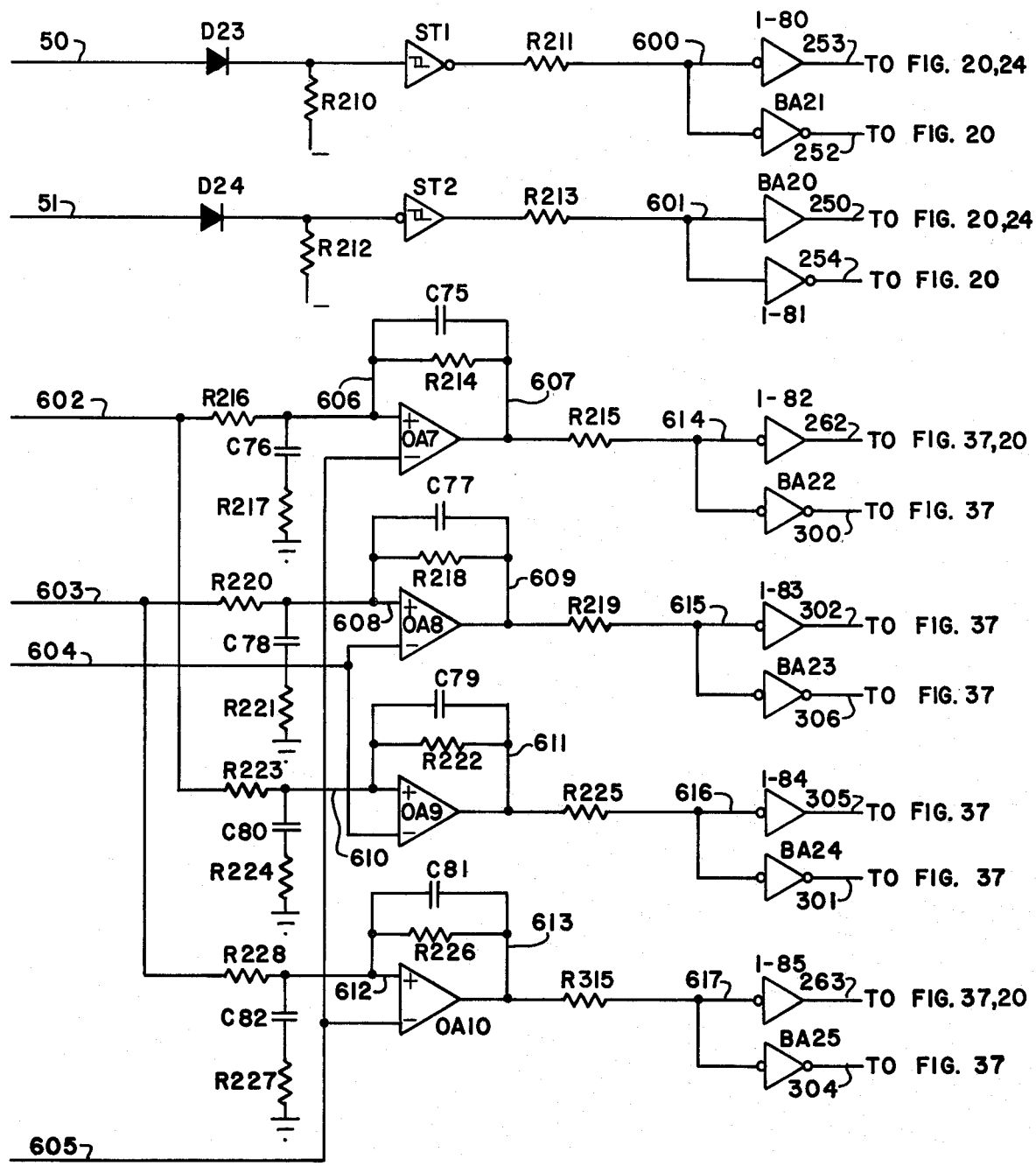
FIG. 34 depicts a schematic representation of the high and low threshold detector circuitry

High threshold voltage line 602 is connected through resistor R216 to line 606 and through resistor R223 to line 610 in FIG. 34. Line 606 is connected to the positive input of operational amplifier OA7, line 610 is connected to the positive input of operational amplifier OA9. Low threshold voltage line 603 is connected through resistor R220 to operational amplifier OA8 and through resistor R228, the positive input of operational amplifier OA10. The negative input of operational amplifier OA7 and the negative input of operational amplifier OA10 is connected to line 605. Line 605 carries the incoming signal in channel B from high impedance buffer amplifier HBA2. The negative input of operational amplifier OA8 and the negative input of operational amplifier OA9 are connected to line 604. Line 604 is the incoming signal in C channel, from high impedance buffer amplifier HBA1.

When the incoming signal in line 605, B channel, goes through its high threshold voltage to a higher voltage the output of operational amplifier OA7 goes low. The output of operational amplifier OA7 is connected by line 607 through resistor R215 to line 614. Line 607 is also connected through resistor R214 and through capacitor C75, the input of operational amplifier OA7 at line 606. Capacitor C75 and resistor R214 force operational amplifier OA7 to go low very rapidly when the high threshold voltage is attained. Line 614 is connected through inverter I82 to line 262 and through buffer amplifier BA22 to line 300. When the signal in B channel goes through its low threshold voltage to a lower voltage the output of operational amplifier OA10 at line 613 goes high. Line 613 is connected through resistor R315 to line 617. Line 613 is also connected through capacitor C81 and through resistor R226 to the positive input of operational amplifier OA10. Capacitor C81 and resistor R226 force operational amplifier OA10 to go high rapidly when the signal in line 605 goes through its low threshold voltage to a lower voltage. Line 617 is connected through inverter I85 to line 263 and through buffer amplifier BA25 to line 304.

When the incoming signal in C channel goes through its high threshold voltage to a higher voltage operational amplifier OA9 goes low. Operational amplifier OA9 is connected by line 611 through resistor R225 to line 616. Line 611 is also connected through capacitor C79 and resistor R222 to the positive input of operational amplifier OA9. Capacitor C79 and resistor R222 force operational amplifier OA9 to go low rapidly when the incoming signal goes through its high threshold. Line 616 connected through inverter I84 to line 305 and through buffer amplifier BA24 to line 301. When the incoming signal in C channel goes through its low threshold voltage to a lower voltage operational amplifier OA8 goes high. The output of operational amplifier OA8 is connected through resistor R219 to line 615. Line 609 is connected through capacitor C77 and through resistor R218 to the positive input of operational amplifier OA8. Capacitor C77 and resistor R218 force operational amplifier OA8. Capacitor C77 and resistor R218 force operational amplifier OA8 to go high rapidly when the incoming signal in line 604 goes through its low threshold voltage to a lower voltage. Line 615 is connected through inverter I83 to line 302 and through buffer amplifier BA23 to line 306. Thus, line 262 goes high and line 300 goes low when the signal in B channel goes through its high threshold voltage to a higher voltage. Line 263 goes low and line 304 goes high when the signal in B channel passes through its low threshold voltage to a lower voltage. Line 305 goes high and line 301 goes low when the signal in C channel passes through is high threshold voltage to a higher voltage. Line 302 goes low and line 306 goes high when the signal in C channel goes through its low threshold voltage to a lower voltage. The above is reversed when the incoming signals in B and C channels go through its high threshold voltage to a lower voltage. These signals are processed in accordance with which function has been chosen.

INTERVAL B TO C

Interval B to C is a measurement of the duration between an event which occurs on B channel and a following event which occurs on C channel. In this measurement, the interval B to C switch SW25 in FIG. 33 is depressed which causes line 492 to go low. The positive phase or negative phase for B channel must be selected. If the negative phase is selected switch SW49 is depressed causing line 307 to go low. The positive or negative phase for C channel must also be selected. If the negative phase is also selected switch SW50 is depressed causing line 308 to go low. Switch SW49 and SW50 are shown in FIG. 35. A low in line 307 disables ANDgate A32 in FIG. 37 and enables ANDgate A31 through inverter I12. A low in line 308 disables ANDgate A34 and enables ANDgate A33 through inverter I13. When a incoming signal in B channel goes through its low threshold voltage to a lower voltage line 304 goes high and passes the signal through ANDgate A31 and into NORgate N20. This causes line 257 to go low. Line 257 is connected to data select switch DSW2 in FIG. 20. Data select switch DSW2 is controlled by lines 260 and 261. These lines are connected to NORgates N40 and N41 in FIG. 19 and are both low whenever the width switch SW21, the coincidence B to C switch SW26 and the slope switch SW22 in FIG. 33 have not been activated. The lows in line 260 and 261 cause data select switch DSW2 to connect lines 257 with line 248 and line 258 with line 249. The high signal passes through line 257 and line 248 and through inverter I7 to line 247. Line 247 is connected to ANDgate A7. The other side of ANDgate A7 is connected to line 232. Line 232 is connected through inverter I42 to NANDgate NA18 in FIG. 19. NANDgate NA18 is connected to NORgate N37. NORgate N37 is connected by line 465 to ORgate O17 in FIG. 23. Since the interval B to C switch SW25 has been activated, line 492 goes low, line 465 goes low which causes the output of NORgate N37 to be high. This enables NANDgate NA18 of FIG. 19. The other side of NANDgate NA18 is connected through inverter I40 to line 475. Line 475 is connected to the output of NORgate N36. One input to NORgate N36 is connected to the duty cycle switch SW19. Since that switch has not been activated line 464 is high. Another input to NORgate N36 is connected through inverter I39 to the high or low level switch. Since the high or low level switch has not been depressed line 332 is low causing line 463 to be high. The third input to NORgate N36 is connected through inverter I38 to the voltmeter function switches by line 266. Since none of the voltmeter functions (switches S14 through S18) have been selected line 266 is low which puts a high on the third input to NORgate N36. This causes line 475 to be low and line 336 to be high.

The output of NANDgate NA18 is therefore low which causes line 232 to be high. Back to FIG. 20. The high in line 232 enables ANDgate A7 and ANDgate A12. Thus, when the signal in B channel passes through its low threshold voltage to a lower voltage, a signal passes through ANDgate A7 into NORgate N56. The output of NORgate N56 goes through line 240 to the start latch circuitry in FIG. 21. This signal causes the gate signal in line 371 to go high. This high enables NANDgates NA16 and NA17 in FIG. 22. The other terminal to NANDgate NA17 is connected through inverter I24 to line 400. Line 400 is connected to NANDgate NA28 in FIG. 23. One input to NANDgate NA28 is line 465. This line is low since the interval B to C switch SW25 has been activated. Another input is line 231. This line is low since line 336 is high as previously discussed (FIG. 19). The third input to NANDgate NA28 is connected to the microsecond position of the time switch by line 486. If the microsecond time switch is selected, then line 400 is high and NANDgate NA16 in FIG. 22 is enabled. The third input to NANDgate NA16 is connected to a ten megahertz clock CL1. Thus, the signal going through NANDgate NA16 to the counters is a ten megahertz signal. The counters continue counting the ten megahertz signal until the gate signal in line 371 goes low.

Referring back to FIG. 37, ANDgate A33 has been enable by a low in line 308. The other input to ANDgate A33 is connected by line 310 to data select switch DSW4. Data select switch DSW4 is controlled by line 303. This line is connected to B and C common switch S6. Since signals in both B and C channels are being used switch SW52 in FIG. 35 has not be activated. This causes line 303 to be high. A high in line 303 causes data select switch DSW4 to connect line 305 with line 264, line 302 with line 265, and line 306 with line 310. A signal occurs in line 306 when the incoming signal in C channel goes through its low threshold voltage to a lower voltage. This signal goes through ANDgate A33 into NORgate N21. The low signal from NORgate N21 goes through line 258 to data select switch DSW2 in FIG. 20 and into line 249. This causes a positive signal in line 246, which passes through enabled ANDgate A12 and into NORgate N57. NORgate N57 is connected by line 245 to the stop latch circuitry. Thus, when the signal in C channel goes through its low threshold voltage to a lower voltage the gate signal in line 371 goes low, thus stopping the 10 megahertz signal to the counters. The counting, display and location of decimal point in this circuitry is the same as discussed above for the slope measurement in the A channel.

If the negative phase in B channel is not selected then switch SW49 is not activated and line 307 goes high. This enables ANDgate A32 and disables ANDgate A31. When the signal in B channel goes through its high threshold voltage to a higher voltage line 262 goes high and a signal passes through ANDgate A32. This passes a signal through the start latch circuitry and causes gate line 371 to go high. This gate line remains high until the signal in C channel goes through its low threshold voltage to a lower voltage at which time the gate signal ceases.

If the negative phase in C channel is not selected, then switch SW50 is not activated and line 308 goes high. The high in line 308 enabls ANDgate A34 and disables ANDgate A33. ANDgate A34 is connected to data select switch DSW4 by line 264. The data select switch DSW4 connects line 264 with line 305. Line 305 goes high when the incoming signal in the C channel goes through its high threshold voltage to a higher voltage. When this occurs, a signal passes through ANDgate A34 into the stop latch circuitry. This causes the gate signal in line 371 to go low.

COINCIDENCE B AND C

Coincidence B and C is a measurement of a duration defined as commencing after selective events have occurred on both channels B and C and terminating by an event on either channel B or channel C whichever occurs first. In this measurement, the coincidence B and C function switch SW26 in FIG. 33 is activated causing line 472 to go low. A low in line 472 causes a high out of both NORgates N40 and N41 in FIG. 19. NORgate N40 is connected to data select switch DSW2 by line 260 and NORgate N41 is connected to data select switch DSW2 by line 261. Since both line 260 and line 261 are high, data select switch DSW2 in FIG. 20 connects line 256 with line 248 and line 259 with line 249. Line 256 is connected through inverter I11 to line 321 and line 259 is connected through inverter I10 to line 322 in FIG. 37. Lines 321 and 322 are connected to data select switch DSW3. Data select switch DSW3 is controlled by lines 307 and 308. The positive phase in B channel is chosen then switch SW49 is not activated and line 307 is high. If the positive phase in C channel is chosen then switch SW50 is not activated and line 308 is high. The high in line 308 and 307 codes data select switch DSW3 so that line 321 is connected with line 316 and line 322 is connected with line 320. Line 316 is connected to the output of ANDgate A21 and line 320 is connected to ORgate O3. The inputs of ANDgate A21 are connected to lines 305 and 262. When the incoming signal in B channel passes through its high threshold voltage to a higher voltage line 262 goes high and enables ANDgate A21. When the incoming signal in C channel goes through its high threshold voltage to a higher voltage, line 305 goes high. This causes a signal to pass through ANDgate A21, through lines 316, and through DSW3 and inverter I11 into line 256 through data select switch DSW2 in FIG. 20 and into line 248. The signal in line 248 passes through inverter I7 into line 247 and to ANDgate A7. ANDgate A7 was enabled by high in line 232. Line 232 in high when repeat count switch SW23, single count switch SW24, duty cycle switch SW19, the high and low level switches SW10 and SW11 and the voltmeter function switches SW14 through SW18 have not been activated. The signal in line 247 passes through ANDgate A7 into NORgate N56. NORgate N56 is connected by line 240 to the start latch circuitry which causes a positive gate signal to appear in line 371. At this time the count signal as determined by the time switch SW56 passes into the counters. The particular clock signal is determined in the same manner as the clock signal in the interval B to C measurement.

The following is directed to receiving a stop signal. Referring back to FIG. 37, the inputs to ORgate 03 are connected to line 304 and to line 306. The signal occurs in line 304 when the incoming signal in B channel passes through its low threshold voltage to a lower voltage. A signal occurs in line 306 when the incoming signal in C channel passes through its low threshold voltage to a lower voltage. Either signal in line 304 or in 306 passes through ORgate 03 into line 320. This signal passes through line 259, through data select switch DSW2 in FIG. 20 and into line 249. The signal passes through inverter I8 into line 246. The signal passes through ANDgate A12 into NORgate N57. The output of NORgate N57 is connected to the stop latch circuitry and causes the gate signal in line 371 to go low. The counter begins counting the signals from the selected clock after the signal in B channel passes through its high threshold and after the signal in C channel passes through its high threshold. The counters cease counting when a signal in either C or B channel goes through its low threshold. The location of decimal point, counting circuit and display are the same as for the interval B to C measurement.

If the negative phase is chosen for B channel, switch SW49 is activated. This causes line 307 goes low. A low in line 307 and a high in line 308 causes data select switch DSW3 in FIG. 37 to connect line 319 with line 322, and line 315 with line 321. Line 319 is connected to the output of ORgate 04 and line 315 is connected to the output of ANDgate A22. The inputs to ANDgate A22 are connected to line 305 and to line 304. The inputs to ORgate 04 are connected to line 262 and line 306. When the incoming signal in B channel passes through its low threshold voltage to a lower voltage, line 304 goes high and enables ANDgate A22. When the incoming signal in C channel passes through its high threshold voltage to a higher voltage, line 305 goes high. This causes a signal to pass through ANDgate A22. This high goes through the start latch circuitry and causes the gate signal to go high in line 371. When the incoming signal in B channel goes through its high threshold voltage to a higher voltage or when the incoming signal in C channel goes through its low threshold voltage to a lower voltge a signal passes through ORgate 04. This signal goes through the stop latch circuitry and causes the gate signal in line 371 to go low.

If the negative phase is chosen for C channel, this causes line 308 to go low. The low in line 307 and low in line 308 causes the data select switch DSW3 in FIG. 37 to connect line 313 with line 321 and line 317 with line 322. Line 317 is connected to the output of ORgate 06 and line 313 is connected to the output of ANDgate A24. One input to ANDgate A24 is connected to line 306 and the other input to ANDgate A24 is connected to line 306 and the other input to ANDgate A24 is connected to line 304. When the incoming signal in B channel goes through its low threshold voltage to a lower voltage line 304 goes high and enables ANDgate A24. When the incoming signal in C channel goes through its low threshold voltage to a lower voltage, line 306 goes high causing the output of ANDgate A24 to go high. A high out of ANDgate A24 causes the gate signal in line 371 to go high. ORgate 06 is connected to line 262 and to line 305. When the incoming signal in B chanel passes through its high threshold voltage to a higher voltage line 262 goes high or when the incoming signal in C channel passes through its high threshold voltage to a higher voltage the output of ORgate 06 goes high. When ORgate 06 goes high, it causes the gate signal in line 371 to go low and stops the counting by the counters.

If the negative phase in C channel is selected is activated and if the positive phase in B channel is selected switch SW49 is not activated. This makes line 307 high and line 308 low. This causes data select switch DSW3 to connect line 322 with line 318 and line 321 with line 314. Line 314 is connected to the output of ANDgate A23 and line 318 is connected to the output of ORgate 05. ANDgate A23 is activated by the incoming signal in C channel going through its low threshold voltage to a lower voltage and the incoming signal in B channel going through its high threshold voltage to a higher voltage. When both of these events occur, the gate signal in line 371 goes high. A signal passes through ORgate 05 when either the incoming signal in B channel passes through its high threshold voltage to a lower voltage or the incoming signal in C channel passes through its high threshold voltage to a higher voltage. When either of these events occur the gate signal in line 371 goes low.

SINGLE COUNT

The single count is the totalization of the number of either positive or negative phases of a digital input signal occurring on Channel A during a time increment commencing with an event on channel B and terminating with an event on channel C. In this measurement, the single count switch SW24 in FIG. 33 is activatd. This causes line 333 to go low. The B and C common switch SW32 in FIG. 35 is not activated, causing line 303 to go high. Line 303 is connected to data select switch DSW4 in FIG. 37. The high in line 303 causes DSW4 to connect lines 264 with line 305, line 265 with line 302, and line 310 with line 306. If the positive phase for B channel and C channel is selected switch SW49 and SW50 are not activated. This causes lines 307 and 308 to go high. The high signal in line 307 enables ANDgate A32 and the high signal in line 308 enables ANDgate A34. The other input to ANDgate A32 is connected to line 262. When incoming signal in B channel passes through its high threshold voltage to a higher voltage, line 262 goes high. This causes a high signal to pass through ANDgate A32 into line 324. This signal passes through NORgate N20 and causes line 257 to go low. Line 257 is connected to data select switch DSW2 as shown in FIG. 20. Data select switch DSW2 is controlled by lines 260 and 261 from FIG. 19. Line 260 and 261 are low when the width switch SW21, coincidence B to C switch SW26, and slope switch SW22 have not been activated. A low in control lines 260 and 261 causes data select switch DSW2 to connect line 248 with line 257 and line 249 with line 258. Line 248 is connected through inverter I7 to ANDgate A7. The other side of ANDgate A7 is connected to line 232. This line is high since the single count switch SW24 is activated. Thus, a signal passes through ANDgate A7 into NORgate N56. NORgate N56 is connected to the start latch circuitry. When a signal passes through NORgate N56, the gate signal in line 371 in FIG. 22 goes high. This enables NANDgate NA16 and NANDgate NA17. NANDgate NA17 connected through inverter I24 to NANDgate 28. The output of NANDgate NA28 is low whenever the coincidence B to C switch SW26, interval switch SW25, slope switch SW22 width switch SW21 and the voltmeter switches SW14 through SW18 have not been activated. Since this is the case, NANDgate NA17 will pass the count signal from line 401.

The count signal in line 401 comes from the output of NORgate N52 in FIG. 24. The input to NORgate N52 is connected to the outputs of ANDgate A71 and ANDgate A69. ANDgate A71 is for an auxiliary input signal and is disabled unless an auxiliary clock switch and clock signal are employed. ANDgate A70 is connected to a clock signal by line 579 and to a function signal by line 538. Line 538 is connected through inverter I55 to the output of ORgate 014 in FIG. 23. One input to ORgate 014 is connected by line 454 which is connected to the output of ANDgate A41 in FIG. 19. One input to ANDgate A41 is connected to line 336, which goes high whenever the duty cycle switch SW19, the high and low level switches and the voltmeter switches SW14–SW18 are not activated. Another input to ANDgate A41 is connected to the output of NORgate N38. NORgate N38 is connected by line 470 to the frequency switch SW20. Since this switch has not been activated line 470 is high. Another input to NORgate N38 is line 467. This line is high when the repeat count switch SW23 is not activated. The third input to NORgate N38 is connected to line 333. This line is low when the single count swithc SW24 is activated. A low in line 333 causes the output of NORgate N38 to go high. This causes line 454 to be high and line 538 to be low in FIG. 23. The low in line 538 disables ANDgate in FIG. 24.

ANDgate A69 is connected to line 578, which is high when line 454 is high and there is no auxiliary input. The high in line 578 enables ANDgate A69. The other input to ANDgate A69 is connected through inverter 175 to line 583. Line 583 is connected to the output of NORgate N51. The input of NORgate N51 is connected to ANDgates A68, A67, A66 and A65. When the positive phase of the signal in A channel is selected switch SW48 is not activated. This causes line 251 to be high and line 255 to be low. This enables ANDgate A68 and doubles ANDgate A67. Another input to ANDgate A68 is line 580 which is connected to the TRC switch SW51. Since this switch is not activated line 580 is also high. The third input into ANDgate A68 is line 250. Line 250 goes high when the signal in A channel passes through its high threshold voltage to a higher voltage. Thus, each time the signal in A channel passes through its high threshold voltage to a higher voltage a signal passes through ANDgate A68, NORgate N51, ANDgate A69, NORgate N52 and into the count signal line 401. This signal then goes through NANDgate NA17 when the gate signal is high and through NORgate NA35 to the counters. The counters count the number of times the incoming signal in A channel goes through its high threshold voltage to a higher voltage, until the gate signal in line 371 goes low. Since this is a pure counter function there is no decimal point logic for the circuitry.

If there is a $2 \times 10^5$ carry signal it passes through line 540 and buffer amplifier BA13 into line 557 in FIG. 29. Line 557 is connected to ANDgate A64. Another input to ANDgate A64 is connected through inverter I58 to line 555. Line 555 is low since line 231 is low as discussed supra. This enables ANDgate A64. The third input to ANDgate A64 is connected to divider DIV6 by line 558. This line is high for 200 milliseconds and low for 800 milliseconds. During the period that this line is high, a signal pases through ANDgate A64, and resistor R183 into ORgate O16. ORgate O16 is connected by line 561 to the base of transistor T28. The high in line 561 causes transistor T28 to conduct and causes the collector to go low at line 447. The low in line 447 causes light emitting diode LED8 in FIG. 27 to light. This light represents an overflow of the system. p The single count function will not continuously sample the frequency on the A channel. The first signal going through the channel will close the internal count gate and inhibit further channel A pulses from being accumulated. When the single counts switch SW24 is activated, line 333 is low. Line 333 is connected to NANDgate NA13 in the start/stop latch circuitry shown in FIG. 21. The other input to NANDgate NA13 is connected to line 231 which is low as previously discussed. This causes the output of NANDgate NA13 to be high at line 357. A high in line 357 disables NANDgate NA12 and prevents a reset signal from occuring. However, the information from the counters CO1 through CO6 must be transferred to the decoders De1 through De6 by a transfer signal. This is accomplished by connecting line 357 through resistor R142 to ORgate O9. A high in ORgate O9 causes transistor T14 to conduct. The collector of transistor T14 is connected to inverter I22 and provides a constant signal in transfer line 203. With a continuous transfer signal in line 203, the display will continuously follow the accumulation of signals in the counters.

Figure 21:
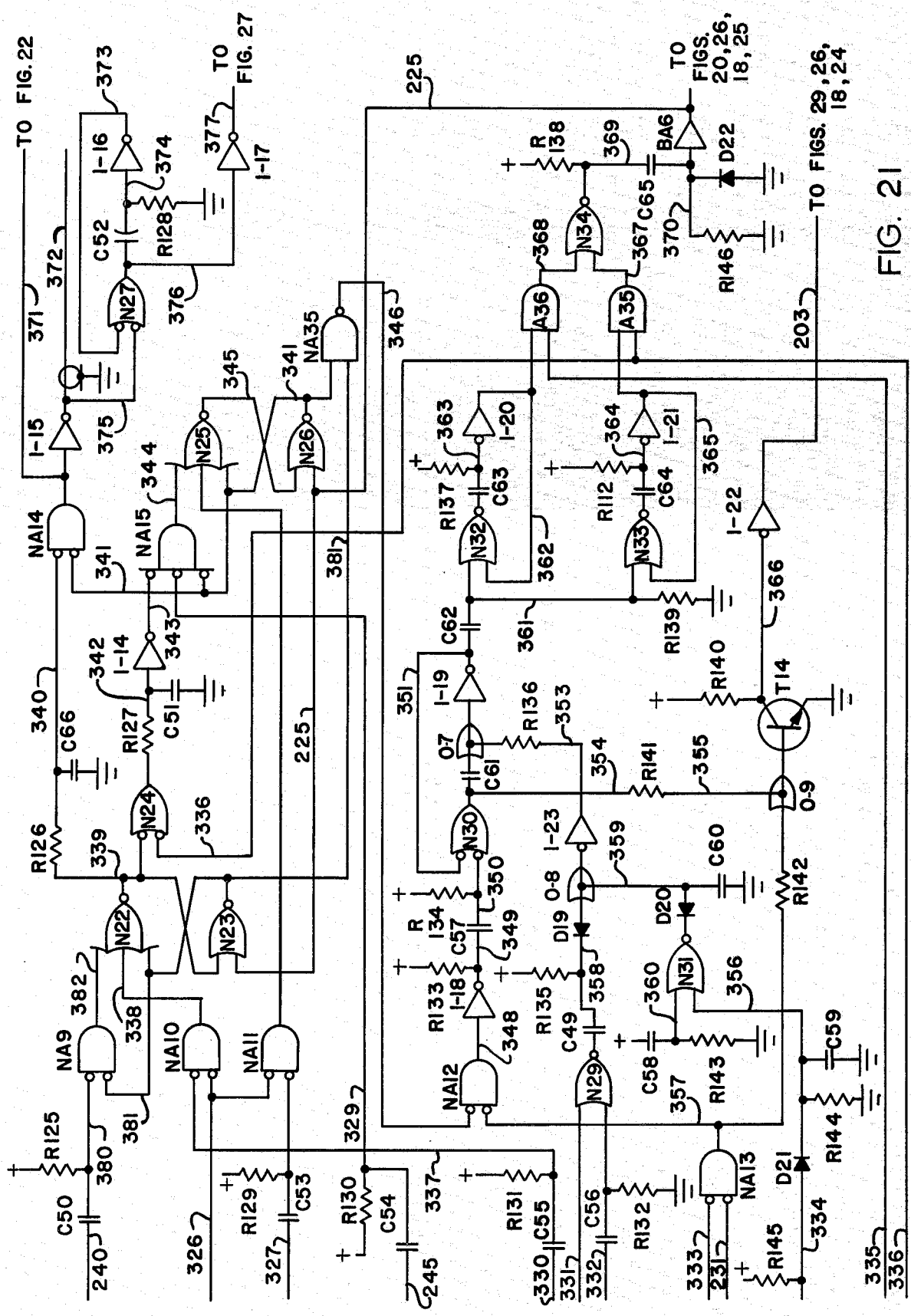
FIG. 21 depicts a schematic representation of the gate control circuitry and the transfer and reset signal circuitry.

The start and stop latch circuitry can be operated manually. In the start latch circuitry as shown in FIG. 21 line 326 from FIG. 19 is low and enables NANDgate NA10 and NANDgate NA11. The other input to NANDgate NA10 is connected by line 337 to capacitor C55 and to a positive voltage source through resistor R131. The other side of capacitor C55 is connected to the manual start switch SW53 by line 330. When the manual start switch SW53 is depressed a signal passes through capacitor C55 and causes line 337 to go low. This causes a pulse from NANDgate NA10 to enter NORgate N22 and manually starts the gating circuitry. The other input of NANDgate NA11 is connected to capacitor C53 and to a positive voltage source through resistor R129. Capacitor C53 is connected through line 327 to the manual stop switch SW54. When the manual stop switch SW54 is activated a low edge goes through capacitor C53 to NANDgate NA11. This causes NANDgate NA11 to pass a pulse into NORgate NA25 and stop the gate signal.

REPEAT COUNT

Repeat count is the totalization of the number of either positive or negative phases of a digital input signal occuring on channel A during a time increment commencing on channel B and terminating with an event on channel C. The count measurements on channel A for the B and C interval will be automatically taken on a continual recycling basis and the display will be updated at the end of each measurement. The repeat count function is the same as the single count function except that NANDgate NA13 in the start latch stop latch circuitry of FIG. 21 is disabled. This allows the transfer and reset signals to continually update the display and resample the input signal.

TRC COUNT

TRC count is the measurement of the total number of transistions of both positive and negative slopes occurring on the incoming signal in A channel during interval commencing with an event on B channel and terminating with an event on either B or C channel as selected. To measure the TRC count either the repeat count function switch SW23, if a continual and automatic recycling and retesting is desired, or single count switch SW24, if just one measurement at a time is desired, is activated. This would cause either line 333 to go low, if single count is selected or line 467 to go low if repeat count is selected. The B and C separate/common switch SW52 should be activated if the start and stop signals are to be derived from channel B. Switch SW52 should not be activated if the start signal is to occur on channel B and the stop signal is to occur on channel C. For purposes of illustration only switch SW52 will be activated thereby causing line 303 to go low. The positive phase switch SW49 for B channel will be activated if a negative signal in line B is to start the TRC accumulation. If a positive signal in line B is to be used to start the TRC accumulation switch SW49 should not be activated. The positive phase switch SW50 for C channel should be activated if a negative signal in line B is to be used to stop the TRC accumulation. If a positive signal in channel B is to be used to stop the TRC accumulation then switch SW50 should not be activated. For the purpose of this discussion switches SW49 and SW50 will not be activated. Thus, under these circumstances the positive signal in channel B will start the TRC accumulation and the next positive signal in channel B will stop the accumulation. Since switches SW49 and SW50 in FIG. 35 have not been activated lines 307 and 308 are high. These highs enable ANDgate A32 and ANDgate A34 in FIG. 37. ANDgate A32 is connected to line 262. When the incoming signal in B channel goes through its high threshold voltage to a higher voltage line 262 goes high. This will cause ANDgate A32 to pass a high signal through NORgate N20 into line 257. Line 257 goes through data select switch DSW2 in FIG. 20 into line 248. The signal in line 248 goes through ANDgate A7 into NORgate N56. The output of NORgate N56 is connected to the start latch circuitry. When the output of NORgate N56 goes low, the gate signal in line 371 goes high. The gate signal will continue high until a stop signal occurs.

Figure 37:
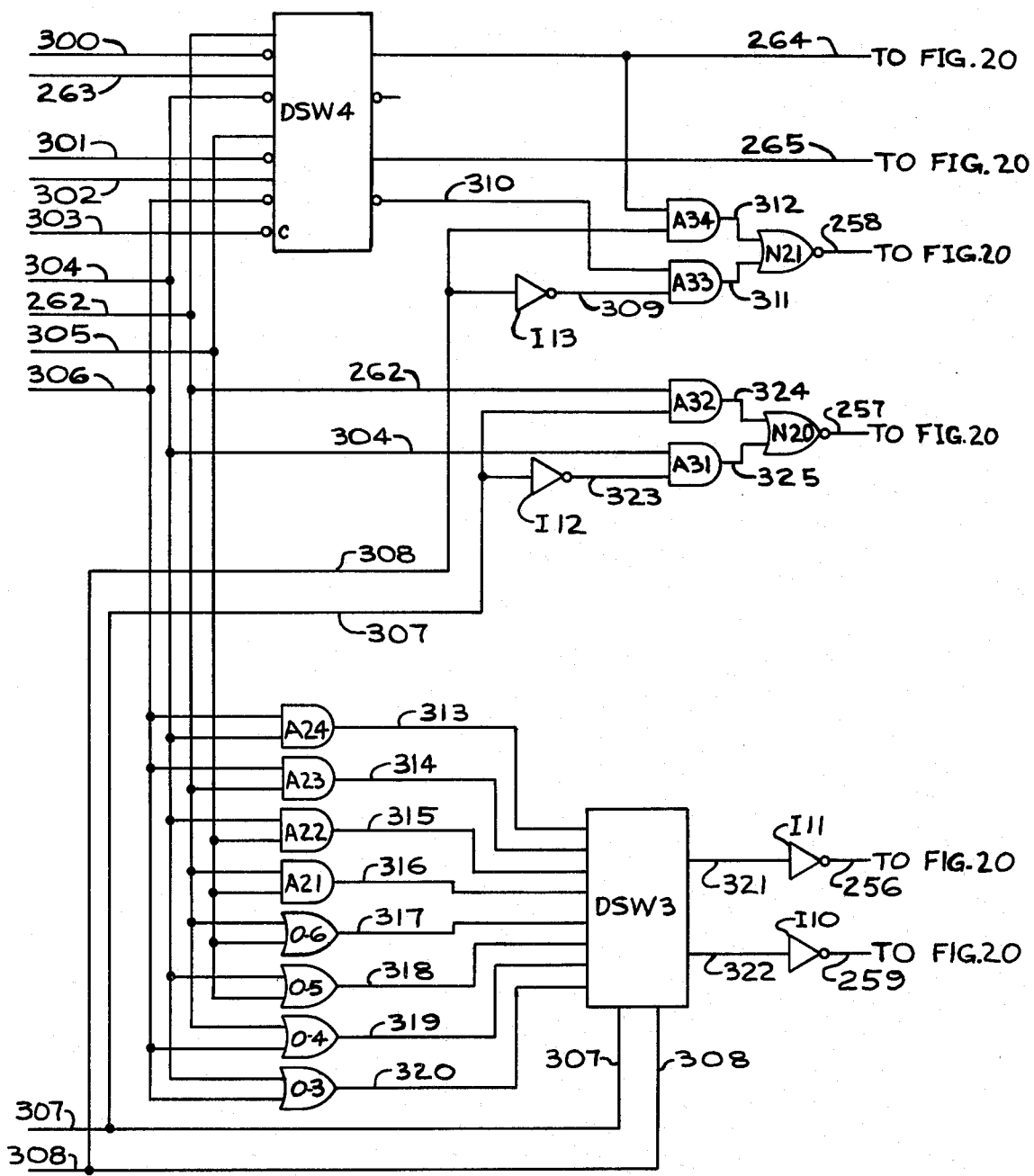
FIG. 37 depicts a schematic representation of the logic circuitry for B and C channels.

Because the B and C common switch has been activated data select switch DSW4 in FIG. 37 connects line 264 with line 262. When the signal in B channel passes through its high threshold voltage to a higher voltage, line 262 goes high which causes a signal to pass through ANDgate A34. This signal passes through ANDgate A34, line 258, data select switch DSW2 and into line 249 in FIG. 20. Line 249 is connected to ANDgate A12 which passes a signal into NORgate N57. NORgate N57 is connected to the stop latch circuitry. Since the same signal is used to start and stop the gate, the latch delay circuitry must be enabled. A high on line 336 in FIG. 21 enables the latch delay circuit. Line 336 is connected to the output of inverter I40 in FIG. 19. Inverter I40 is connected through line 475 to the output of NORgate N36. One input to N36 is line 465 which is high if duty cycle function switch SW19 is not activated. Another input to N36 is line 462 which is connected to line 266 through inverter 138. Line 266 is low unless a voltmeter function is selected. This low makes line 462 high. The remaining input to NORgate N36 is connected to line 332 through inverter 138. Since all the inputs to N36 are high its output is low in line 475. This low caused line 336 to be high through inverter 140.

Line 328 is connected to NORgate N24 in FIG. 21. Since line 328 is high, the output of NORgate N24 is low and disables NANDgate NA15. When the first signal passes through the start latch circuit it will cause the gate to open and at the same time will enable NANDgate NA15 for the next signal. When the second signal occurs, it passes through NANDgate NA15 and causes the gate signal to go low. This provides a gate signal to NANDgates NA16 and NA17 in FIG. 22. Since line 400 is low NANDgate NA16 is disabled and NANDgate NA17 is enabled. The third input to NANDgate NA17 is the count signal.

The count signal comes from NORgate N52 in FIG. 24 which is connected to ANDgates A79 and A69. ANDgate A70 is disabled by a low in line 538 as discussed supra. ANDgate A69 is enabled by a high in line 578. (Line 578 is high since either the single count switch SW24 or the repeat count switch SW23 is activated.) The other side of ANDgate A69 is connected through inverter I75 to the Output of NORgate N51. NORgate N51 is connected to NANgates A68, A67, A66 and A65. Since the TRC switch SW51 is activated line 580 is low which disables ANDgate A68 and ANDgate A67. Line 580 is connected through inverter I74 and enables ANDgates A66 and A65. Whenever the incoming signal in A channel goes through its high threshold voltage to a higher voltage a high signal appears in line 250. Line 250 is connected through inverter I73 to capacitor C74. The leading edge of this signal passes through capacitor C74 into line 585. Line 585 is connected to a positive voltage source through resistor R159. The edge of the signal passes through inverter I79 and into line 586. This signal passes through ANDgate A66, NORgate N51, ANDgate A69, NORgate N52 and into line 401. This signal passes through inverter I27, NANDgate NA17, NORgate N35 of FIG. 22 and into the counters.

When the incoming signal in A channel passes through its low threshold voltage to a lower voltage, line 253 goes high. Line 253 is connected through inverter I72 to capacitor C73 in FIG. 24. The leading edge of this signal passes through capacitor C73 into line 584. Line 584 is connected to a positive voltage source through resistor R190. The signal in line 584 passes through inverter I78 and line 587 into ANDgate A65. This signal passes through the same circuit as the high threshold signal to the counters. The counters thus count each time the incoming signal in A channel passes through its high threshold voltage and each time it passes through its low threshold voltage during the time period that the gate signal in line 371 is high.

PERIOD

The period is a measurement of the duration of one complete cycle of a signal in channel B. The interval B to C switch SW25 is activated causing line 492 in FIG. 33 to become low. Also the B and C common switch SW52 is activated causing line 303 in FIG. 35 to become low. The positive phase switch SW49 for B channel and the positive phase switch SW50 for C channel are either both activated or both not activated. If they are both activated (negative phase) then line 307 and line 308 are both low. This enables ANDgate A33, and ANDgate A31 in FIG. 37. The low in line 303 causes data select switch DSW4 to connect line 264 with line 262, line 265 with line 263 and line 310 with line 304. When the incoming signal in B channel passes through its low threshold voltage to a lower voltage line 304 becomes high. A high in line 304 goes through data select switch DSW4 into line 310 and through ANDgate A33 into NORgate NA21. This signal goes to the start latch circuit and causes the gate signal in line 371 to go high. The count signal which passes through the gate into the counters is a clock selected by choosing the proper setting on the time switch in the same way as it was selected in determining the width in A channel.

When the incoming signal in B channel goes through its low threshold voltage to a power voltage the signal passes through ANDgate A31 into NORgate N20 and to the stop latch circuitry. The low in line 336 causes the latch delay circuit to operate. This prevents the stop and start signals from simultaneously opening and closing the gate signal. The latch delay circuitry allows the first signal to start the gate and the second signal to stop the gate.

FREQUENCY RATIO A-B

The frequency ratio is a direct reading measurement of the proportional relationship between a higher frequency signal on A channel and a lower frequency signal on B channel. This measurement is merely a repeat count measurement with the B and C common switch activated. This will count the number of times the signal in A channel passes through its high or low threshold during the time the signal in B channel goes through two of its high thresholds or two of its low thresholds.

FORBIDDEN COMBINATION

Because of the multi-functional features of the circuit analyzer of this invention, there is a need for a large number of function switches. In order to alert the operator of the instrument that an improper function has been selected, the instrument has been designed to override the display in cases where there are incompatible control settings. For example, if any of the switches SW14 through SW18 are engaged, line 266 will go high. Line 266 will enable ANDgates A39 and A38 in FIG. 19 and disable ANDgate A40. If any of the switches SW19 through SW26 are engaged at the same time, line 476 will go high. This will cause a signal to pass through ANDgate A39 into line 459. Line 459 is connected to NORgate N42. A high in line 459 causes the output of NORgate N42 in line 453 to go low. A low line 453 throws 4 to 7 line decoder DE1 in FIG. 27 to put an override signal in lines a through g presenting a blank display. At the same time, line 453 enables NANDgate NA29 in FIG. 29. The other side of NANDgate NA29 is connected to the clock signal from divider DIV6 through line 576. This line provides a positive pulse for 200 milliseconds and a negative pulse for 800 milliseconds. During the negative pulse, a high signal passes into line 559 through buffer amplifier BA16 into display blanking line 452. This signal goes through resistor R184 and causes transistor T27 to conduct. This causes the collector of transistor T27 in line 445 to go low. A low in line 445 causes transistor T19 to light display DS1. Thus, each of the displays DS2 through DS6 alternately flash the digit 8 every 1 second.

If none of the function switches SW14 through SW26 are activated then line 266 is low and line 476 is low. The low in line 476 enables ANDgate A40 in FIG. 19. A low in line 266 causes ANDgate A40 to pass a signal into line 460. This causes line 453 to go low and the display again alternately flashes eights.

If none of the threshold or peak switches SW5 through SW9 are activated and either the high or low level switch SW10 or SW11 is depressed, then line 455 will go low. This causes line 456 to go high and the high in line 456 enables ANDgate A37. Since the high or low level switch has been depressed, line 332 goes high and causes ANDgate A37 to pass a signal into line 457. Line 457 is connected to NORgate N42. This signal again causes the display to alternately flash the eights.

Finally, if any of the switches SW14 through SW18 are activated then line 266 goes high enables ANDgate A38. During this period if the high or low level switch is depressed line 332 will go high and cause ANDgate A38 to pass a high signal. This signal goes through NORgate N42 and causes all of the displays to alternately light the digit eight.

SIGNAL PRESENT - SIGNAL FAULT

The setting of the high and low threshold voltages are important in all of the count functions, i.e., duty cycle, frequency, width, slope (rise and fall times), repeat count, single count, interval B to C, coincidence B and C, frequency ratio, period, and TRC count. The threshold voltages are not used in the voltmeter functions such as DC volts, AC volts and resistance. The high and low threshold voltages must be set within the high and low peak voltages of the incoming electrical signal. If they are not, then the logic circuit does not properly instruct the start and stop gate circuit. To assure the operator that he has properly set the threshold voltages, the multifunctional circuit analyzer may have, in one embodiment, a signal present lamp and a signal fault lamp in the display.

When none of the voltmeter function switches SW14 through SW18 are activated in FIG. 33, line 266 is low. This low passes through Inverter I9 causing line 267 to become high in FIG. 20. A high in line 267 arms tristate amplifiers TA1 through TA6.

A-CHANNEL

When the incoming signal in A channel is being used and the voltage passes through its high threshold voltage to a higher voltage line 250 in FIG. 20 goes high. This causes a signal to pass through ANDgate A19 when the positive phase has been selected (switch SW48 in FIG. 35 has not been activated). The signal from ANDgate A19 passes through NORgate N61, into line 280. The signal in line 280 passes through armed Tristate amplifier TA1 into line 271. The low in line 271 passes through Resistor R168 in FIG. 27 and lights light emitting diode LED1 in the display. This lamp is the signal present indicator for A channel. When the negative phase has been selected, switch SW 48 in FIG. 35 is activated. This disarms ANDgate A19 and arms ANDgate A20. When the incoming signal passes through its low threshold voltage line 252 becomes high and a signal passes through ANDgate A20. This signal passes through NORgate N61 into line 280 and lights the light emitting diode LED1 in the display.

If one of the threshold voltage settings is not within the voltage limits of the incoming electrical signal, then lines 250 and 253 will both be high or will both be low for a short period. This causes the output of exclusive ORgate EN1 at line 270 to be low. This low passes through previously armed tristate amplifier TA4 into line 274. A low in line 274 passes through resistor R171 and lights light emitting diode LED4 in the display as shown in FIG. 27. This lamp is the signal fault indicator for A channel.

B-CHANNEL

When the incoming signal in B channel is being used and the voltage passes through its high threshold voltage to a higher voltage line 262 in FIG. 37 goes high. This causes a signal to pass through ANDgate A32 when the positive phase has been selected (switch SW49 in FIG. 35 has not been activated). The signal from ANDgate A32 passes through NORgate N20 into line 257. The low in line 257 passes through Tristate amplifier TA2 in FIG. 20 and into line 272. This signal passes through resistor R169 and lights light emitting diode LED2 in the display in FIG. 27. This lamp is the singal present indicator for B channel. When the negative phase has been selected, switch SW49 in FIG. 35 is activated. This disarms ANDgate A32 and arms ANDgate A31. When the incoming signal on B channel passes through its low threshold voltage to a lower voltage, line 304 goes high and a signal passes through ANDgate A31 into NORgate N20. The signal passing through NORgate N20 into line 257 lights LED 2 in the display.

If one of the threshold voltage settings is not within the voltage limits of the incoming electrical signal, then lines 262 and 263 in FIG. 20 will both be high or will both be low for a short period. This causes the output of Exclusive ORgate EN2 at line 269 to be low. This low passes a signal through previously armed tristate amplifer TA5 into line 275. A low in line 275 passes through resistor R172 and lights light emitting diode LED5 in the display as shown in FIG. 27. This lamp is the signal fault indicator for B channel.

C-CHANNEL

When the incoming signal in C channel is being used and the voltage passes through its high threshold voltage to a higher voltage line 305 goes high. Line 305 is connected to data select switch DSW4 in FIG. 37. If the B and C common switch SW52 is not activated, which is the case when the C channel signals are being used, then line 303 is high. This causes data select switch DSW4 to connect line 305 with line 264. Line 246 is connected to ANDgate A34 which is armed when the positive phase is selected (switch SW50 not activated in FIG. 35). A signal passes through ANDgate A34 into NORgate N21. The output of NORgate N21 is low at line 258. Line 258 is connected to tristate amplifier TA3 in FIG. 20. A low signal passes in line 273 through resistor R170 and lights light emitting diode LED3. This lamp is the signal present indicator for the C-Channel. When the negative phase has been selected, switch SW50 is activated which causes line 308 to go low. A low in line 308 disables disables ANDgate A34 and enables ANDgate A33. The other input to ANDgate A33 is connected to data select switch DSW4 by line 310. The data select switch DSW4 connects line 310 with line 306. Line 306 goes high when the incoming signal on C channel passes through its low threshold voltage to a lower voltage. This causes a signal to pass through ANDgate A33 and NORgate N21 into line 258. The low in line 258 causes the LED3 to light.

If one of the threshold voltage settings is not within the voltage limits of the incoming signal or C channel, then line 305 and 302 in FIG. 37 will both be high or will both be low for a short period. This causes lines 264 and 265 to be both high or both low for a short period. Lines 264 and 265 are connected to Exclusive ORgate EN3. The output of Exclusive ORgate EN3 is connected by line 268 to tristate amplifier TA6. The low signal in line 268 passes into line 276, through resistor R173 and lights light emitting diode LED6. This lamp is the signal fault indicator for C channel.

TTL THRESHOLD SETTING

The high and low threshold voltage setting may be preadjusted for TTL (transistor-transistor-logic) or DTL (diode-transistor logic) digital incoming signals. This is accomplished by selecting switch SW3 (for A channel, see FIG. 13) or switch SW12 (for B and C channels, see FIG. 30). This connects variable resistor VR3 and resistor R12 to line 26 (A channel). Line 26 is connected to line 9 and voltage follower VF4. The high threshold voltage setting is the same as discussed supra for setting the high threshold voltage for the 3 and 30 volt ranges. The low threshold voltage is preset by adjusting variable resistor VR4. For the B and C channels, the high threshold is adjusted by variable resistor VR20 and the low threshold voltage is adjusted by variable resistor VR21.

Although the foregoing invention has been described in some detail, by way of illustration, for purposes of clarity and understanding, it should be understood that numerous changes and modifications may be practiced within the spirit of the invention and such are within the scope of the invention as defined by the appended claims.

We claim:

1. A circuit analyzer capable of digitally measuring the duty cycle of an incoming electrical signal which comprises:
   1. an input circuit means for receiving said incoming electrical signal;
   2. a high threshold voltage circuit means connected to said input circuit means for providing a high threshold digital signal when the voltage of the incoming electrical signal passes through a selected high threshold voltage;
   3. a low threshold voltage circuit means connected to said input circuit means for providing a low threshold digital signal when the voltage of the incoming electrical signal passes through a selected low threshold voltage;
   4. a duty cycle circuit means connected to said high and said low threshold voltage circuit means for providing a first preselected DC signal when the voltage of the incoming electrical signal either (1) passes through the low or high threshold voltage to a higher voltage or (2) passes through the high or low threshold voltage to a lower voltage, and for providing a second preselected DC signal when the voltage of the incoming electrical signal subsequently either (1) passes through the high or low threshold voltage to a lower voltage or (2) passes through the low or high threshold voltage to a higher voltage;
   5. an analog to digital converter means connected to said duty cycle circuit means for converting said first and second preselected DC signals into a functional digital signal proportional to the time average voltage of the first and second preselected DC signals;
   6. a gate control circuit means connected to said analog to digital converter means for providing a digital start gate signal when the functional digital signal is present and a stop gate signal when the functional digital signal changes state;
   7. a gate circuit means connected to said gate control circuit means for permitting a time base signal to pass through said gate circuit means when said start gate signal occurs and preventing said time base signal from passing through the gate circuit means when said stop gate signal occurs;
   8. a time base circuit means connected to said gate circuit means for generating at least one time base signal of known frequency;
   9. a counting circuit means connected to said gate circuit means for counting the number of cycles in the time base signal during the time interval between said start gate signal and said stop gate signal and providing a plurality of first code signals representing the total number of cycles counted;

10. a decoding circuit means connected to said counting circuit means for receiving said plurality of first code signals and providing a plurality of stable digital second code signals representing the total number of cycles counted by said counting circuit means;

11. a display means connected to said decoding means for receiving said plurality of stable digital second code signals and displaying the total number of cycles counted by a plurality of digits.

2. A circuit analyzer capable of measuring the duration of the coincidence of two incoming electrical signals which comprises:

1. an input circuit means for receiving a first and second incoming electrical signals;

2. a high threshold voltage circuit means connected to said input circuit means for providing a first and second high threshold digital signals when the voltage of the first and second electrical signals pass through respective selected high threshold voltages;

3. a low threshold voltage circuit means connected to said input circuit means for providing a first and second high threshold digital signals when the voltage of the first and second electrical signals pass through respective selected low threshold voltages;

4. a logic circuit means connected to said high and low threshold circuit means for providing (A) a first functional digital signal when the voltage of the first incoming electrical signal either (1a) passes through its low or high threshold voltage to a higher voltage or (2a) passes through its high or low threshold voltage to a lower voltage, (B) a second functional digital signal when the voltage of the second incoming electrical signal either (1b) passes through its low or high threshold voltage to a higher voltage or (2b) passes through its high or low threshold voltage to a lower voltage, (C) a third functional digital signal when the voltage of the first incoming electrical signal either (1c) passes through its high or low threshold voltage to a lower voltage or (2c) passes through its low or high threshold voltage to a higher voltage, and (D) a fourth functional digital signal when the voltage of the second incoming electrical signal either (1d) passes through its high or low threshold voltage to a lower voltage or (2d) passes through its low or high threshold voltage to a higher voltage;

5. a gate control circuit means connected to said logic circuit means for providing a digital start gate signal when the first and second functional digital signals are both present and a stop gate signal when either the third or fourth functional digital signal is present whichever occurs first;

6. a gate circuit means connected to said gate control circuit means for permitting a time base signal to pass through said gate circuit means when said start gate signal occurs and preventing said time base signal from passing through the gate circuit means when said stop gate signal occurs;

7. a time base circuit means connected to said gate circuit means for generating at least one time base signal of known frequency;

8. a counting circuit means connected to said gate circuit means for counting the number of cycles in the time base signal during the time interval between said start gate signal and said stop gate signal and providing a plurality of first code signals representing the total number of cycles counted;

9. a decoding circuit means connected to said counting circuit means for receiving said plurality of first code signals and providing a plurality of stable digital second code signals representing the total number of cycles counted by said counting circuit means;

10. a display means connected to said decoding means for receiving said plurality of stable digital second code signals and displaying the total number of cycles counted by a plurality of digits.

3. A circuit analyzer capable of measuring the number of positive and negative slopes occurring on an incoming signal which comprises:

1. an input circuit means for receiving at least a first, second and third incoming electrical signals;

2. a high threshold voltage circuit means connected to said input circuit means for providing first, second and third high threshold digital signals when the voltage of the first, second and third electrical signals pass through respective selected high threshold voltages;

3. a low threshold voltage circuit means connected to said input circuit means for providing first, second and third high threshold digital signals when the voltage of the first, second and third electrical signals pass through respective selected low threshold voltages;

4. a logic circuit means connected to said high and low threshold circuit means for providing (A) a first functional digital signal when the voltage of the second incoming electrical signal passes through its high or low threshold voltage, (B) a second functional digital signal when the voltage of the third incoming electrical signal passes through its high or low threshold voltage and (C) a count signal which changes state each time the voltage of the first incoming electrical signal passes through its low or high threshold voltage to a higher voltage and also each time the voltage of the first incoming electrical signal passes through its high or low threshold voltage to a lower voltage;

5. a gate control circuit means connected to said logic circuit means for providing a digital start gate signal when said first functional digital signal is present and a digital stop gate signal when said second functional digital signal is present;

6. a gate circuit means connected to said gate control circuit means for permitting said count signal to pass through said gate circuit means when said start gate signal occurs and preventing said count signal from passing through the gate circuit means when said stop gate signal occurs;

7. a counting circuit means connected to said gate circuit means for counting the number of times said count signal changes state and for providing a plurality of first code signals;

8. a decoding circuit means connected to said counting circuit means for receiving said plurality of first code signals and providing a plurality of stable digital second code signals representing the total number of times the count signal changed states during the time interval between said start gate signal and said stop gate signal;

9. a display means connected to said decoding circuit means for receiving said plurality of stable digital second code signals and displaying the total number counted by a plurality of digits.

4. A multifunctional circuit analyzer for measuring rise time of an incoming electrical signal comprising:
1. an input circuit means for receiving at least one incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at lease one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;

and wherein the logic circuit means activates the start gate signal in the gate control circuit means when the voltage of the incoming electrical signal passes through the selected low threshold voltage to a higher voltage and the logic circuit means activates the stop gate signal when the voltage of the incoming electrical signal passes through the selected high threshold voltage to a higher voltage thereby counting the total number of cycles from the time base signal during the time interval that the incoming electrical signal is between its low threshold voltage and its high threshold voltage.

5. A multifunctional circuit analyzer for measuring fall time of an incoming electrical signal comprising
1. an input circuit means for receiving at least one incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;

and wherein the logic circuit means activates the start gate signal in the gate control circuit means when the voltage of the incoming electrical signal passes through the selected high threshold voltage to a lower voltage and the logic circuit means activates the stop gate signal when the voltage of the incoming electrical signal passes through the selected low threshold voltage to a lower voltage thereby counting the total number of cycles from the time base signal during the time interval that the incoming electrical signal is between its high threshold voltage and its low threshold voltage.

6. A multifunctional circuit analyzer for measuring the duty cycle of an incoming electrical signal comprising:
 1. an input circuit means for receiving at least one incoming electrical signal;
 2. a peak voltage detection means connected to said input circuit means for measuring the high and low peak voltages of the incoming electrical signal and providing a stable high or low DC voltage which is proportional to the respective high or low peak voltage;
 3. an analog to digital converter means connected to said peak voltage detection means for converting said stable high or low DC voltage into a functional digital signal;
 4. a gate control circuit means connected to said analog to digital converter means for providing a digital start gate signal when the functional digital signal is present and a stop gate signal when the functional digital signal changes state;
 5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
 6. a time base circuit means connected to said gate circuit means for generating at least one time base signal of known frequency;
 7. a counting circuit means connected to said gate circuit means for counting the number of cycles in the count signal or time base signal during the time interval between said start gate signal and said stop gate signal and providing a plurality of first code signals representing the total number of cycles counted;
 8. a decoding circuit means connected to said counting circuit means for receiving said plurality of first code signals and providing a plurality of stable digital second code signals representing the total number of cycles counted by said counting circuit means;
 9. a display means connected to said decoding means for receiving said plurality of stable digital second code signals and displaying the total number of cycles counted by a plurality of digits;
 10. a high threshold voltage circuit means connected to said input circuit means for providing a high threshold digital signal when the voltage of the incoming electrical signal passes through a selected high threshold voltage;
 11. a low threshold voltage circuit means connected to said input circuit means for providing a low threshold digital signal when the voltage of the incoming electrical signal passes through a selected low threshold voltage;
 12. a logic circuit means connected to said high and low threshold voltage circuit means and said gate control circuit means for activating said start and stop gate signals by the high or low threshold digital signals;

and wherein a duty cycle circuit means is connected to said high and said low threshold voltage circuit means for providing a first preselected DC signal when the voltage of the incoming electrical signal either (1) passes through the low or high threshold voltage to a higher voltage or (2) passes through the high or low threshold voltage to a lower voltage and for providing a second preselected DC signal when the voltage of the incoming electrical signal either (1) passes through the high or low threshold voltage to a lower voltage or (2) passes through the low or high threshold voltage to a higher voltage, said duty cycle circuit means also being connected to said analog to digital converter means for converting the first and second preselected DC signals into a functional digital signal proportional to the time average voltage of the first and second preselected DC signals whereby the display means displays the total number of cycles counted from the time base signal which is proportional to the duty cycle of the incoming electrical signal.

7. A multifunctional circuit analyzer for measuring the width of a wave form of an incoming electrical signal comprising:
 1. an input circuit means for receiving at least one incoming electrical signal;
 2. a peak voltage detection means connected to said input circuit means for measuring the high and low peak voltages of the incoming electrical signal and providing a stable high or low DC voltage which is proportional to the respective high or low peak voltage;
 3. an analog to digital converter means connected to said peak voltage detection means for converting said stable high or low DC voltage into a functional digital signal;
 4. a gate control circuit means connected to said analog to digital converter means for providing a digital start gate signal when the functional digital signal is present and a stop gate signal when the functional digital signal changes state;
 5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
 6. a time base circuit means connected to said gate circuit means for generating at least one time base signal of known frequency;
 7. a counting circuit means connected to said gate circuit means for counting the number of cycles in the count signal or time base signal during the time interval between said start gate signal and said stop gate signal and proving a plurality of first code signals representing the total number of cycles counted;
 8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals; and wherein the logic circuit means activates the start gate signal in the gate control circuit means when the voltage of the incoming electrical signal either (1) passes through the low or high threshold voltage to a higher voltage or (2) passes through the high or low threshold voltage to a lower voltage, and the logic circuit means activates the stop gate signal when the voltage of the incoming electrical signal either (1) passes through the high or low threshold voltage to a lower voltage or (2) passes through the low or high threshold voltage to a higher voltage.

8. A multifunctional circuit analyzer for measuring the period of a wave form of an incoming electrical signal comprising:
1. an input circuit means for receiving at least one incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals; and wherein the logic circuit means activates the start gate signal in the gate control circuit means when the voltage of the incoming electrical signal either (1) passes through the low or high threshold voltage to a higher voltage or (2) passes through the high or low threshold voltage to a lower voltage and the logic circuit means activates the stop gate signal when the voltage of the incoming electrical signal passes directionally through the same high or low threshold voltage a second time.

9. A multifunctional circuit analyzer for measuring the average voltage of an incoming AC electrical signal comprising:
1. an input circuit means for receiving at least one incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;

7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals; and wherein a DVM converter means is connected to said input circuit means providing a stable DC voltage which is proportional to said average voltage and wherein said DVM converter means is also connected to said analog to digital converter means for converting said stable DC voltage into said functional digital signal.

10. The multifunctional circuit analyzer defined in claim 34 wherein said DVM converter means is also capable of measuring the resistance of an unknown resistor and converting the resistance into a stable DC voltage which is proportional to the resistance and wherein said stable DC voltage is converted into said functional digital signal in said analog to digital converter means.

11. A multifunctional circuit analyzer for measuring the duration of the coincidence of signals on a first incoming electrical signal and a second incoming electrical signal comprising:
1. an input circuit means for receiving a first incoming electrical signal and a second incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals; and wherein the logic circuit means activates the start gate signal in said gate control circuit means when (A) the voltage of the first incoming electrical signal either passes through its low or high threshold voltage to a higher voltage or passes through its high or low threshold voltage to a lower voltage and (B) the voltage of the second incoming electrical signal either passes through its low or high threshold voltage to a higher voltage or passes through its high or low threshold voltage to a lower voltage; and wherein the logic circuit means activates the stop gate signal when (1) the voltage of the first incoming electrical signal either passes through its high or low threshold voltage to a lower voltage or passes through its low or high threshold voltage to a higher voltage or, whichever occurs first, (2) the voltage of the second incoming electrical signal either passes through its high or low threshold voltage to a lower voltage or passes through its low or high threshold voltage to a higher voltage, whereby said counting circuit means starts counting the time base signal when an electrical event occurs on both said first and said second incoming electrical signals and ceases counting when another electrical event occurs on either said first or said second incoming electrical signal, whichever occurs first.

12. A multifunctional circuit analyzer for measuring the number of positive and negative slopes on a first incoming electrical signal comprising
1. an input circuit means for receiving at a first, a second and a third incoming electrical signals;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;
and wherein said logic circuit means activates the start gate signal in said gate control circuit means when the voltage of said second incoming electrical signal passes through its high or low threshold voltage and said logic circuit means activates the stop gate signal when the voltage in said third incoming electical signal passes through its high or low threshold voltage and wherein said count signal is a digital signal which changes state (1) each time the voltage of the first incoming electrical signal passes through its low or high threshold voltage to a higher voltage and (2) each time the voltage of the first incoming electrical signal passes through its high or low threshold voltage to a lower voltage.

13. The multifunctional circuit analyzer for measuring the number of positive and negative slopes occurring on a first incoming electrical signal over a time period commencing with an electrical event on a second incoming electrical signal and terminating with a subsequent electrical event on said second incoming electrical signal comprising
1. an input circuit means for receiving a first and a second incoming electrical signal.
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;

12. a logic circuit means connected to said high and low threshold voltage circuit means and said gate control circuit means for activating said start and stop signals by the high or low threshold digital signals;

wherein said logic circuit means activates the start gate signal in said gate control circuit means when the voltage of the second incoming electrical signal passes through its high or low threshold voltage and said logic circuit means activates the stop gate signal when the voltage in the second incoming signal passes through a subsequent high or low threshold voltage and wherein said count signal is a TRC digital signal which changes state (1) each time the voltage of the first incoming electrical signal passes through its low or high threshold voltage to a higher voltage and (2) each time voltage of the first incoming electrical signal passes through its high or low threshold voltage to a lower voltage.

14. The multifunctional circuit analyzer for measuring the number of pulses occurring on a first incoming electrical signal over a time period commencing with an electrical event on a second incoming electrical signal and terminating with an electrical event on a third incoming electrical signal comprising 2. an input circuit means for receiving a first, a second and a third incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;

wherein said logic circuit means activates said start gate signal when the voltage of the second incoming signal passes through its high or low threshold voltage and said logic circuit means activates to stop gate signal when the voltage of the third incoming electrical signal passes through its high or low threshold voltage and wherein said count signal is a digital signal which changes state each time the voltage of the first incoming electrical signal passes through its high or low threshold voltage.

15. The multifunctional circuit analyzer for measuring the number of pulses occurring on a first incoming electrical signal over a time period commencing with an electrical event on a second incoming electrical signal and terminating with a subsequent electrical event on said second incoming electrical signal comprising 1. an input circuit means for receiving a first and a second incoming electrical signal.
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving and plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold voltage circuit means connected to said input circuit means for providing a high threshold digital signal when the voltage of the incoming electrical signal passes through a selected high threshold voltage;
11. a low threshold voltage circuit means connected to said input circuit means for providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;
   wherein said logic circuit means activates said start gate signal when the voltage of the second incoming signal passes through its high or low threshold voltage and said logic circuit means activates the stop gate signal when the voltage of the second incoming electrical signal passes through a subsequent high or low threshold voltage and wherein said count signal is a digital signal which changes state each time the voltage of the first incoming electrical signal passes through its high or low threshold voltage.

16. The multifunctional circuit analyzer for measuring the frequency ratio of a faster first incoming electrical signal and a slower second incoming electrical signal comprising
1. an input circuit means for reciving a first and a second incoming electrical signal.
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate signal occurs and preventing said count signal or said time base signal from passing through the gate circuit means when said stop gate signal occurs;
6. a time base circuit means connected to said gate circuit means for generating at least one time base signal of known frequency;
7. a counting circuit means connected to said gate circuit means for counting the number of cycles in the count signal or time base signal during the time interval between said start gate signal and said stop gate signal and providing a plurality of first code signals representing the total number of cycles counted;
8. a decoding circuit means connected to said counting circuit means for receiving said plurality of first code signals and providing a plurality of stable digital second code signals representing the total number of cycles counted by said counting circuit means;
9. a display means connected to said decoding means for receiving said plurality of stable digital second code signals and displaying the total number of cycles counted by a plurality of digits;
10. a high threshold circuit means connected to said input circuit means for providing a high threshold digital signal when the voltage of the incoming electrical signal passes through a selected high threshold voltage;
11. a low threshold voltage circuit means connected to said input circuit for means providing a low threshold digital signal when the voltage of the incoming electrical signal passes through a selected low threshold voltage;
12. a logic circuit means connected to said high and low threshold voltage circuit means and said gate control circuit means for activating said start and stop gate signals by the high or low threshold digital signals;
   wherein said logic circuit means activates the start gate signal when the voltage in the second incoming electrical signal passes through the high or low threshold voltage and said logic circuit means activates the stop gate signal when the voltage in the second incoming signal again passes through the high or low threshold voltage and wherein said count signal is a digital signal which changes state each time the voltage of the first incoming electrical signal either (1) passes through the low or high threshold voltage to a higher voltage or (2) passes through the high or low threshold voltage to a lower voltage.

17. A multifunctional circuit analyzer comprising
1. an input circuit means for receiving at least one incoming electrical signal;
2. a peak voltage detection means connected to said input circuit means for measuring the high and low peak voltages of the incoming electrical signal and providing a stable high or low DC voltage which is proportional to the respective high or low peak voltage;
3. an analog to digital converter means connected to said peak voltage detection means for converting said stable high or low DC voltage into a functional digital signal;
4. a gate control circuit means connected to said analog to digital converter means for providing a digital start gate signal when the functional digital signal is present and a stop gate signal when the functional digital signal changes state;
5. a gate circuit means connected to said gate control circuit means for allowing a count signal or time base signal to pass through said gate circuit means when said start gate occurs and preventing said count signal or said time base signal from passing through the gate circuit means when said stop gate signal occurs;

6. a time base circuit means connected to said gate circuit means for generating at least one time base signal of known frequency;

7. a counting circuit means connected to said gate circuit means for counting the number of cycles in the count signal or time base signal during the time interval between said start gate signal and said stop gate signal and providing a plurality of first code signals representing the total number of cycles counted;

8. a decoding circuit means connected to said counting circuit means for receiving said plurality of first code signals and providing a plurality of stable digital second code signals representing the total number of cycles counted by said counting circuit means;

9. a display means connected to said decoding means for receiving said plurality of stable digital second code signals and displaying the total number of cycles counted by a plurality of digits;

10. a high threshold voltage circuit means connected to said input circuit means for providing a high threshold digital signal when the voltage of the incoming electrical signal passes through a selected high threshold voltage;

11. a low threshold voltage circuit means connected to said input circuit means for providing a low threshold digital signal when the voltage of the incoming electrical signal passes through a selected low threshold voltage;

12. a logic circuit means connected to said high and low threshold voltage circuit means and said gate control circuit means for activating said start and stop gate signals by the high or low threshold digital signals;

13. a plurality of function switching means connected to said logic circuit means for selecting a plurality of function measurements for controlling the start and stop gate signals;

and wherein an autoranging circuit means is connected to said counting circuit means and said time base circuit means for providing an overflow digital signal when counter in said counting circuit means are overflowed and an underflow digital signal when said counters are underflowed, and for causing the time base circuit to provide a time base signal of higher frequency when an overflow digital signal occurs and to provide a time base signal of lower frequency when an underflow digital signal occurs.

18. The multifunctional circuit analyzer comprising 1. an input circuit means for receiving at least one incoming electrical signal;

2. a peak voltage detection means connected to said input circuit means for measuring the high and low peak voltages of the incoming electrical signal and providing a stable high or low DC voltage which is proportional to the respective high or low peak voltage;

3. an analog to digital converter means connected to said peak voltage detection means for converting said stable high or low DC voltage into a functional digital signal;

4. a gate control circuit means connected to said analog to digital converter means for providing a digital start gate signal when the functional digital signal is present and a stop gate signal when the functional digital signal changes state;

5. a gate circuit means connected to said gate control circuit means for allowing a count signal or time base signal to pass through said circuit means when said start gate signal occurs and preventing said count signal or said time base signal from passing through the gate circuit means when said stop gate signal occurs;

6. a time base circuit means connected to said gate circuit means for generating at least one time base signal of known frequency; 7. a counting circuit means connected to said gate circuit means for counting the number of cycles in the count signal or time base signal during the time interval between said start gate signal and said stop gate signal and providing a plurality of first code signals representing the total number of cycles counted;

8. a decoding circuit means connected to said counting circuit means for receiving said plurality of first code signals and providing a plurality of stable digital second code signals representing the total number of cycles counted by said counting circuit means;

9. a display means connected to said decoding means for receiving said plurality of stable digital second code signals and displaying the total number of cycles counted by a plurality of digits;

10. a high threshold voltage circuit means connected to said input circuit means for providing a high threshold digital signal when the voltage of the incoming electrical signal passes through a selected high threshold voltage;

11. a low threshold voltage circuit means connected to said input circuit means for providing a low threshold digital signal when the voltage of the incoming electrical signal passes through a selected low threshold voltage;

12. a logic circuit means connected to said high and low threshold voltage circuit means and said gate control circuit means for activating said start and stop gate signals by the high or low threshold digital signals;

and wherein an autoranging circuit means is connected said counting means for providing an overflow digital signal when counters in said counting circuit means are overflowed and underflow digital signal when said counters are underflowed and wherein an attenuator means is connected between said input circuit means and said peak voltage detection means and is connected to said autoranging circuit means for increasing the attenuation of the incoming electrical signal when an overflow digital signal occurs and decreasing the attenuation of the incoming electrical signal when an underflow digital signal occurs.

19. The multifunctional circuit analyzer defined in claim 9 wherein an autoranging circuit means is connected to said counting circuit means for providing an overflow digital signal when the counter in said counting circuit means are overflowed and an underflow digital when said counters are underflowed, and wherein an attenuator means is connected between said input circuit means and said DVM converter means for increasing the attenuation of the incoming electrical signal when an overflow digital signal occurs and decreasing the attenuation of the incoming electrical signal when an underflow digital signal occurs.

20. The multifunctional circuit analyzer defined in claim 10 an autoranging circuit means is connected to said counting circuit means for providing an overflow digital signal when counters in said counting circuit means are overflowed and an underflow digital signal when said counters are underflowed, and wherein an attenuator means is connected between said input circuit means and said DVM converter means for increasing the attenuation of the incoming electrical signal when an overflow digital signal occurs and decreasing the attenuation of the incoming electrical signal when an underflow digital signal occurs.

* * * * *